US007161218B2

(12) United States Patent
Bertin et al.

(10) Patent No.: US 7,161,218 B2
(45) Date of Patent: *Jan. 9, 2007

(54) ONE-TIME PROGRAMMABLE, NON-VOLATILE FIELD EFFECT DEVICES AND METHODS OF MAKING SAME

(75) Inventors: Claude L. Bertin, South Burlington, VT (US); Thomas Rueckes, Boston, MA (US); Brent M. Segal, Woburn, MA (US); Bernhard Vogeli, Boston, MA (US); Darren K. Brock, Elmsford, NY (US); Venkatachalam C. Jaiprakash, Fremont, CA (US)

(73) Assignee: Nantero, Inc., Woburn, MA (US)

( * ) Notice: Subject to any disclaimer, the term of this patent is extended or adjusted under 35 U.S.C. 154(b) by 151 days.

This patent is subject to a terminal disclaimer.

(21) Appl. No.: 10/864,572

(22) Filed: Jun. 9, 2004

(65) Prior Publication Data
US 2005/0062062 A1   Mar. 24, 2005

Related U.S. Application Data

(60) Provisional application No. 60/476,976, filed on Jun. 9, 2003.

(51) Int. Cl.
 *H01L 29/96* (2006.01)
(52) U.S. Cl. ............... 257/415; 257/296; 257/E27.016; 257/E27.103; 977/742
(58) Field of Classification Search ................ 257/296, 257/415, E27.016, E27.103; 977/742
 See application file for complete search history.

(56) References Cited

U.S. PATENT DOCUMENTS

| 3,448,302 | A | 6/1969 | Shanefield | 307/318 |
|---|---|---|---|---|
| 4,044,343 | A | 8/1977 | Uchida et al. | |
| 4,845,533 | A | 7/1989 | Pryor et al. | 357/2 |
| 4,853,893 | A | 8/1989 | Eaton, Jr. et al. | 365/145 |
| 4,876,667 | A | 10/1989 | Ross et al. | 365/113 |
| 4,888,630 | A | 12/1989 | Paterson | 357/23.5 |
| 5,198,994 | A | 3/1993 | Natori | 365/145 |
| 5,834,818 | A | 11/1998 | Beilstein, Jr. et al. | 257/390 |
| 5,920,101 | A | 7/1999 | Beilstein, Jr. et al. | 257/390 |
| 6,044,008 | A | 3/2000 | Choi | 365/145 |
| 6,048,740 | A | 4/2000 | Hsu et al. | 438/3 |
| 6,128,214 | A | 10/2000 | Kuekes et al. | 365/151 |
| 6,159,620 | A | 12/2000 | Heath et al. | 428/615 |
| 6,198,655 | B1 | 3/2001 | Heath et al. | 365/151 |
| 6,256,767 | B1 | 7/2001 | Kuekes et al. | 716/9 |
| 6,314,019 | B1 | 11/2001 | Kuekes et al. | 365/151 |

(Continued)

OTHER PUBLICATIONS

Choi, W.B. et al., "Carbon-Nanotube-Based Nonvolatile Memory with Oxide-Nitride-Oxide Film and Nanoscale Channel", *Applied Physics Letters*, 2003. 82 (2) 275-277.

(Continued)

*Primary Examiner*—Jerome Jackson
(74) *Attorney, Agent, or Firm*—Wilmer Cutler Pickering Hale and Dorr LLP

(57) ABSTRACT

One-time programmable, non-volatile field effect devices and methods of making same. Under one embodiment, a one-time-programmable, non-volatile field effect device includes a source, drain and gate with a field-modulatable channel between the source and drain. Each of the source, drain, and gate has a corresponding terminal. An electromechanically-deflectable, nanotube switching element is electrically coupled to one of the source, drain and gate and has an electromechanically-deflectable nanotube element that is positioned to be deflectable in response to electrical stimulation to form a non-volatile closed electrical state between the one of the source, drain and gate and its corresponding terminal.

1 Claim, 68 Drawing Sheets

U.S. PATENT DOCUMENTS

| | | | |
|---|---|---|---|
| 6,430,511 B1 | 8/2002 | Tour et al. | 702/19 |
| 6,459,095 B1 | 10/2002 | Heath et al. | 257/14 |
| 6,462,977 B1 | 10/2002 | Butz | 385/63 |
| 6,518,156 B1 | 2/2003 | Chen et al. | 438/597 |
| 6,548,841 B1 | 4/2003 | Frazier et al. | |
| 6,559,468 B1 | 5/2003 | Kuekes et al. | 257/14 |
| 6,574,130 B1 | 6/2003 | Segal et al. | 365/129 |
| 6,643,165 B1 | 11/2003 | Segal et al. | 365/151.38 |
| 6,706,402 B1 | 3/2004 | Rueckes et al. | 428/402 |
| 6,707,098 B1 | 3/2004 | Hofmann et al. | 257/324 |
| 6,803,840 B1 | 10/2004 | Hunt et al. | |
| 6,809,465 B1 | 10/2004 | Jin | |
| 6,982,903 B1 * | 1/2006 | Bertin et al. | 365/163 |
| 2002/0130353 A1 | 9/2002 | Lieber et al. | |
| 2003/0021141 A1 | 1/2003 | Segal et al. | 365/129 |
| 2003/0021966 A1 | 1/2003 | Segal et al. | 428/209 |
| 2003/0124325 A1 | 7/2003 | Rueckes et al. | 428/209 |
| 2003/0165074 A1 | 9/2003 | Segal et al. | 365/153 |
| 2003/0170930 A1 | 9/2003 | Choi et al. | 438/99 |
| 2003/0199172 A1 | 10/2003 | Rueckes et al. | 438/754 |
| 2004/0027889 A1 | 2/2004 | Occhipinti et al. | 365/202 |
| 2004/0043148 A1 | 3/2004 | Wei et al. | 427/249.1 |
| 2004/0085805 A1 | 5/2004 | Segal et al. | 365/145 |
| 2004/0095837 A1 | 5/2004 | Choi et al. | 365/232 |
| 2005/0041465 A1 | 2/2005 | Rueckes et al. | |
| 2005/0041466 A1 | 2/2005 | Rueckes et al. | |
| 2005/0047244 A1 | 3/2005 | Rueckes et al. | |
| 2005/0056877 A1 | 3/2005 | Rueckes et al. | |
| 2005/0062035 A1 | 3/2005 | Bertin et al. | |

OTHER PUBLICATIONS

Cui, J.B. et al., "Carbon Nanotube Memory Devices of High Charge Storage Stability". *Applied Physics Letters*, 2002. 81 (17) 3260-3262.

Yoneya N. et al., "Charge transfer control by gate voltage in crossed nanotube junction", *Applied Physics Letters*, 2002. 81 (12) 2250-2252.

Kinaret, J.M. et al., "A carbon-nanotube-based nanorelay", *Applied Physics Letters*, 2003. 82 (8) 1287-1289.

Javey, Ali et al., "Carbon Nanotube Transistor Arrays for Multistage Complementary Logic and Ring Oscillators", *Nano Letters*, 2002. 2 (9) 929-932.

Fuhrer, M.S. et al., "High-Mobility Nanotube Transistor Memory", *Nano Letters*, 2002. 2 (7) 755-759.

Radoslavljevic, M. et al., "Nonvolatile Molecular Memory Elements Based on Ambipolar Nanotube Field Effect Transistors", *Nano Letters*, 2002. 2 (7) 761-764.

Sapmaz, S. et al., "Carbon Nanotubes as Nanoelectromechanical Systems", *Physical Review B*, 2003. 67 23514-1-23514-7.

Rueckes, T. et al., "Carbon Nanotube-Based Nonvolatile Random Access Memory for Molecular Computing", *Science*, 2000. 289, 94-97.

Bachtold, A. et al., "Logic Circuits with Carbon Nanotube Transistors", *Science*, 2001. 294, 1317-1320.

Brehob, M. et al., "The Potential of Carbon-based Memory Systems", 1-5., Aug. 1999 pp. 110-114.

Luyken, R.J. et al., "Concepts for hybrid CMOS-molecular nonvolatile memories", *Nanotechnology*, 2003. 14, 273-276.

Collins, P.G., "Nanotubes for Electronics", *Scientific American*, Dec. 2000. 62-69.

Appenzeller, J., et al., "Optimized contact configuration for the study of transport phenomena in ropes of single-wall carbon nanotubes", *Applied Physics Letters*, 2001. 78 (21) 3313-3315.

Appenzeller, J., et al., "A 10 nm MOSFET Concept", *Microelectronic Engineering*, 2001. 56, 213-219.

Appenzeller J. et al., "Field-Modulated Carrier Transport in Carbon Nanotube Transistors" *Physical Review Letters*, 2002. 89 (2) 126801-1-126801-6.

Appenzeller J. et al., "Carbon Nanotube Electronics", *IEEE Transactions on Nanotechnology*, 2002. 1 (4) 184-189.

Avouris Ph., "Carbon nanotube electronics", *Chemical Physics*, 2002. 281, 429-445.

Collins, P.G., et al., "Engineering Carbon Nanotubes and Nanotube Circuits Using Electrical Breakdown", *Science*, 2001. 292, 706-709.

Collins, P.G., "Current Saturation and Electrical Breakdown in Multiwalled Carbon Nanotubes", *Physical Review Letters*, 2001. 86 (14) 3128-3131.

Derycke, V., et al., "Carbon Nanotube Inter- and Intramolecular Logic Gates", *Nano Letters*, 2001. 1 (9) 453-456.

Derycke, V., "Controlling Doping and Carrier Injection in Carbon NanotubeTransistors", *Applied Physics Letters*, 2002. 80 (15) 2773-2775.

Heinze, S., "Carbon Nanotubes as Schottky Barrier Transistors" *Physical Review Letters*, 2002. 89 (10) 106801-1-106801-4.

Heinze, S., et al., "Unexpected Scaling of the Performance of Carbon Nanotube Transistors", published on the web Feb. 2003.

Heinze, S., et al., "Electrostatic engineering of nanotube transistors for improved performance", *Applied Physics Letters*, 2003. 83 (24) 5038-5040.

Martel, R., et al., "Single- and Multi-Wall Carbon Nanotube Field-Effect Transistors", *Applied Physics Letters*, 1998. 73 (17) 2447-2449.

Avouris, Ph., "Molecular Electronics with Carbon Nanotubes", *Accounts of Chemical Research*, vol. 35 No. 12 2002.

Martel, R. et al., "Ambipolar Electrical Transport in Semiconducting Single-Wall Carbon Nanotubes", *Physical Review Letters*, 2001. 87 (25) 256805-1-256805-4.

Martel, R. et al., "Carbon Nanotube Field-Effect Transistor and Logic Circuits", *DAC*, 2002. 7.4 94-98.

Radosavljevic et al., "Drain Voltage Scaling in Carbon Nanotube Transistors", *Applied Physics Letters*, 2003. 83 (12) 2435-2437.

Radosavljevic et al., "High Performance of Potassium *n*-Doped Carbon Nanotube Field Effect Transistors", *Applied Physics Letters*, 2004. 84 (18) 3693-3695.

Rochefort, A. et al., "Switching Behavior of Semiconducting Carbon Nanotubes Under an External Electric Field", *Applied Physics Letters*, 2001. 78 (17) 2521-2523.

Wind, S.J. et al., "Lateral Scaling in Carbon-Nanotube Field-Effect Transistors", *Physical Review Letters*, 2003. 91 (5) 058301-1-058301-4.

Wind, S.J. et al., "Transistor Structures for the Study of Scaling in Carbon Nanotubes", *J. Vac. Sci. Technol. B*, 2003. 21 (6) 2856-2859.

\* cited by examiner

Figure 2
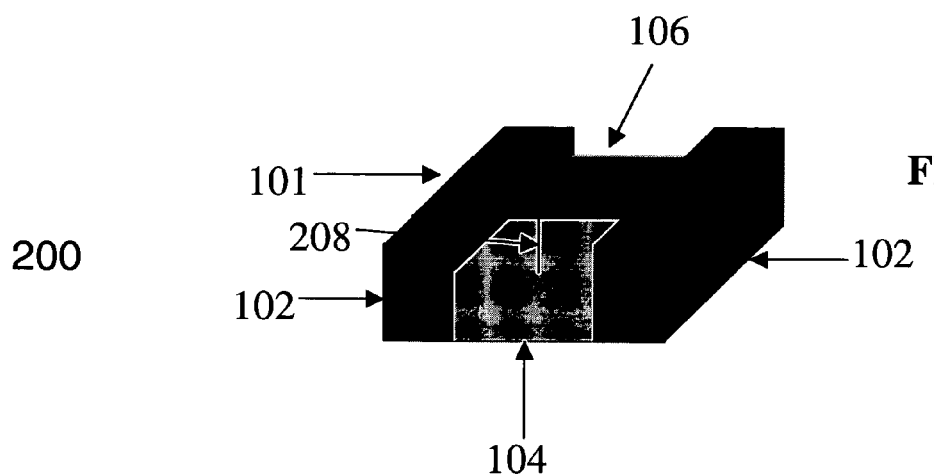
FIGURE 2A
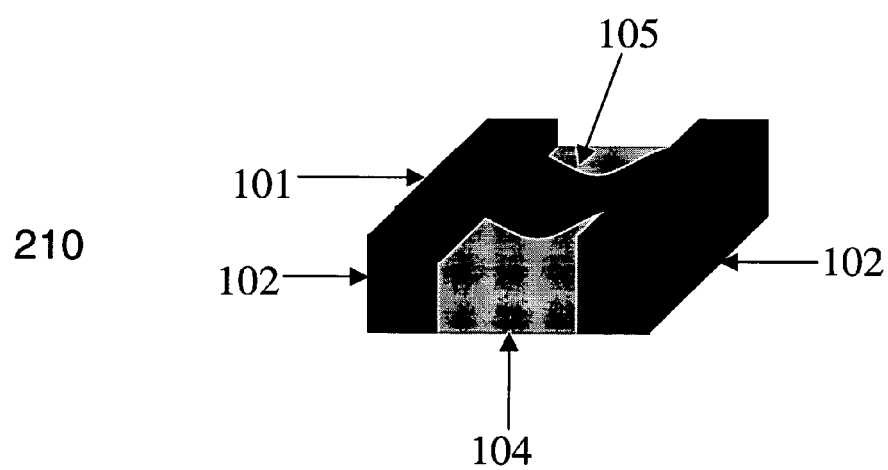
FIGURE 2B

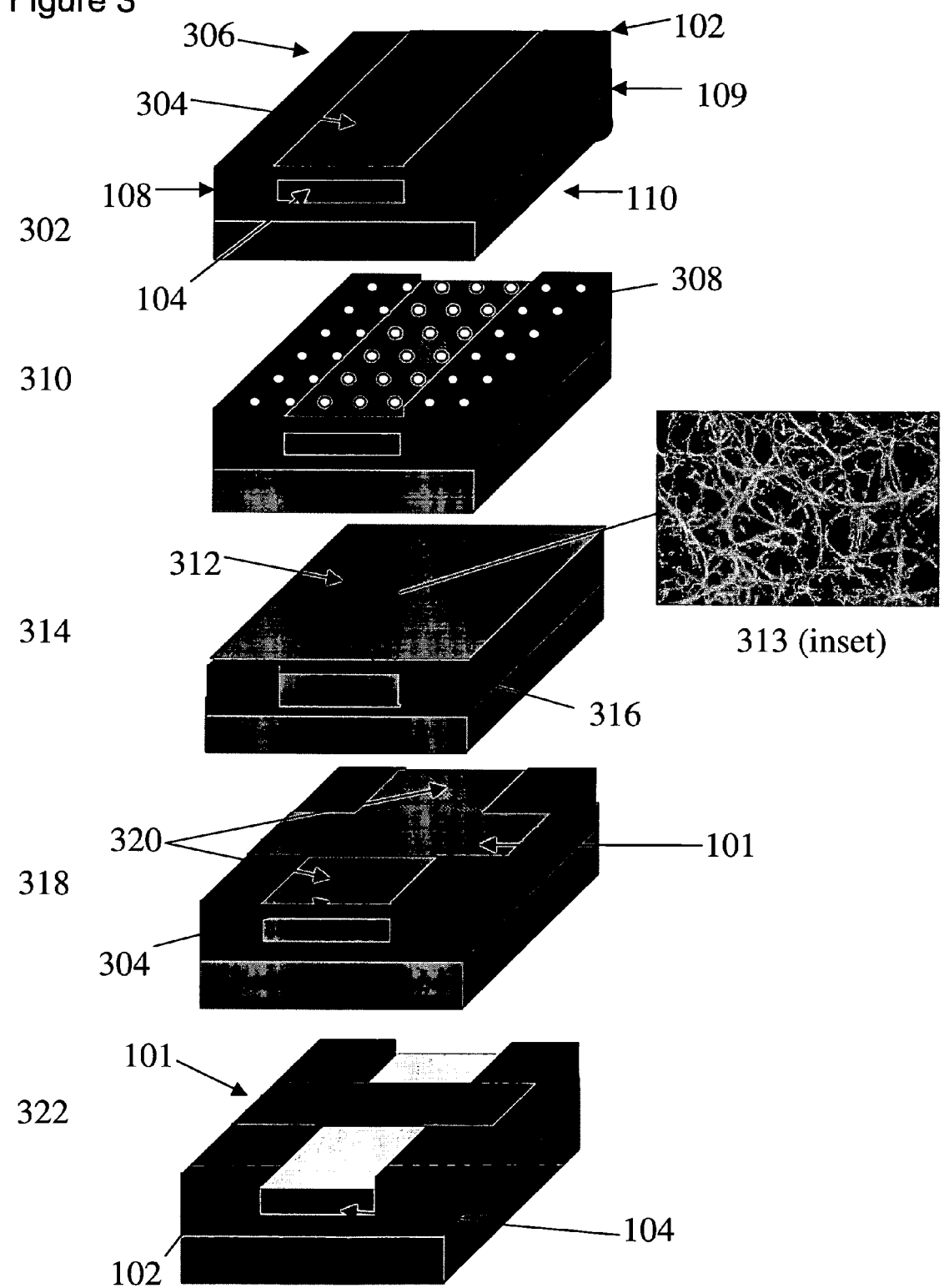

Figure 10
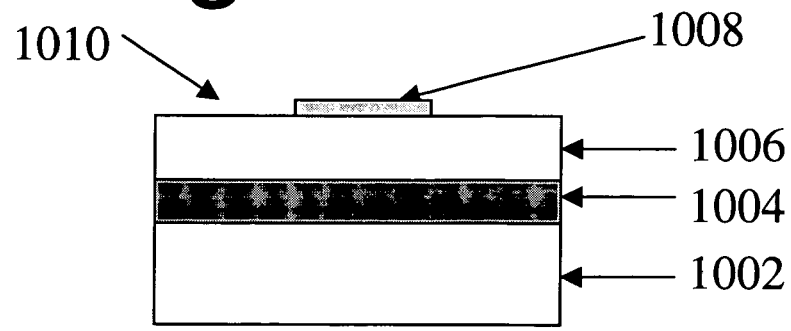
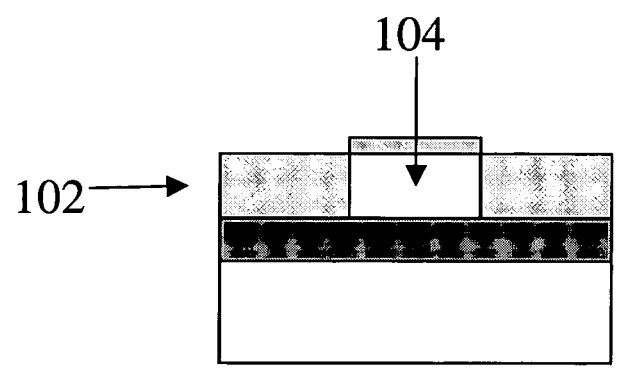
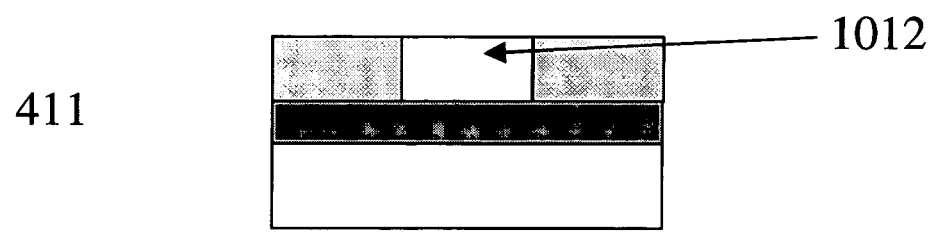
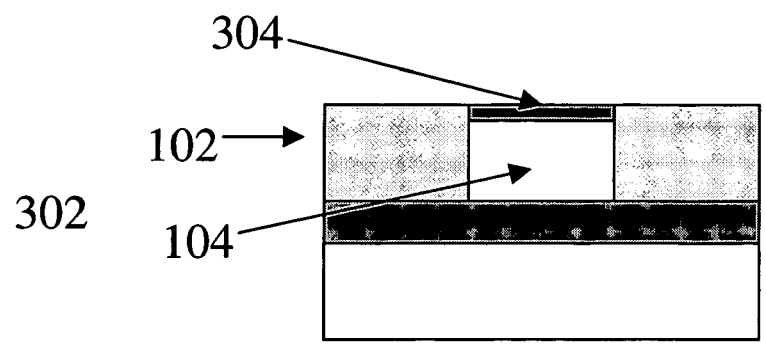

Figure 11
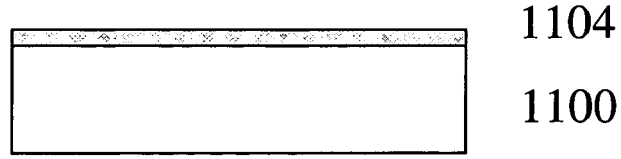
1104
1100
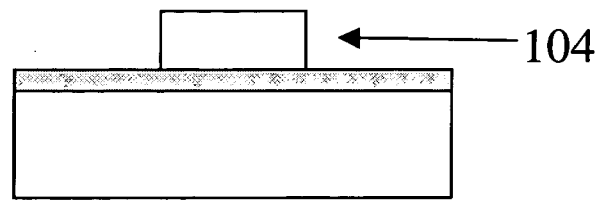
104
1107
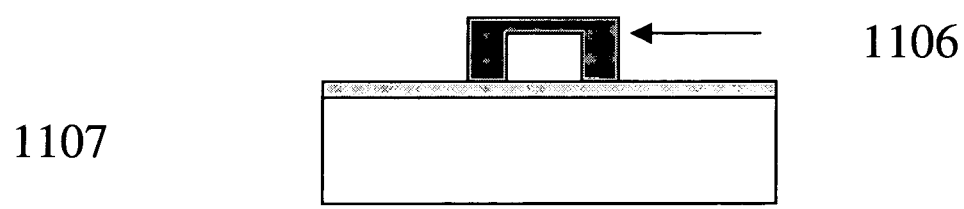
1106
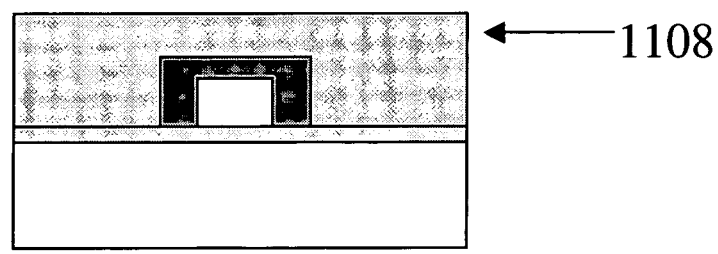
1108
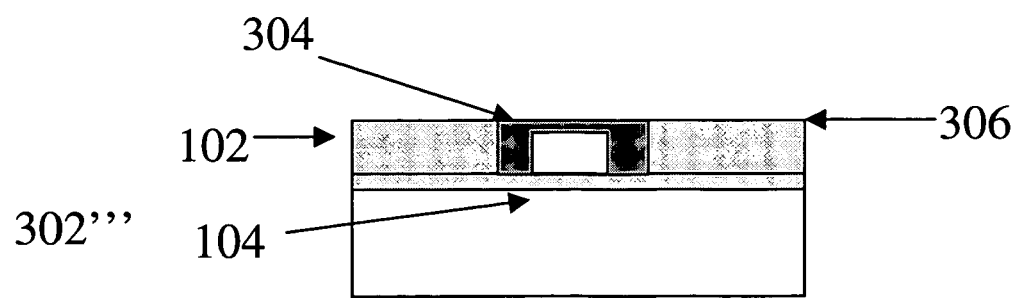
304
102
306
302'''  104

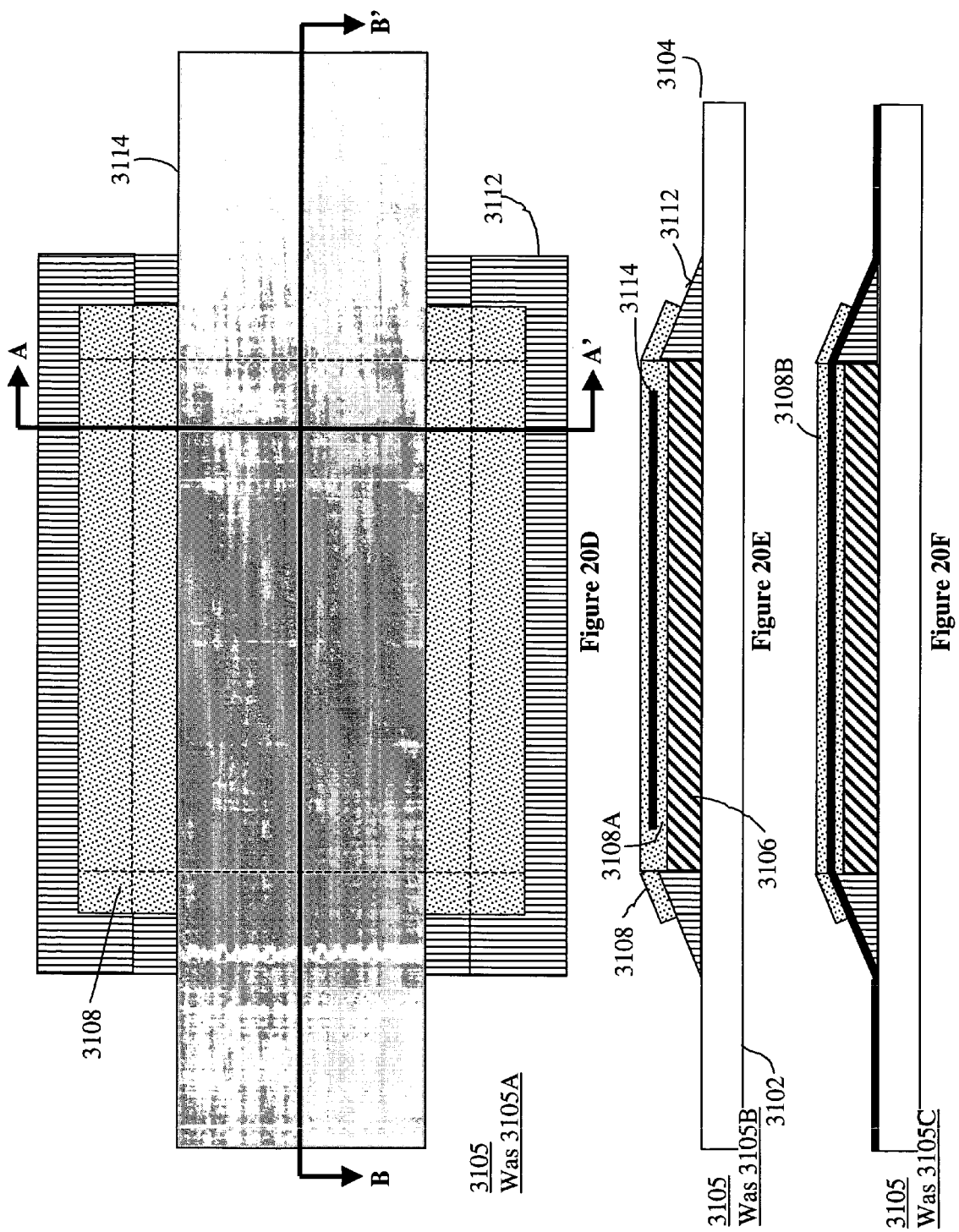

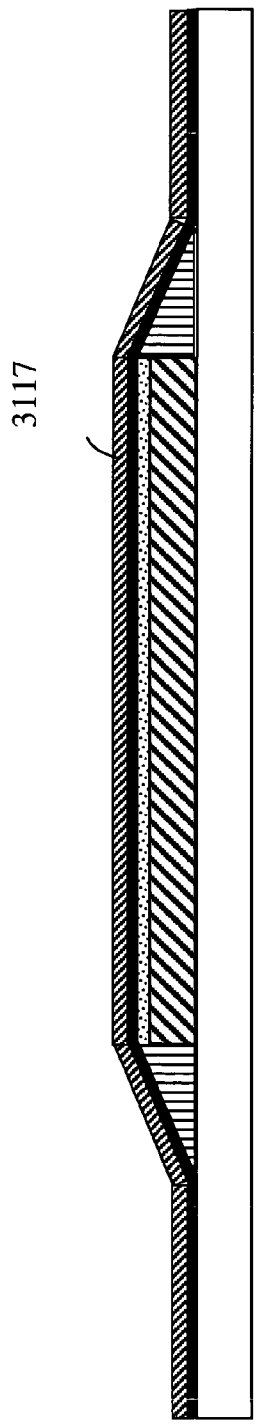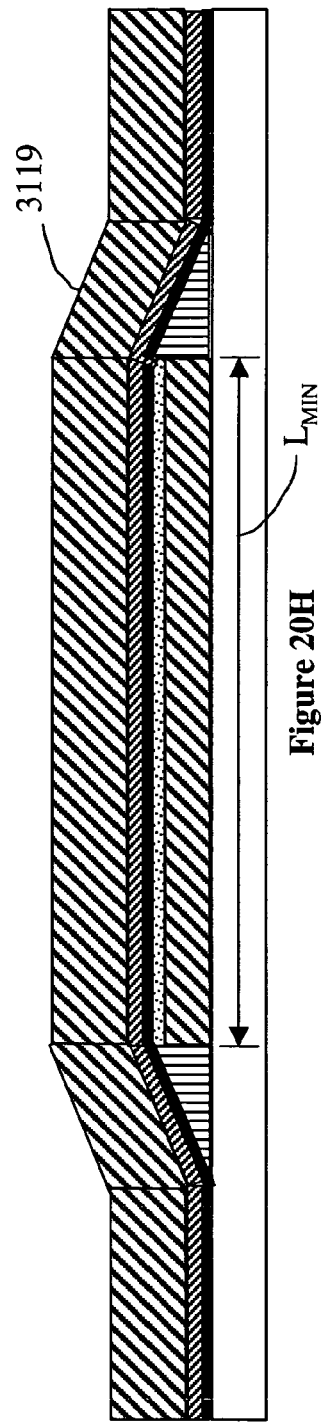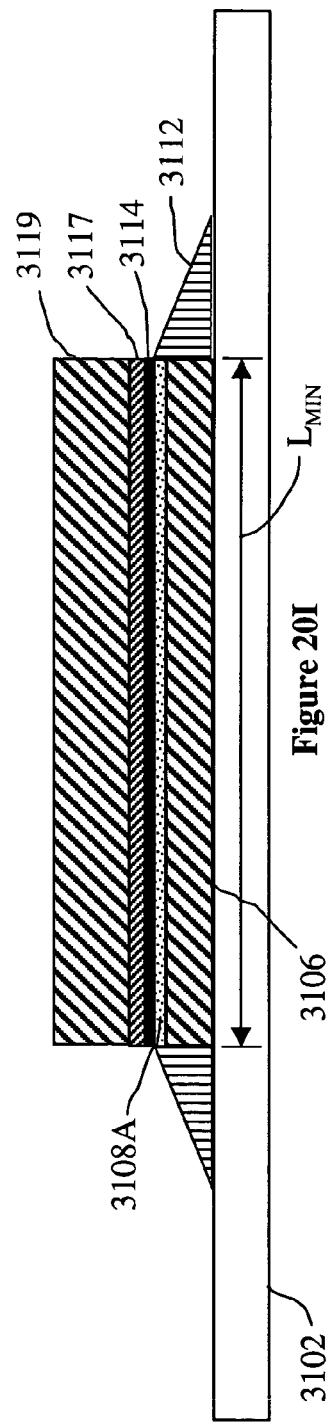

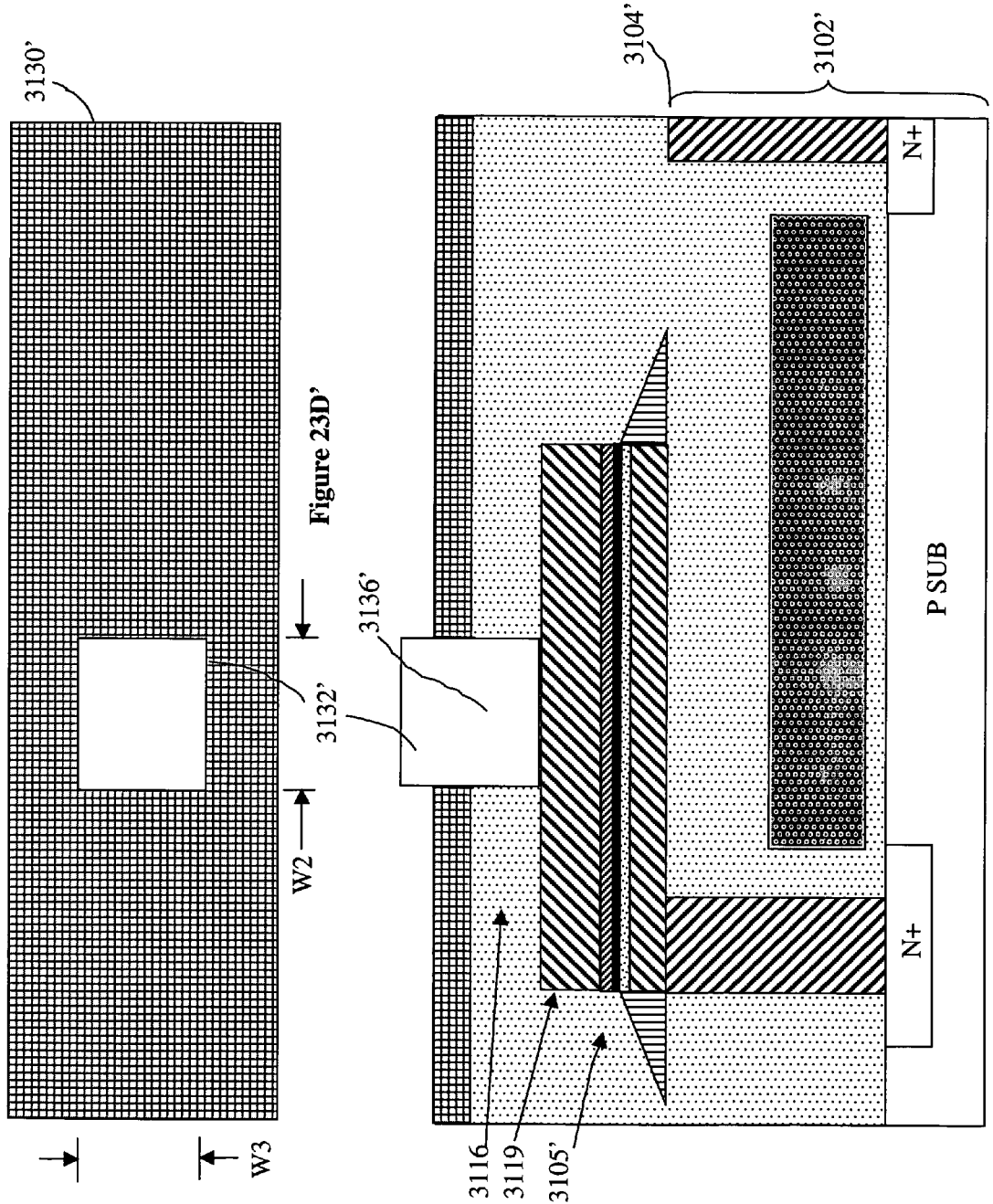

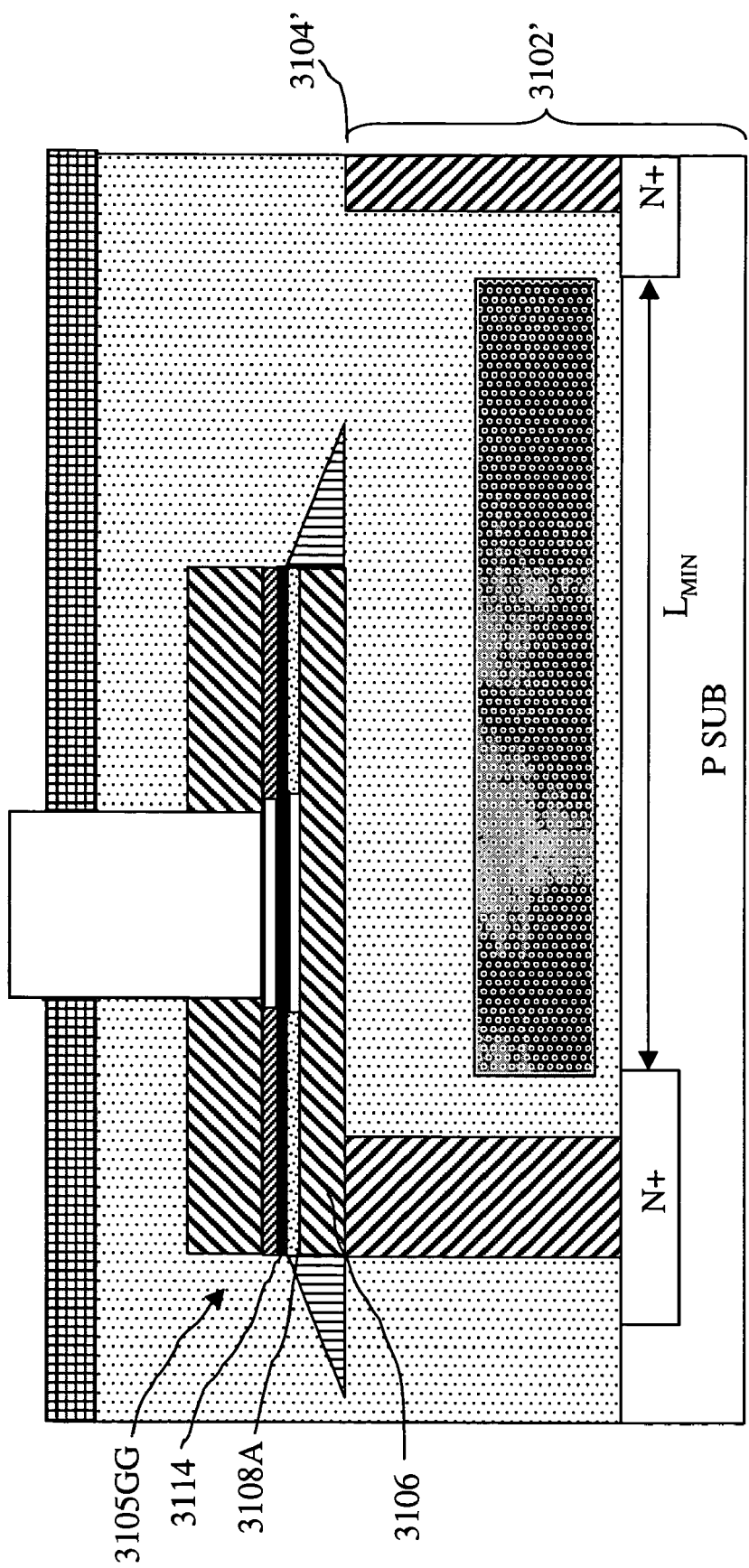
Figure 23F'''''

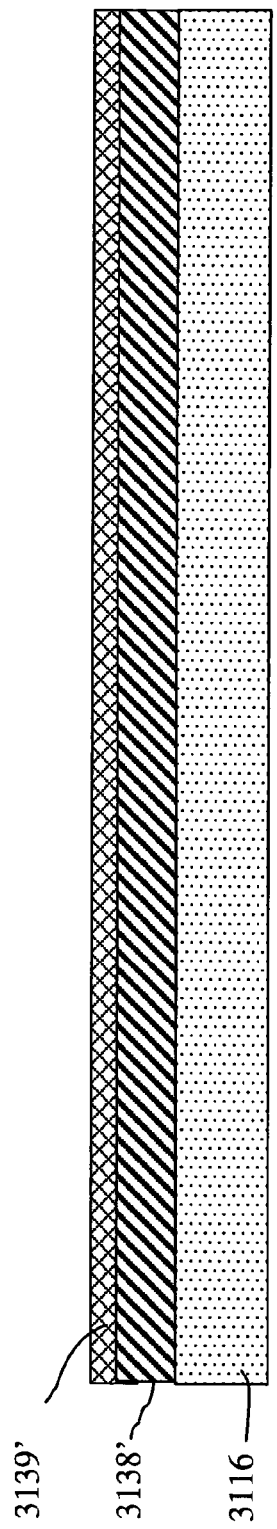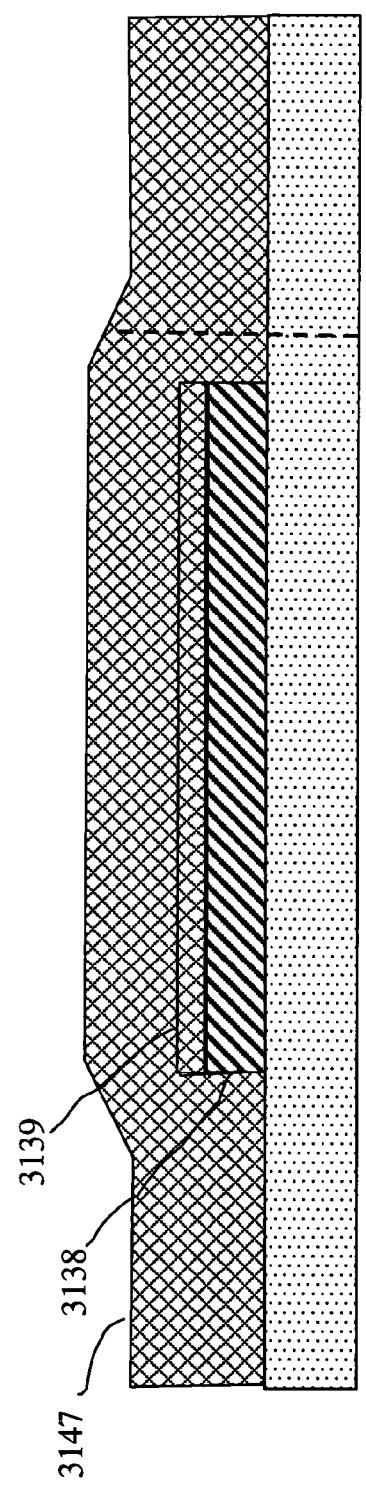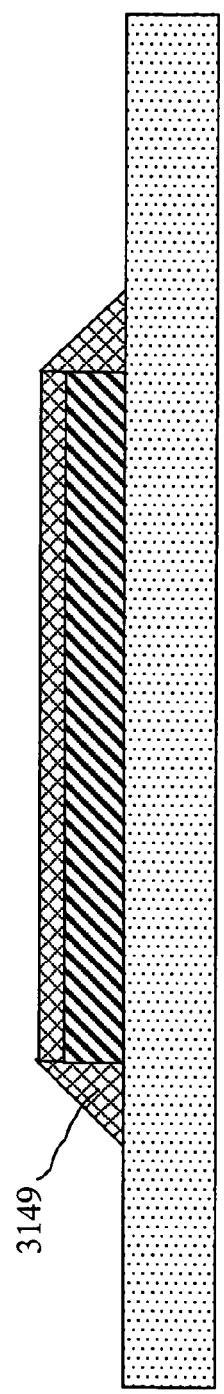
Figure 23J
Figure 23K
Figure 23L

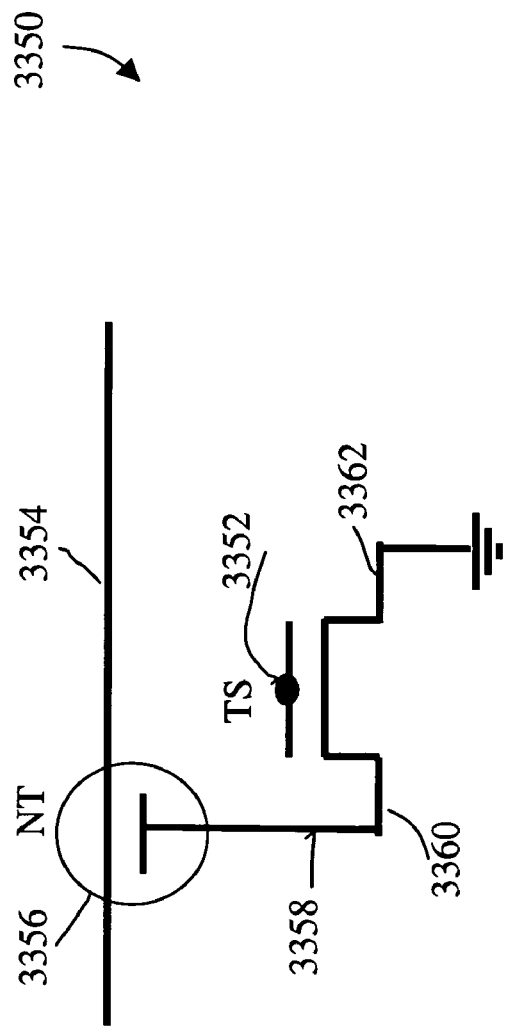
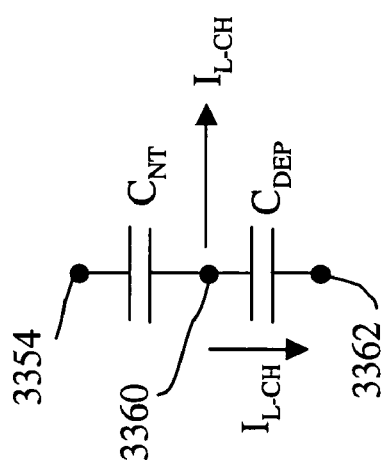
Figure 28A
Figure 28B

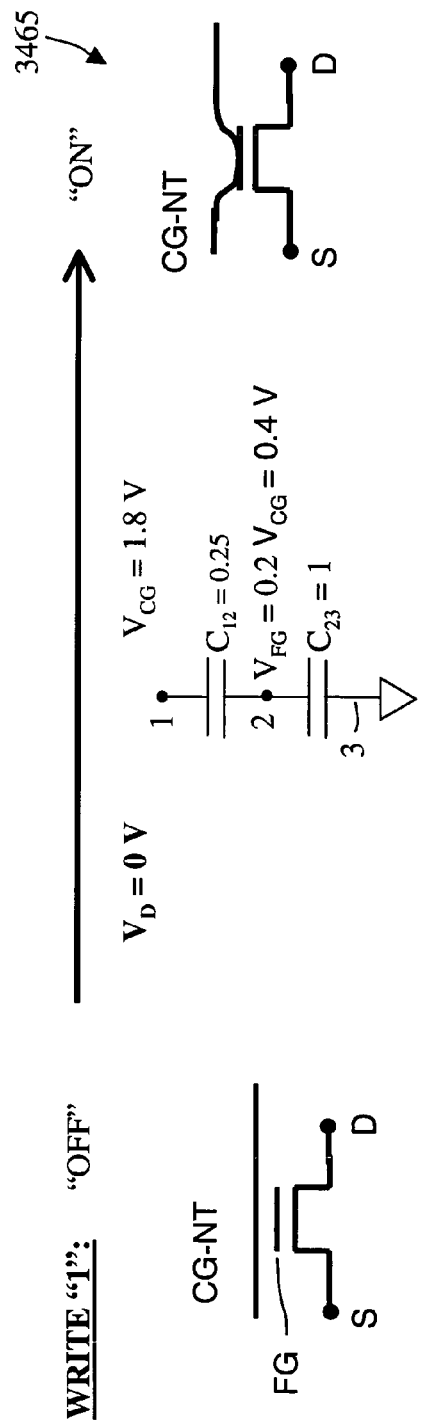
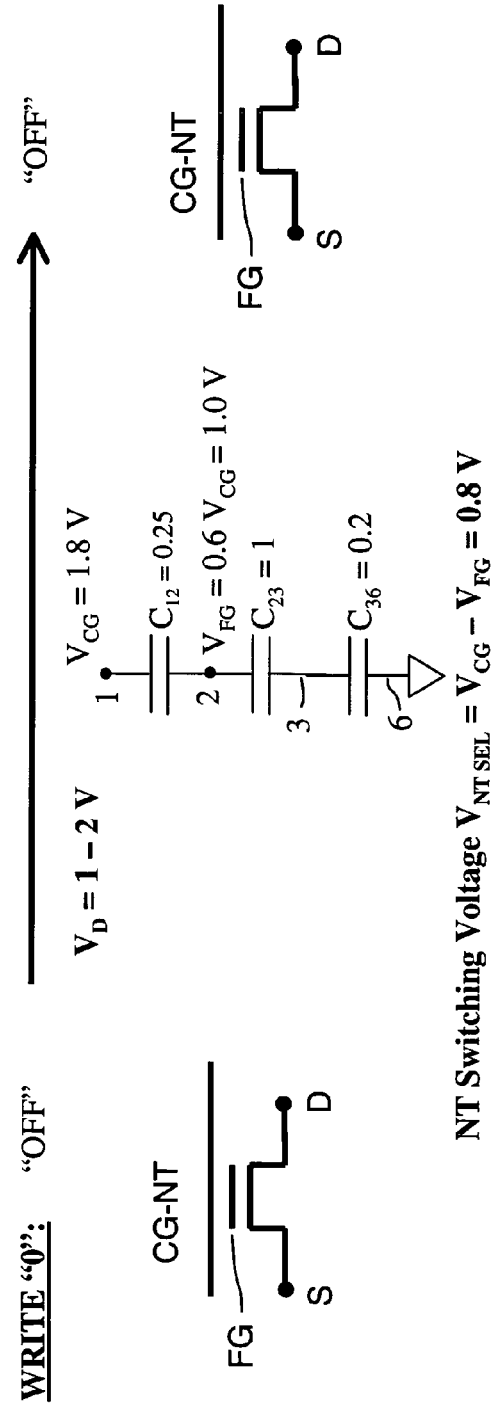
Figure 35A
NT Switching Voltage $V_{NT\,SEL} = V_{CG} - V_{FG} = 1.4\,V$
Figure 35B
NT Switching Voltage $V_{NT\,SEL} = V_{CG} - V_{FG} = 0.8\,V$
NET: NT SELECT (WRITE) VOLTAGE THRESHOLD RANGE $0.8v < V_{NT\,TH} < 1.4\,V$

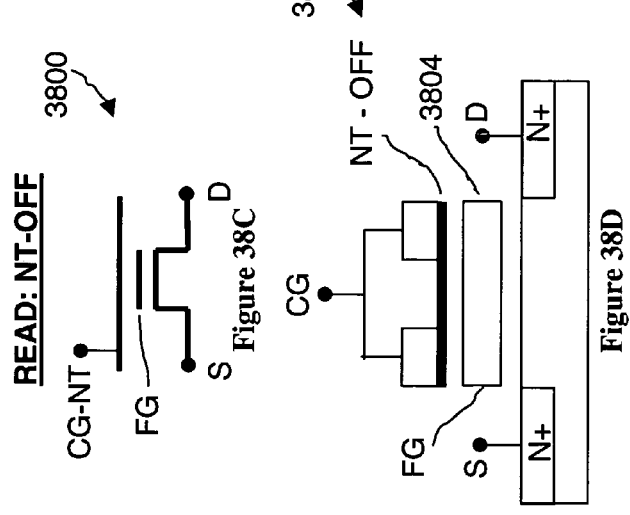
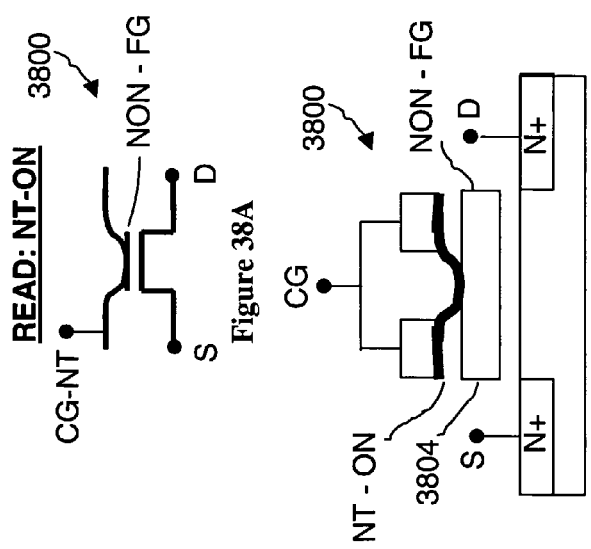
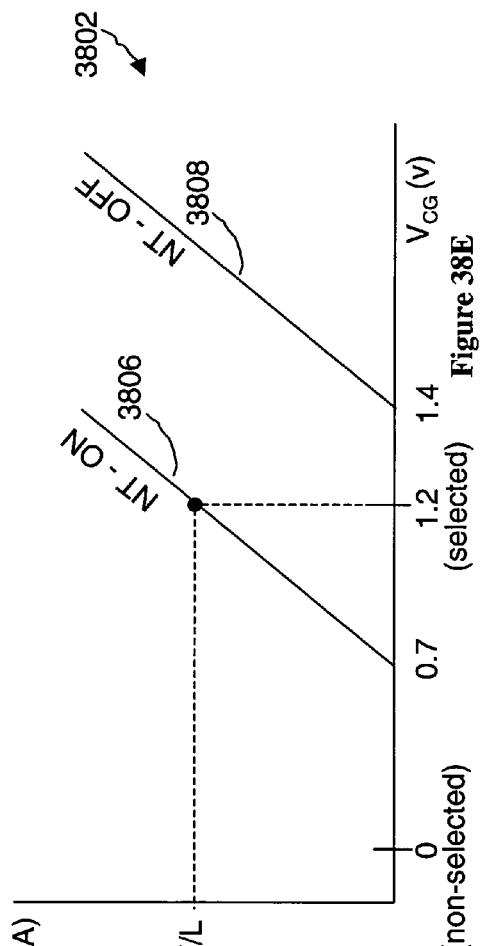

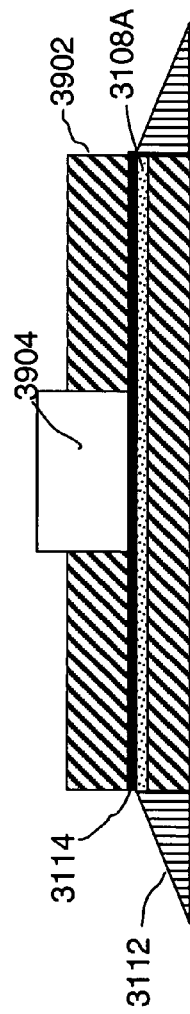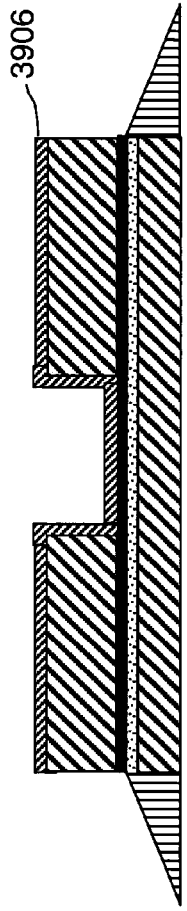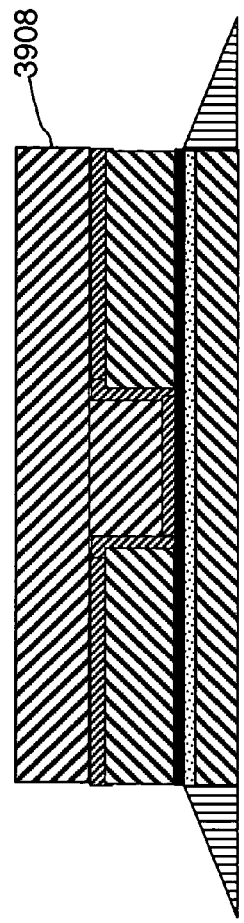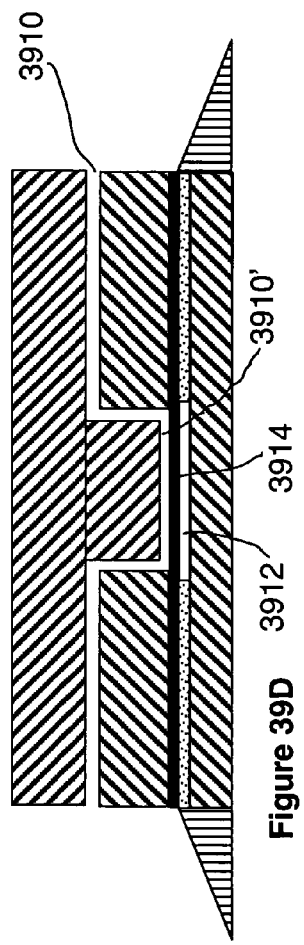

READ: NT-ON

READ: NT-OFF

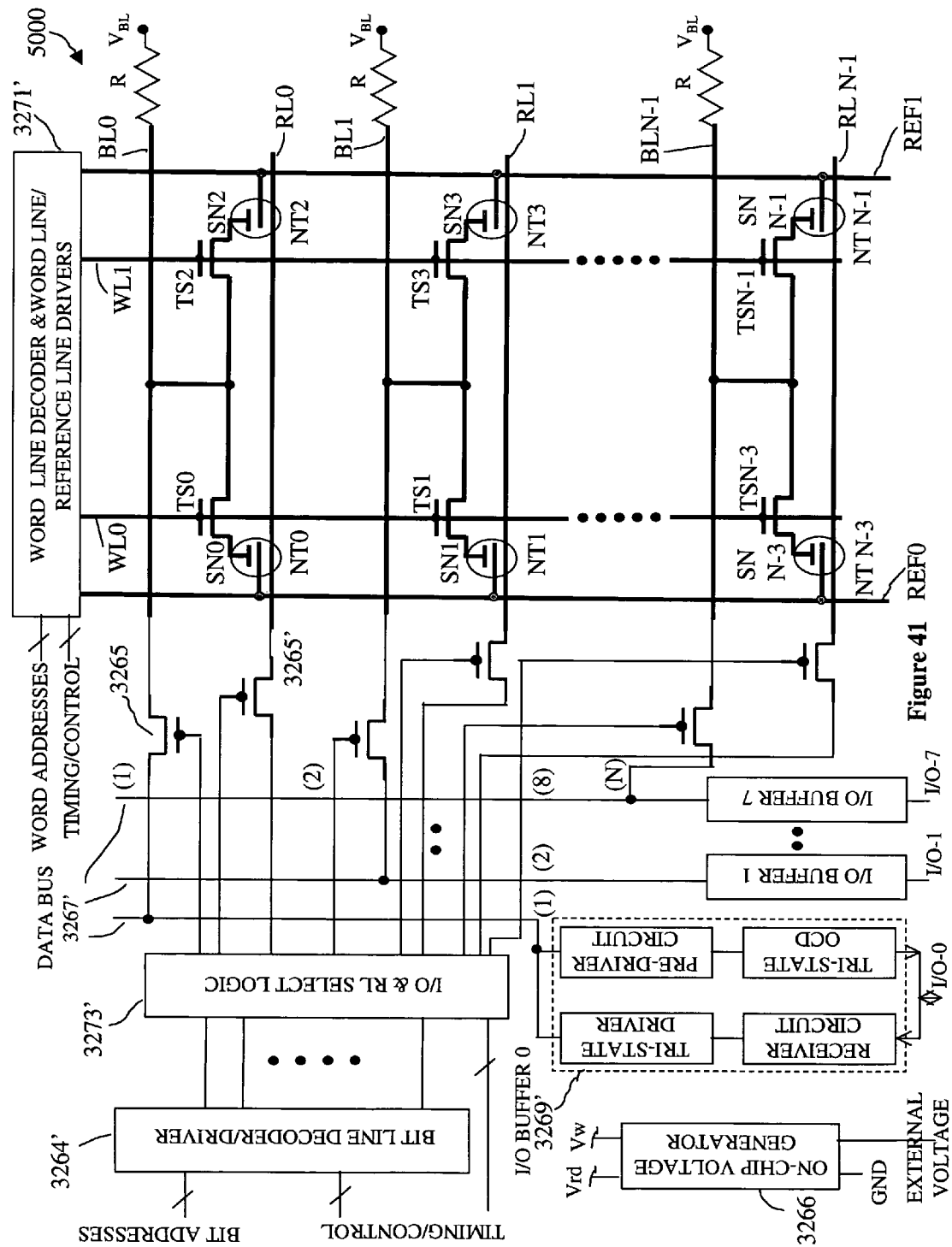

ONE-TIME PROGRAMMABLE, NON-VOLATILE FIELD EFFECT DEVICES AND METHODS OF MAKING SAME

CROSS REFERENCE TO RELATED APPLICATIONS

This application claims priority under 35 U.S.C. §119(e) to U.S. Provisional Patent Application No. 60/476,976, filed on Jun. 9, 2003, entitled Non-Volatile Electromechanical Field Effect Transistors and Methods of Forming Same, which is incorporated herein by reference in its entirety.

This application is related to the following U.S. applications, the contents of which are incorporated herein in their entirety by reference:

U.S. patent application Ser. No. 10/810,962, filed Mar. 26, 2004, entitled NRAM BIT SELECTABLE TWO-DEVICE NANOTUBE ARRAY;

U.S. patent application Ser. No. 10/810,963, filed Mar. 26, 2004, entitled NRAM BYTE/BLOCK RELEASED BIT SELECTABLE ONE-DEVICE NANOTUBE ARRAY;

U.S. patent application Ser. No. 10/811,191, filed Mar. 26, 2004, entitled SINGLE TRANSISTOR WITH INTEGRATED NANO TUBE (NT-FET); and U.S. patent application Ser. No. 10/811,373, filed Mar. 26, 2004, entitled NANOTUBE-ON-GATE FET STRUCTURES AND APPLICATIONS.

BACKGROUND

1. Technical Field

The present invention relates generally to bi-stable non-volatile electromechanical carbon nanotube interface to field-effect transistor and methods of forming such an interface.

2. Discussion of Related Art

There are numerous ways of forming patterns on and into the surfaces of semiconductor substrate materials. Semiconductor MOSFET transistors are ubiquitous in modern electronics. These devices possess the simultaneous qualities of bistability, high switching speed, low power dissipation, high-reliability, and scalability to very small (nanometer) dimensions. One feature not typical of such MOSFET-based circuits is the ability to retain a digital state (i.e. memory) in the absence of applied power. This need for a constantly applied power is most greatly felt in the area of miniature or portable electronic systems, where only limited battery power may be available.

Currently, most memory storage devices utilize a wide variety of energy dissipating devices which employ the confinement of electric or magnetic fields within capacitors or inductors respectively. Examples of state of the art circuitry used in memory storage include FPGA, ASIC, CMOS, ROM, PROM, EPROM, EEPROM, DRAM, MRAM and FRAM, as well as dissipationless trapped magnetic flux in a superconductor and actual mechanical switches, such as relays.

An FPGA (Field Programmable Gate Array) is a programmable logic device (PLD), a programmable logic array (PLA), or a programmable array logic (PAL) with a high density of gates, containing up to hundreds of thousands of gates with a wide variety of possible architectures. The ability to modulate (i.e. effectively to open and close) electrical circuit connections on an IC (i.e. to program and reprogram) is at the heart of the FPGA (Field programmable gate array) concept.

An ASIC (Application Specific Integrated Circuit) chip is custom designed for a specific application rather than a general-purpose chip such as a microprocessor. The use of ASICs can improve performance over general-purpose CPUs, because ASICs are "hardwired" to do a specific job and are not required to fetch and interpret stored instructions.

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM (Electrically-erasable programmable read-only memories) has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

EEPROMS are widely used within the computer industry to store a BIOS (basic input-output system) for a computer, sensor, or processing device, allowing it to load data and system instructions from other storage media when the unit receives first power after being in a quiescent state. The size of the BIOS is typically minimized in design because of the high cost of flash memory.

DRAM (dynamic random access memory) stores charge on capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiple writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; 5,198,994, 6,048,740; and 6,044,008.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and poor reliability and has not reached a state of commercialization. See U.S. Pat. Nos. 3,448,302; 4,845,533; and 4,876,667.

Wire crossbar memory (MWCM) has also been proposed. See U.S. Pat. Nos. 6,128,214; 6,159,620; and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul., 2000. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The use of an electromechanical bi-stable device for digital information storage has also been suggested (c.f. U.S. Pat. No. 4,979,149: Non-volatile memory device including a micro-mechanical storage element).

The creation and operation of a bi-stable nano-electro-mechanical switches based on carbon nanotubes (including mono-layers constructed thereof) and metal electrodes has been detailed in a previous patent application of Nantero, Inc. (U.S. Pat. Nos. 6,574,130, 6,643,165, 6,706,402; and U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties).

SUMMARY

The invention provides one-time programmable, non-volatile field effect devices and methods of making same.

Under one aspect of the invention, a one-time-programmable, non-volatile field effect device includes a source, drain and gate with a field-modulatable channel between the source and drain. Each of the source, drain, and gate has a corresponding terminal. An electromechanically-deflectable, nanotube switching element is electrically coupled to one of the source, drain and gate and has an electromechanically-deflectable nanotube element that is positioned to be deflectable in response to electrical stimulation to form a non-volatile closed electrical state between the one of the source, drain and gate and its corresponding terminal.

Under one aspect of the invention, a nanoscopic switch is used as a one-time programmable element called a nanotube programmable read-only memory (NPROM).

Under one aspect of the invention, a nanoscopic switch is integrated within a transistor structure called a nanoelectromechanical field effect transistor (NEMFET).

Under one aspect of the invention, a rewriteable NPROM is incorporated.

Under one aspect of the invention, the transistor incorporates a rewriteable NEMFET.

Under one aspect of the invention, a release electrode is added to allow an NPROM to be rewritable and thus, reprogrammable.

Under one aspect of the invention, a release electrode is added to allow an NEMFET to be rewritable and thus, reprogrammable. This device can be used as a RAM.

Under one aspect of the invention, a switch includes an aggregate of nanotube segments in which the nanotube segments contact other nanotube segments to define a plurality of conductive pathways along the article, the inventors define this as a nanotube ribbon.

Under one aspect of the invention, sub-lithographic fabrication techniques are used to decrease the size of the nanofabric switches in an NPROM structure.

Under one aspect of the invention, sub-lithographic fabrication technique is used to decrease the size of the nanofabric switches in an NEMFET structure.

Under one aspect of the invention, a nanotube fabric switch is incorporated in an NPROM memory array.

Under one aspect of the invention, a nanotube fabric switch is incorporated in an NPROM memory system.

Under one aspect of the invention, a nanotube fabric switch is incorporated in an NPROM memory system using CMOS or CMOS compatible architecture.

Under one aspect of the invention, a nanotube fabric switch is incorporated in an NEMFET memory array.

Under one aspect of the invention, a nanotube fabric switch is incorporated in an NEMFET memory system.

Under one aspect of the invention, a nanotube fabric switch is incorporated in an NEMFET memory system using CMOS or CMOS compatible architecture.

Under one aspect of the invention, the nanofabric switch is radiation hard.

Under one aspect of the invention, the NPROM is radiation hardened.

Under one aspect of the invention, the NEMFET is radiation hardened.

Under one aspect of the invention, the NPROM array is radiation hardened.

Under one aspect of the invention, the NPROM memory system is radiation hardened.

Under one aspect of the invention, the NEMFET array is radiation hardened.

Under one aspect of the invention, the NEMFET memory system is radiation hardened.

Under other aspects of the invention, the nanotube segments may be single-walled carbon nanotubes, or multi-walled carbon nanotubes. The various segments may have different lengths and may include segments having a length shorter than the length of the article.

Under one aspect of the invention, the nanotube ribbons may be disposed on substrates and may form an electrical network of nanotubes within the article itself.

Under other aspects of the invention, conductive articles may be made on a substrate by forming a nanotube fabric on the substrate and defining a pattern within the fabric in which the pattern corresponds to the conductive article.

Under other aspects of the invention, the nanotube fabric is formed by growing the nanotube fabric on the substrate using a catalyst, for example, in which the catalyst is a gas phase catalyst, or in which the catalyst is a metallic gas phase catalyst.

Under other aspects of the invention, the nanotube fabric is formed by depositing a solution of suspended nanotubes on a substrate. The deposited solution may be spun to create a spin-coating of the solution.

Under other aspects of the invention, the solution may be deposited by dipping the substrate into the solution.

Under other aspects of the invention, the nanotube fabric is formed by spraying an aerosol, containing nanotubes, onto a surface of the substrate.

The invention provides a method of making a film of conductive nanotubes. Under one aspect of the invention a substrate is provided and a vapor-phase catalyst is introduced to foster growth of nanotubes. A carbon source is also introduced to grow a layer of nanotubes that are substantially parallel to a major surface of the substrate.

Under another aspect of the invention, the vapor-phase catalyst is a metallocene.

Under one aspect of the invention, the nanotube fabric can be pinned using angled supports that make integration into a CMOS process more facile.

Under one aspect of the invention, the nanotube resistance can be controlled by the deposition technique and tuned to between 10–10000 Ohms.

Under one aspect of the invention, the nanotube fabric switch is used as a sensor for detecting chemical, biological, radiological and nuclear (CBRN) materials.

Under one aspect of the invention, the nanotube fabric switch is incorporated in an FPGA, ASIC, PLA, PAL System on Chip, or Package on Chip Device Under one aspect of the invention, the nanotube switch is vertically oriented.

The nanotube ribbons or conducting articles are created such that they are positioned near, or specifically above electrodes with which they may come in contact, when deflected, or switched. The invention contemplates that the location of the ribbon/switch is at one of three discrete locations in a transistor. The switch may be at the gate, source or drain.

In yet another aspect of the invention, an intermediate structure having a removable sacrificial layer is provided. The location of the sacrificial layer corresponds to the desired location of the switch. For example, in an aspect of the invention wherein the switch is located at the gate, an intermediate structure with a removable sacrificial layer is provided over the gate. Ribbon supports, laterally abutting the sacrificial layer are provided. A nanotube ribbon spanning the supports is provided, positioned above the sacrificial layer which in turn is positioned over the electrode with which the nanotube switch may come into contact. The ribbon contacts the sacrificial layer and supports lateral to the sacrificial layer. The sacrificial layer is removed, leaving the ribbon in contact with the supports and above a void between the ribbon and the electrode, thus creating a switch located at a gate. In aspects of the invention where the switch is located to bias the source, gate or drain, the sacrificial layer and ribbon are positioned above a conductive trace in electrical contact with the source, gate or drain, respectively, or in indirect electrical contact with the source, gate or drain.

The inventors contemplate that the electrical connection between the switch and the source, gate or drain need not be direct, but may be through one or more of any indirect means. Such means may include, but are not limited to a via, a plug or any metallic or conducting interconnect.

Article of Manufacture

The present invention provides a radiation hard nonvolatile electromechanical switch that can be used in any transistor, and particularly in logic memory units, CMOS, ASIC, FPGAs etc. More specifically, the present invention provides for the integration of a nano-electro-mechanical two-state switch constructed of carbon nanotubes (CNTs) interfaced with a semiconductor field-effect transistor. The present invention can use an energy conserving mechanism—specifically, the van der Walls forces between a metal MOSFET electrode and CNT—to store and retain binary information in a conventional transistor circuit, without energy dissipation. It is contemplated that ionic bonding, covalent bonding, etc. may also by used in creating bistable states for the nanotube electromechanical field effect transistors (NEMFETs) and for the hybrid nanotube fabric-on-source or nanotube fabric-on-drain/nanotube programmable read only memories (NPROMs) of the present invention. This combination of features makes it possible to design reliable and stable, yet reversible and/or re-configurable, connections in transistor circuits. In the present invention, an electromechanical switch is located at the gate, source or drain of a transistor. Whether the switch is in the bit ON or the bit OFF position will determine the conductivity of the transistor. Once the switch is biased "on" it remains in that state even upon the absence of applied voltage, therefore there is no need for periodic recharging, and i.e. it is non-volatile.

The inventors contemplate that the present invention could be used as the basic element for a number of additional applications including antifuses and fuses as well as reprogrammable devices such as FPGAs, ASICs, Systems on Chip, Systems on Package, RF transmitters and receivers, Photonics devices and Sensors especially for the detection of Chemical, Biological, Radiological and Nuclear (CBRN) materials.

Applications include non-volatile memories for either ultra-low power RAMs (random access memories) or for reprogrammable ROMs (read only memories) as well as field-programmable gate arrays.

The present invention allows such ROM chips to store far more information in a non-volatile state, while preserving costs. Such a BIOS could conceivably store the entire "suspended" state of a computer operating system, including resident memory, allowing for an "instant-on" at power up.

The prior art has addressed the desire of "non-volatile" operation with the construction of semiconductor memories built upon floating gate or "flash" transistor circuits. These configurations rely upon the assembly of charge on an ungrounded (i.e. floating) piece of metal to represent the stored information. Specialized techniques are required to fabricate such devices. Moreover, their ability to retain a charge (i.e. memory state), is transient, although it may extend into the multi-year range. The total number of reconfigurations or rewrites of data are also finite in such devices, due to eventual degradation of the capacitor oxide upon which charge is assembled or depleted.

The bi-stable NPROM/NEMFET interface described herein addresses the issue of non-volatility in FET circuits, while preserving the characteristics of low-power, radiation hardness, electromagnetic pulse (EMP) insensitivity, magnetic field insensitivity, shock resistance, high temperature stability, high-speed and reliability, and thereby overcoming some of the disadvantages found in the prior art. The present invention relies upon the energy conserving mechanism of van der Walls attraction between CNT and FET electrode for retaining the data provides the potential for a virtually permanent memory, with virtually unlimited number of writes and rewrites. In addition, the self-assembled nature of CNTs and compatibility with modern MOSFET fabrication techniques make this approach both cost-effective and straightforward to integrate with existing semiconductor IC fabrication techniques.

In contrast to DRAM, which needs a constant refresh rate to re-supply carriers to the DS (drain-source) channel of each MOSFET in order to maintain the bit state of the transistor, the use of a CNT bi-stable ribbon interface as described herein eliminates the need to refresh the gate, (CNT ribbon is defined as one or more Carbon Nanotubes). Further, the use of CNT ribbon allows the transistor state to be interrogated in a non-destructive readout configuration. The resulting decrease in required power would have a dramatic effect on the battery lifetime of, for instance, a laptop personal computer.

Another aspect of the present invention is to add the feature of controllable, permanent, yet reversible, modulation of the electrical connection between and among devices within a MOSFET-based integrated circuit.

The switch effectively replaces a capacitor or floating gate and modulates the electrical behavior of the NPROM/ NEMFET interface between two discrete states, as opposed to the analog continuum as described in U.S. Pat. No. 3,740,494, describing electromechanical transducers for coupling analog signals to FETs (Electromechanical Vibration Pick-ups and Record Pick-ups with Field Effect Transistors).

The natural nano-scale dimensions of CNTs, along with the small electric fields generated and extremely low power needed for the NPROM/NEMFET interface described herein to operate are compatible with modern ULSI scaling techniques.

Field programmable gate arrays use SRAM cells (pass transistors) to program the interconnects between CLBs (configurable logic blocks). Specialized software is needed for this and is required every time the chip is operated. The use of NPROM/NEMFET interfaces to fashion programmable interconnects could allow such FPGA chips to run without this software. (See also Nanoaddressing patent application of Nantero Inc., U.S. Ser. Nos. 09/915,173 and 09/915,095.

The present invention extends the FPGA paradigm, allowing a single transistor-gate-array chip to be configured and re-configured, at will, for applications such as rapid prototyping and in-field real-time adaptive filtering. Furthermore, the present invention is compatible with the ASIC paradigm, in that the electromechanical switch described herein can be used in a "hard-wired" ASIC array.

The present invention differs from the electromechanical bi-stable device for digital information storage recited in U.S. Pat. No. 4,979,149 in that the present invention does not necessitate the use of a transient charge assembly to create a deflecting force for the electromechanical element, nor does it necessarily rely on stresses or tensions in the electromechanical element to maintain the configuration.

BRIEF DESCRIPTION OF THE DRAWINGS

In the drawing,

FIGS. 2A–B illustrate two states of a memory cell according to certain embodiments of the invention;

FIG. 3 illustrates acts of making memory devices according to certain embodiments of the invention;

FIGS. 4–11 illustrate several forms of creating an intermediate structure used to make memory devices according to certain embodiments of the invention;

FIG. 18' is a flow chart of the steps in a process for fabricating an embodiment 2 nanotube structure on a partially processed semiconductor wafer;

FIG. 19' illustrates a cross section of a partially processed semiconductor structure including an embodiment 2 nanotube structure fabricated on the top surface;

FIG. 20D illustrates a plan view of an embodiment 1 nanotube structure;

FIG. 20E illustrates a cross section of an embodiment 1 nanotube structure;

FIG. 20F illustrates a cross section of a completed embodiment 1 nanotube structure;

FIG. 20G illustrates a cross section of a partially completed embodiment 2 nanotube structure with a second conformal sacrificial film;

FIG. 20H illustrates a cross section of a completed embodiment 2 nanotube structure;

FIG. 20I illustrates a cross section of a embodiment 2 nanotube structure;

FIG. 21' is a flow chart of the steps in a process for removing the sacrificial insulator layers surrounding the embodiment 2 nanotube structure;

FIG. 23D' illustrates a plan view of an embodiment 2 nanotube structure having a sacrificial mask layer with sub-lithographic regions removed. These regions are sub-lithographic in two orthogonal directions;

FIG. 23F' illustrates a cross section of a partially processed semiconductor structure with directional via holes in an insulator reaching the sacrificial insulator embodiment 2 nanotube structure;

FIG. 23F" illustrates a cross section of a partially processed semiconductor structure with top conductor layer sub-lithographic image etched in the top conductor of an embodiment 2 nanotube structure;

FIG. 23F''' illustrates a cross section of a partially processed semiconductor structure with top conductor layer sub-lithographic image etched in the top conductor and a portion of a top conductive sacrificial layer of an embodiment 2 nanotube structure;

FIG. 23F'''' illustrates a cross section of a partially processed semiconductor structure with top conductor layer sub-lithographic image etched in the top conductor, a portion of a top conductive sacrificial layer, and a portion of the bottom insulating sacrificial layer etched (removed), releasing the nanotubes of an embodiment 2 nanotube structure;

FIG. 23G' illustrates a cross section of a partially processed semiconductor wafer with nanotube sacrificial layer material removed and embodiment 2 nanotubes suspended (released), and enclosed in a dielectric layer;

FIG. 23H' illustrates a cross section of a completed semiconductor structure with an embedded integrated released embodiment 1 nanotube structure, contact studs, and surface wiring, a bit line with additional insulation to facilitate via hole etching, and a nanotube strapping layer;

FIG. 23H" illustrates a cross section of a completed semiconductor structure with an embedded integrated released embodiment 2 nanotube structure, contact studs, and surface wiring;

FIG. 23J illustrates a cross section of layers used to fabricate the bit line illustrated in FIG. 23H' and FIG. 23I';

FIG. 23K illustrates a partially fabricated cross section of the bit line illustrated in FIG. 23H' and FIG. 23I';

FIG. 23L illustrates a cross section of the bit line illustrated in FIG. 23H' and FIG. 23I';

FIG. 25' is a schematic representation of a NT-on-Source OTP memory system using sensing without requiring a sense amplifier with read and write architecture illustrated;

FIG. 28A is a schematic representation of a NT-on-Drain OTP memory cell;

FIG. 28B is a schematic representation of the NT and drain capacitance network;

FIG. 35A is a schematic of the capacitance network and associated voltages for the write "1" mode of operation for an NT Transistor (NT switches from OFF to ON state);

FIG. 35B is a schematic of the capacitance network and associated voltages for the write "0" mode of operation for an NT Transistor (NT remains in the OFF state);

FIG. 38A is a schematic of a OTP NT Transistor with 3 nanotube in the ON state;

FIG. 38B is a more detailed schematic of a OTP NT Transistor with nanotube in the ON state;

FIG. 38C is a schematic of a OTP NT Transistor with nanotube in the OFF state;

FIG. 38D is a more detailed schematic of a OTP NT Transistor with 3 nanotube in the OFF state;

FIG. 38E is a OTP NT Transistor illustration of electrical characteristics for nanotube in the ON state and OFF state;

FIG. 39A is an illustration of a cross section of early steps in the fabrication of an embodiment 3 nanotube structure in which a sub-lithographic minimum opening is defined in a conductor layer;

FIG. 39B is an illustration of a cross section after additional process steps in which a conformal second sacrificial layer is deposited on the structure of FIG. 39A;

FIG. 39C is an illustration of a cross section after additional process steps in which another conductive layer is deposited, planarized, and patterned to form a release electrode (release gate or release node);

FIG. 39D is an illustration of a final embodiment 3 nanotube structure cross section. Top sacrificial layer is etched and removed creating a gap above the nanotube in the sub-lithographic switching region. Also, a second etch removes a portion of the bottom sacrificial layer just below the switching region of the nanotube;

FIG. 41 is a schematic of a Read/Release/Write NRAM memory system for an embodiment 3 nanotube structure;

DETAILED DESCRIPTION

Figure 1:
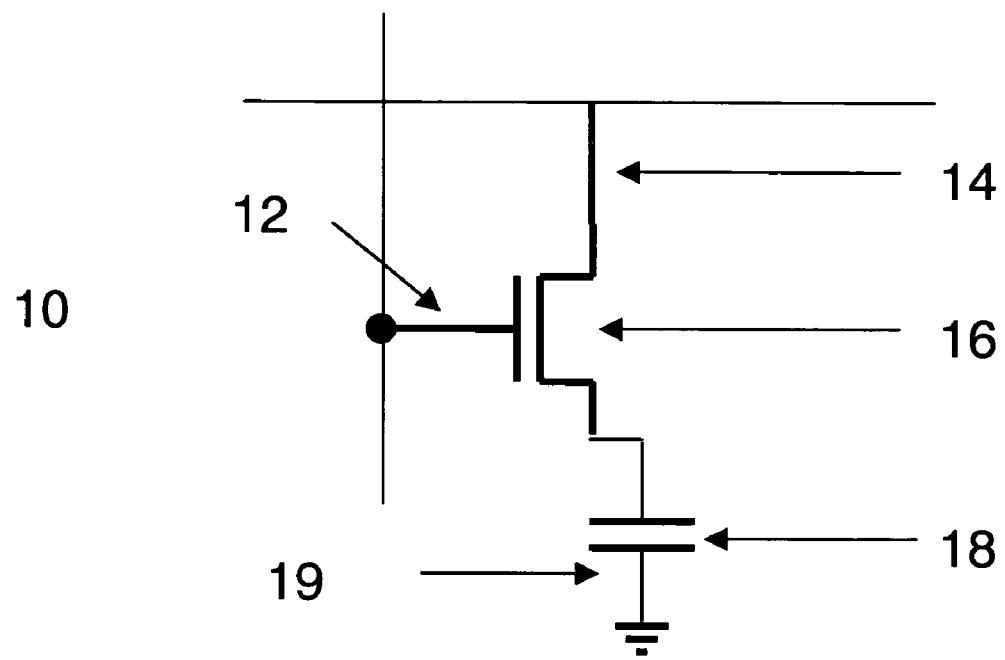
FIG. 1 depicts a circuit diagram for a typical DRAM transistor.

FIG. 1 represents a rendering of a transistor typical in the prior art. The gate 12, source 14, transistor 16, capacitor 18 and drain 19 are represented.

Structures 20, 30 and 40 depict three possible transistor configurations utilizing an nano-electromechanical switch. These configurations can render a capacitor unnecessary in DRAM and other memory configurations, as well is in transistors in general.

Figure 1A:
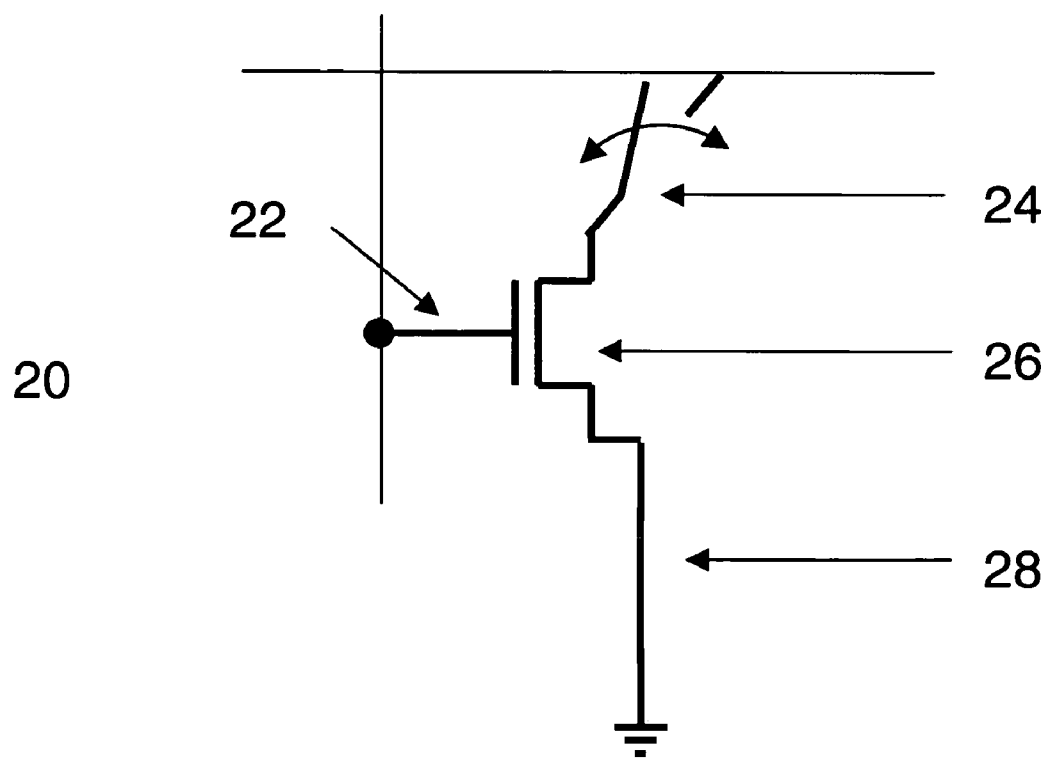
FIGS. 1A–C depict circuit diagrams for Non-volatile Electro-Mechanical Field Effect Transistors, NPROMs.

FIG. 1A depicts another aspect of the present invention where an electro-nanomechanical switch 24 is operably located at the source. The transistor 26, gate 22 and drain 28 may remain unchanged over the prior art, note a capacitor is unnecessary. It should be clear to anyone skilled in the art that each junction depicted in the figures can be at a gate, source or drain. It should be further understood that the inventors contemplate many other uses of this suspended switch which are not depicted.

Figure 1B:
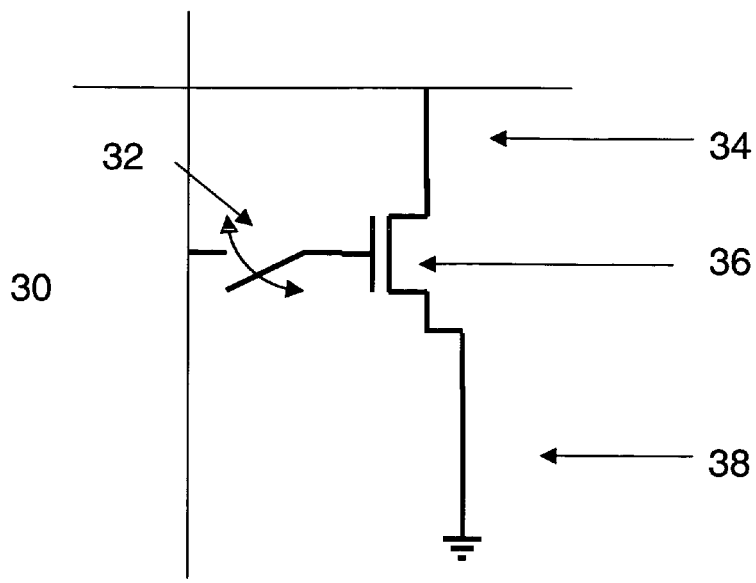

FIG. 1B depicts yet another aspect of the present invention whereby an electro-nanomechanical switch 32 is operably located at the gate. The transistor 36, source 34 and drain 38 may remain unchanged over the prior art, note a capacitor is unnecessary.

Figure 1C:
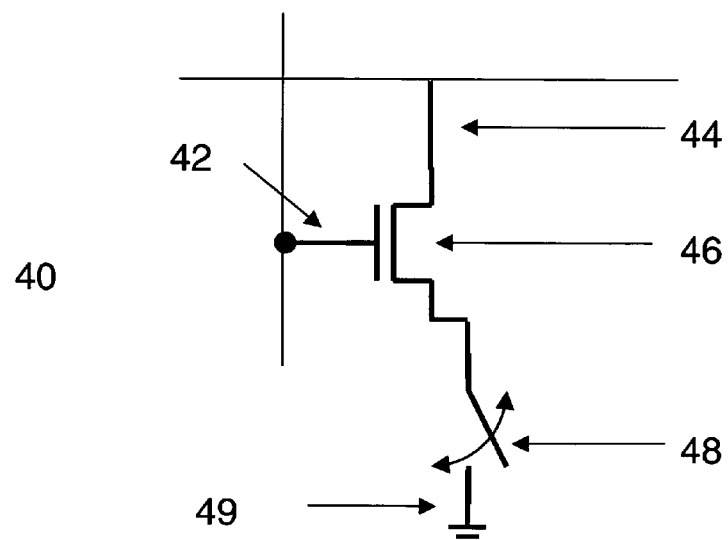

FIG. 1C depicts one aspect of the present invention where an electro-nanomechanical switch 48 is operably located at the drain 49. (The gate 42, source 44 and transistor 46 may remain unchanged over the prior art, note a capacitor is unnecessary.

Referring conjointly to FIGS. 2A–B, junction 106 illustrates the memory cell or switch in a first physical and electrical state in which the nanotube ribbon 101 is separated from corresponding trace 104. Junction 105 illustrates the cell in a second physical and electrical state in which the nanotube ribbon 101 is deflected toward corresponding trace 104. In the first state, the junction is an open circuit which may be sensed as such on either the ribbon 101 or on the trace 104 when so addressed. In the second state, the junction is a rectified junction (e.g., Schottky or PN), which may be sensed as such on either the ribbon 101 or on the trace 104 when so addressed.

Under certain embodiments, the nanotube ribbon 101 may be held in position at the supports by friction. In other embodiments the ribbon 101 may be held by other means, such as by anchoring the ribbons to the supports 102 using any of a variety of techniques. This friction can be increased through the use of chemical interactions including covalent bonding through the use of carbon compounds such as pyrenes or other chemically reactive species. Evaporated or spin-coated material such as metals, semiconductors or insulators especially silicon, titanium, silicon oxide or polyimide could also be added to increase the pinning strength. The nanotube ribbons or individual nanotubes can also be pinned through the use wafer bonding to the surface. See R. J. Chen et al., "Noncovalent Sidewall Functionalization of Single-Walled Carbon Nanotubes for Protein Immobilization," J. Am. Chem. Soc., 123, 2001, 3838–39 and Dai et al., Appl. Phys. Lett., 77, 2000, 3015–17 for exemplary techniques for pinning and coating nanotubes by metals. See also WO 01/03208 for techniques.

Under certain preferred embodiments as shown in FIGS. 2A–B, a nanotube ribbon 101 has a width of about 180 nm and is pinned to a support 102 preferably fabricated of silicon oxide, silicon nitride or appropriate insulating material. The local area of metallic or semiconducting trace 104 under ribbon 101 is positioned close to the supports 102 and preferably is no wider than the belt, e.g., 180 nm. The trace may be formed from an n-doped or p-doped silicon electrode or any other suitable conducting or semiconducting material. The relative separation 208 from the top of support 102 to the deflected position where nanotube ribbon 101 attaches to electrode 104 (see FIGS. 2A–B) should be approximately 5–50 nm. The magnitude of the separation 208 is designed to be compatible with electromechanical switching capabilities of the memory device. For this embodiment, the 5–50 nm separation is preferred (i.e. for certain embodiments utilizing ribbons 101 made from carbon nanotubes, but other separations may be preferable when using other materials). This magnitude arises from the interplay between strain energy and adhesion energy of the deflected nanotubes. These feature sizes are suggested in view of modern manufacturing techniques. Other embodiments may be made with much smaller (or larger) sizes to reflect the manufacturing equipment's capabilities.

The nanotube ribbon 101 of certain embodiments is formed from a non-woven fabric of entangled or matted nanotubes (more below). The switching parameters of the ribbon resemble those of individual nanotubes. Thus, the predicted switching times and voltages of the ribbon should approximate the same times and voltages of nanotubes. Unlike the prior art which relies on directed growth or chemical self-assembly of individual nanotubes, preferred embodiments of the present invention utilize fabrication techniques involving thin films and lithography. This method of fabrication lends itself to generation over large surfaces especially wafers of at least six inches. (In contrast, growing individual nanotubes over a distance beyond sub millimeter distances is currently unfeasible.) The ribbons should exhibit improved fault tolerances over individual nanotubes, by providing redundancy of conduction pathways contained with the ribbons. (If an individual nanotube breaks other tubes within the rib provide conductive paths, whereas if a sole nanotube were used the cell would be faulty.) Moreover, the resistances of the ribbons should be significantly lower than that for individual nanotubes, thus, decreasing its impedance, since the ribbons may be made to have larger cross-sectional areas than individual nanotubes.

FIG. 3 illustrates a method of making certain embodiments of CNT-based nano-electromechanical switches, or the switching portion of NPROM devices 200. A first intermediate structure 302 is created or provided. In the illustrated embodiment, the structure 302 includes a silicon substrate 110 having an insulating layer 109 (such as silicon dioxide) and a support layer ($SiO_2$ or $Si_3N_4$) 108 that defines a plurality of supports 102. In this instance, the supports 102 are formed by rows of patterned silicon nitride, though many other arrangements are possible, such as a plurality of columns. Conductive traces 104 extend between supports 102. In this instance, the traces 104 are shown as essentially contacting the supports 102, but other arrangements are possible as are other geometries; for example, spaces may exist between trace 104 and support 102 and trace 104 may be fashioned as a wire or may have non-rectangular transverse, cross-sections, including triangular or trapezoidal cross-sections. Sacrificial layers 304 are disposed above the traces 104 so as to define one planar surface 306 with the upper surface of the supports 102. This planar surface, as will be explained below, facilitates growth of a matted nanotube layer of certain embodiments.

Once such a structure 302 is created or provided, the upper surface 306 receives a catalyst 308. For example, under certain embodiments, a catalyst metal 308, containing iron (Fe), molybdenum (Mo), cobalt or other metals, is applied by spin-coating or other application techniques to create a second intermediate structure 310.

A matted layer 312 of nanotubes is then created to form a non-woven fabric of preferably single-walled carbon nanotubes (SWNTs) to form a third intermediate structure 314. Nanofabrics may be created by chemical vapor deposition (CVD) or by applying prefabricated nanotubes onto a substrate, e.g. by spin coating a suspension of nanotubes onto a substrate, as described in applications: U.S. Pat. Nos. 6,574, 130, 6,643,165, 6,706,402; and U.S. patent application Ser. Nos. 09/915,093, 10/033,323, 10/033,032, 10/128,117, 10/341,005, 10/341,055, 10/341,054, 10/341,130, 10/776, 059, and 10/776,572, the contents of which are hereby incorporated by reference in their entireties. While SWCNTs are preferred, multi-walled CNTs may be used. For example, the second intermediate structure 310 may be placed into an oven and heated to a high temperature (for example, about 800–1200° C.) while gases containing a carbon source, hydrogen and inert gas, such as argon or nitrogen, are flowed over the upper surface. This environment facilitates the generation or growth of the matted layer or film 312 of single-walled carbon nanotubes. Layer 312 is primarily one nanotube thick and the various tubes adhere to one another via van der Waals forces. Occasionally, one nanotube grows over or rests upon the top of another nanotube, though this growth is relatively infrequent due to the tendencies of the material. Under some embodiments (not shown), the catalyst 308 may be patterned to assist in growing the nanotubes with specific densities either more or less dense as is desired. When conditions of catalyst composition and density, growth environment, and time are properly controlled, nanotubes can be made to evenly distribute over a given field that is primarily a monolayer of nanotubes. Proper growth requires control of parameters including but not limited to catalyst composition and concentration, functionalization of the underlying surface, spin coating parameters (length, nanotube suspension concentration and RPM), growth time, temperature and gas concentrations.

A photoresist may then be applied to layer 312 and patterned to define ribbons in the matted nanotube layer 312. The ribbon patterns cross (for example, perpendicularly) the underlying traces 104. The photoresist is removed to leave ribbons 101 of non-woven nanotube fabric lying on planar surface 306 to form fourth intermediate structure 318: fourth intermediate structure 318 having exposed sacrificial layer portions 320 as shown. Structure 318 is then treated with an acid, such as HF, to remove sacrificial layer 304, including the portion under the ribbons 101, thus forming nanotube ribbon array 322 nanotube ribbon array being suspended over traces 104 and supported by supports 102.

Subsequent metallization may be used to form addressing electrodes, alternatively, the nanotube fabric may be created over a substrate with previously embedded addressing electrodes.

The above techniques, i.e. the various growth, spin-coating, patterning, and etching operations may be performed using conventional, lithographic patterning techniques. Currently, this may result in feature sizes (e.g., width of ribbon 101) of about 180 nm to as low as 45 nm, but the physical characteristics of the components are amenable to even smaller feature sizes if manufacturing capabilities permit.

Figure 4:
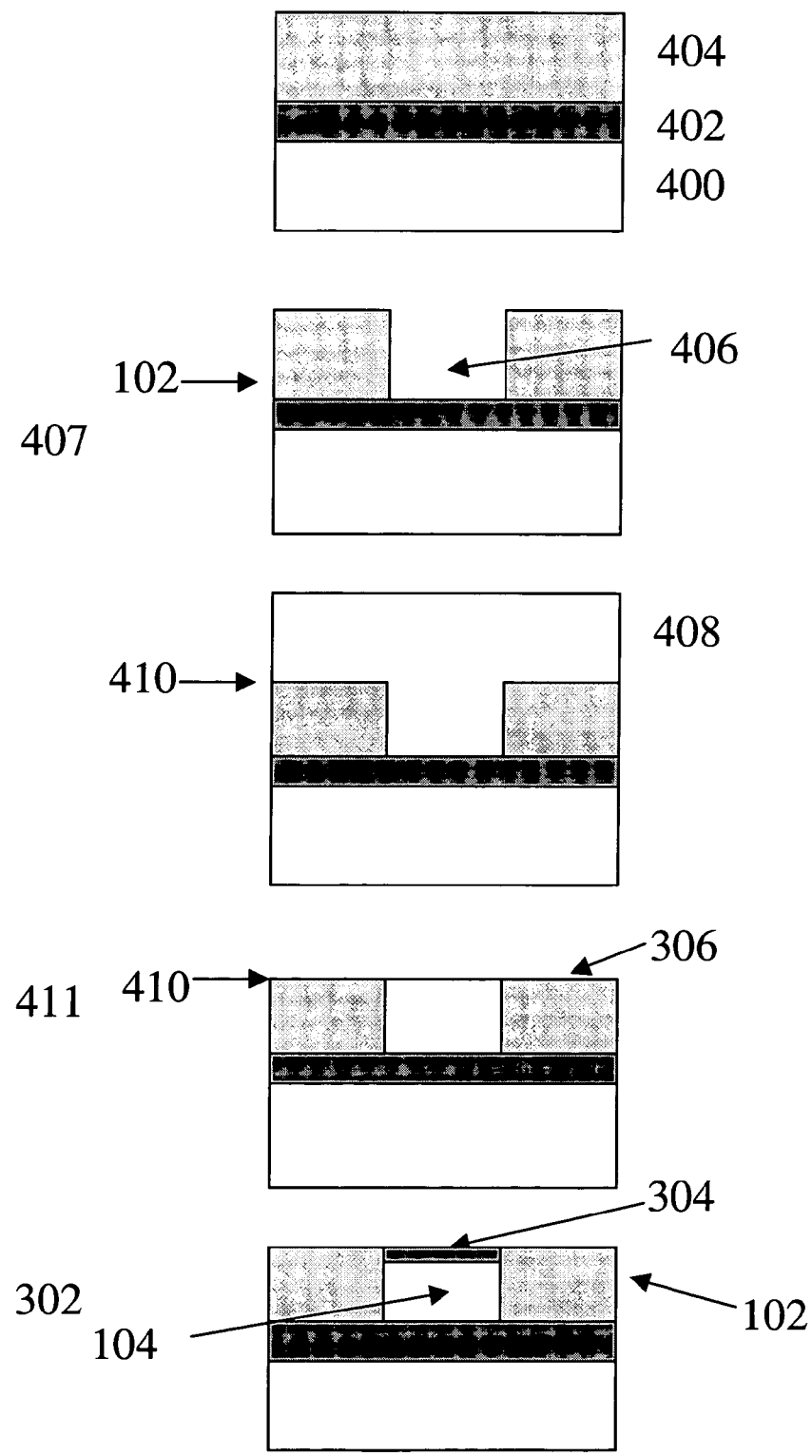

As will be explained below, there are many possible ways of creating the intermediate structures or analogous structures described above. FIG. 4, for example, shows one way to create first intermediate structure 302.

A silicon wafer 400 is provided with an oxide layer 402. The oxide layer is preferably a few nanometers in thickness but could be as much 1 μm. A silicon nitride ($Si_3N_4$) layer 404 is deposited on top of the oxide surface 402. The silicon nitride layer is preferably at least 30 nm thick. The silicon nitride layer 404 is then patterned and etched to generate one or more cavities 406 to form support structure 407. With modern techniques the cavity width may be about 180 nm wide or perhaps smaller. The remaining silicon nitride material defines the supports 102 (e.g., as rows, or perhaps columns). A covering 408 of metallic or semiconducting material is then deposited to fill the cavities 406. This material may be made from n- or p-doped silicon or other suitable material known in the art. The covering 408 for exemplary embodiments may be about 1 μm thick but may be as thin as 30 nm. The covering 408 is then processed, for example by self-flattening of thick silicon layers or by annealing, to produce a planar surface 306, discussed above, to form structure 411. In the case of self-flattening, reactive ion etching (RIE) with end-point detection (EPD) may be utilized until the upper surface 410 of the etched silicon nitride is reached. The structure 411 is then oxidized to form and define sacrificial layers 304 of $SiO_2$ about 10–20 nm deep into planar surface 306. The unconverted, remaining portions of silicon form traces 104.

Figure 5:
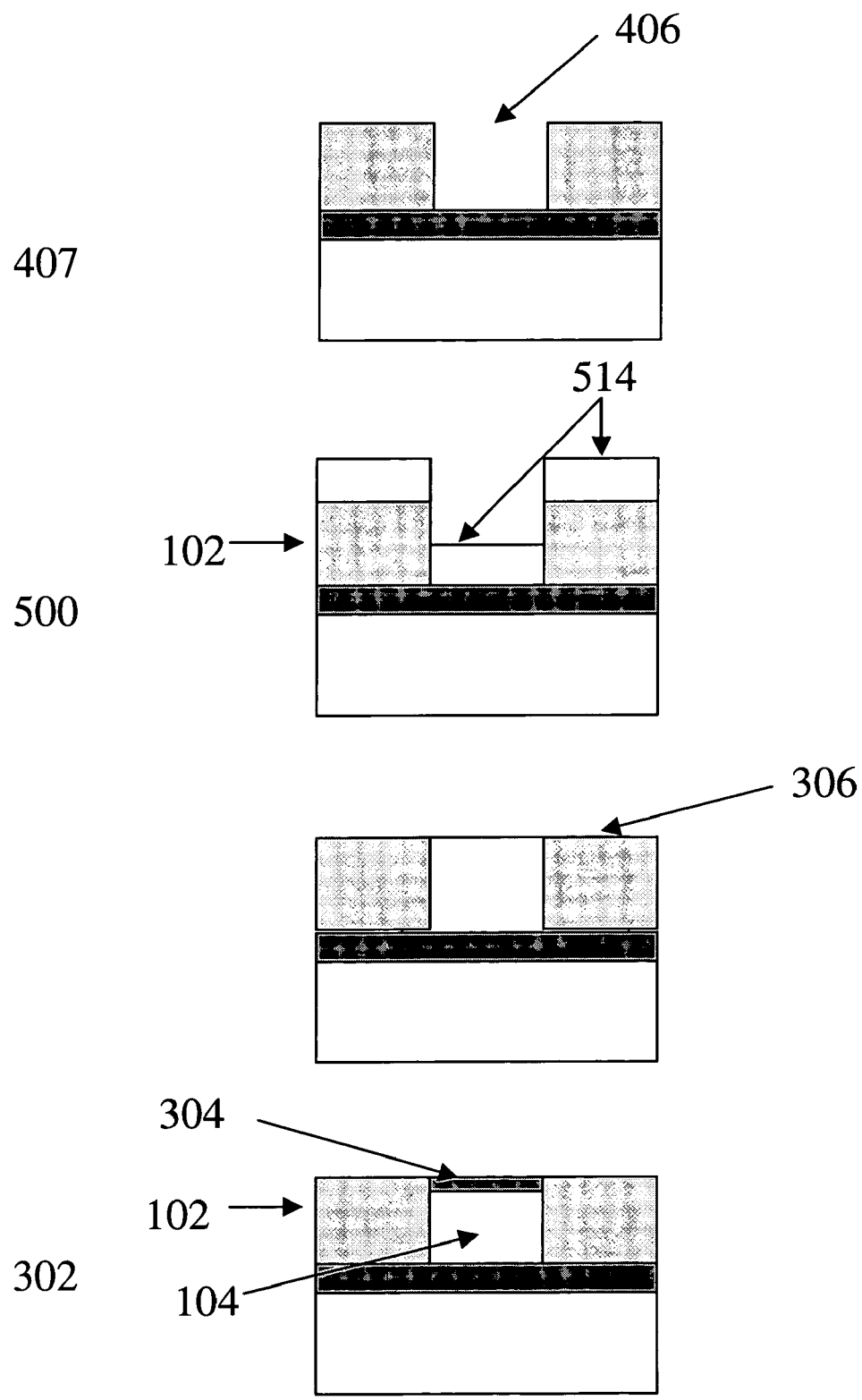

FIG. 5 shows another method that may be used to create NPROM devices 100 of certain embodiments. A support structure 407, like that described in connection with FIG. 4, is provided. A layer 514 of metallic or semiconducting material is then added using a CVD process, sputtering or electroplating. Such material may be n- or p-doped silicon or other suitable material known in the art. Under certain embodiments, layer 514 is added to be about half the height of the $Si_3N_4$ supports 102.

Structure 500 show that after the layer 514 is added, an annealing step is performed to yield a planarized surface 306 to form a structure 411 like that described above. The annealing step causes the silicon of layer 514 to flow into the cavities 406.

Like that described in connection with FIG. 4, the structure 411 is then oxidized to form and define sacrificial layers 304 of $SiO_2$ about 10–20 nm deep into planar surface 306.

Figure 6:
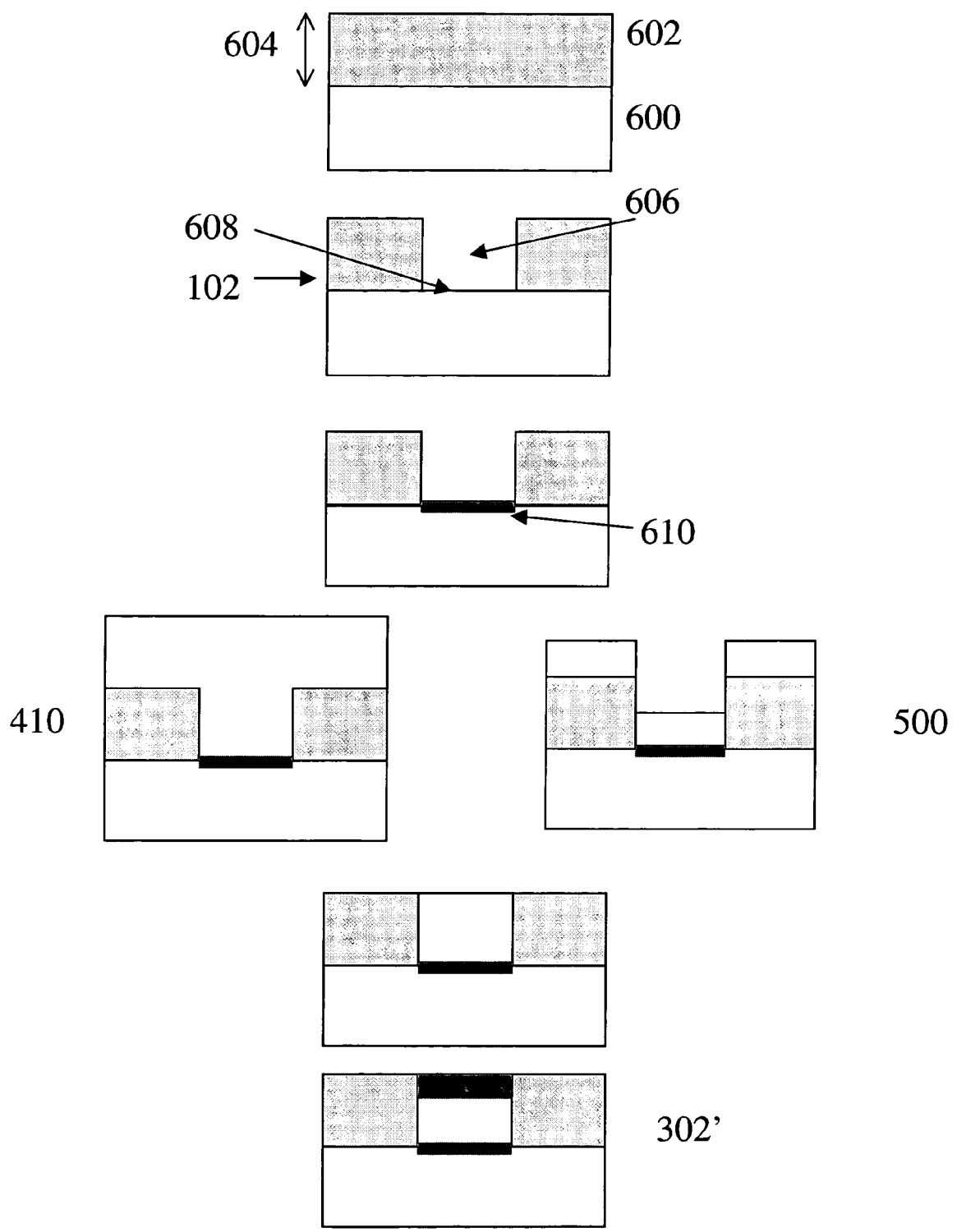

FIG. 6 shows another approach for forming an alternative first intermediate structure 302'. In this embodiment, a silicon substrate 600 is covered with a layer 602 of silicon nitride having a height 604 of at least 30 nm. The silicon nitride layer 602 is then patterned and etched to generate spacings 606 and to define supports 102. The etching process exposes a portion 608 of the surface of silicon substrate 600. The exposed silicon surface 608 is oxidized to generate a silicon dioxide ($SiO_2$) layer 610 having a thickness of a few nm. These layers 610 eventually insulate traces 104 analogously to the way insulating layer 109 did for the above-described structures 302. Once the insulating layers 610 have been created, the traces 104 may be created in any of a variety of manner. FIG. 6 illustrates the processing steps of FIGS. 4–5 used to create such traces to illustrate this point.

Figure 7:
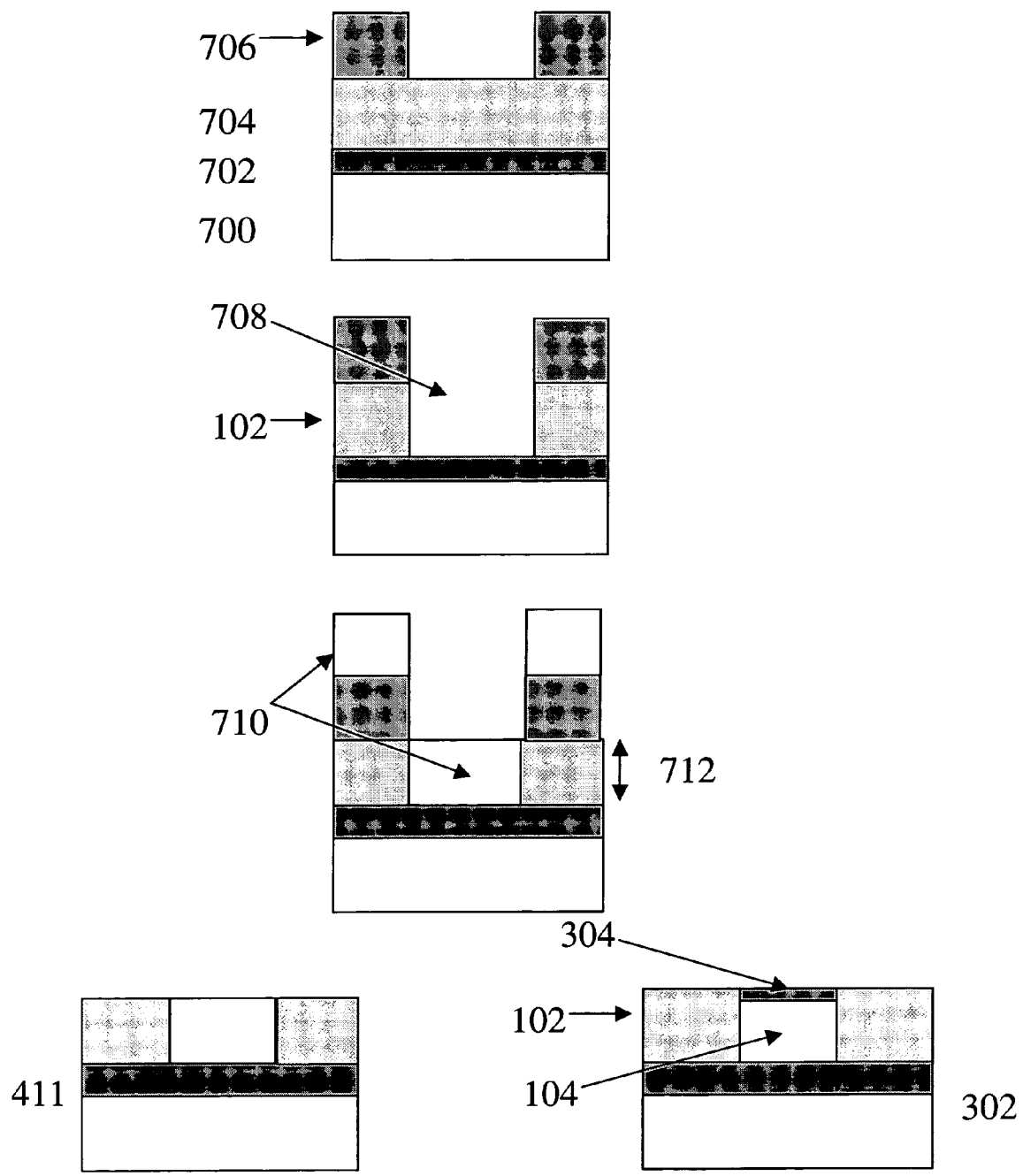

FIG. 7 shows another approach for forming first intermediate structure 302. A silicon substrate 700 having a silicon dioxide layer 702 and a silicon nitride layer 704 receives a patterned photoresist layer 706. For example, a photoresist layer may be spin-coated on layer 704 and subsequently exposed and lithographically developed. Reactive ion etching (RIE) or the like may then be used to etch the $Si_3N_4$ layer 704 to form cavities 708 and to define supports 102. Afterwards, a trace 710 may be deposited in the cavities 708. The trace may be n- or p-doped silicon or any appropriate conducting or semiconducting material. Under certain embodiments doped silicon is deposited to a height about equal to the height 712 of the $Si_3N_4$ supports 102. The photoresist 706 and trace 710 on top of the photoresist 706 are then stripped away to form intermediate structure 411 like that described above. Structure 411 is then oxidized to generate sacrificial $SiO_2$ layers 304.

Figure 8:
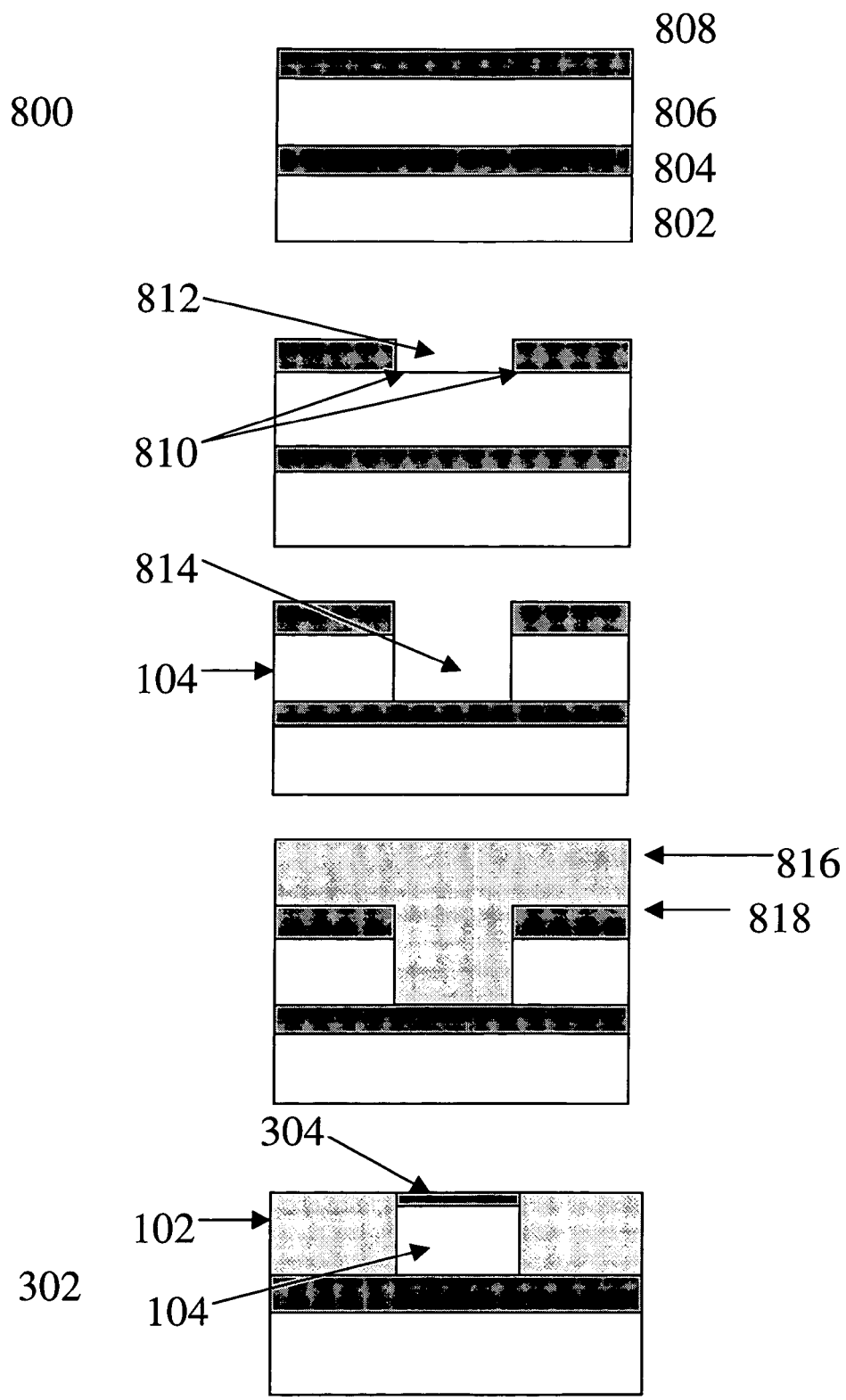

FIG. 8 shows another approach for forming first intermediate structure 302. Under this approach, a starting structure 800 is provided having a lowest silicon layer 802 with a lowest silicon dioxide layer 804 on top of it. A second silicon layer 806 is on top of layer 804 and a second silicon dioxide layer 808 is on top of the second silicon layer 806. Top silicon dioxide ($SiO_2$) layer 808 is patterned, e.g. by e-beam lithography to create an RIE mask 810. Photolithography may also be used to create the RIE mask 810. The mask is used to etch the exposed portions 812 of second silicon layer 806 down to the first silicon dioxide layer 804. This etching creates cavities 814 and defines traces 104. The cavities 814 are filled and covered with silicon nitride ($Si_3N_4$) 816. The $Si_3N_4$ covering 816 is back etched by RIE to the same height 818 as the remaining portions of the $SiO_2$ layer 806 covering the metallic or semiconducting silicon electrodes or traces 104 (which form the sacrificial layer 304).

Figure 9:
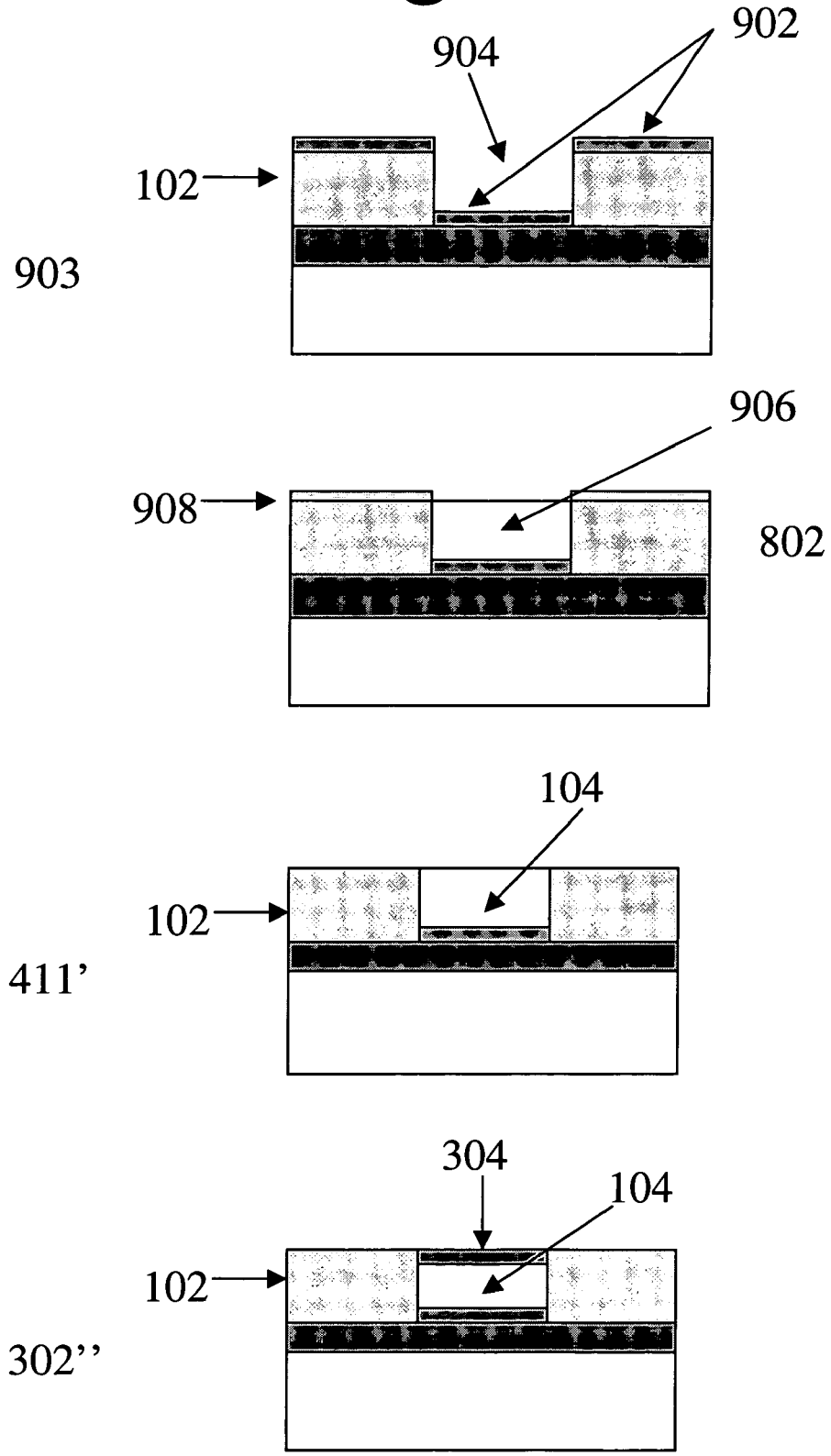

FIG. 9 shows an approach for forming an alternative first intermediate structure 302". Under this approach, a structure like 407 (shown in FIG. 4, but not FIG. 9) is provided. In this instance, the $Si_3N_4$ supports 102 have a height of about 30 nm. A thin layer of metal 902 is deposited on top of the $Si_3N_4$ supports 102 and on top of the exposed $SiO_2$ portions at the bottom of the cavities 904 as depicted by structure 903. Metal 902 and 903 form temporary electrodes. A layer of metallic or semiconducting silicon 906 may then be deposited (or grown by electroplating), covering the electrode 903 until the silicon 906 achieves a height 908 at the top of the support 102 and contacting electrode 902. The growth process may be controlled by the onset of a current flow between the lower and upper metal electrodes 902, 3. The exposed metal electrodes 902 may then be removed, e.g. by wet chemical methods or dry chemical methods. This forms an intermediate structure 411' like structure 411 described above, but with a buried electrode 903, as an artifact of the silicon growing process. Structure 411' is then oxidized to form sacrificial layers 304 at the exposed portions of silicon, as described above. For example, sacrificial layers 304 may be grown to a thickness of about 10 nm: Thus forming intermediate structure 302".

FIG. 10 shows another approach for forming first intermediate structure 302. A silicon substrate 1002 having a first silicon dioxide layer 1004 thereupon and a second silicon layer 1006 (metallic or semiconducting disposed on first silicon dioxide layer 1004. A mask layer 1008 is photolithographically patterned on top of layer 1006. Using nitridization techniques, exposed portions 1010 of metallic or semiconducting silicon layer 1006 are chemically converted to $Si_xN_3$ supports 102. The unconverted portions of layer 1006 form traces 104. The mask 1008 is removed, forming a structure 411 like that described above. The exposed, unconverted silicon portions 1012 are then oxidized to form the $SiO_2$ sacrificial layers 304.

FIG. 11 shows an approach for forming an alternative first intermediate structure 302'''. Under this approach a silicon substrate 1100 is layered with a thin film 1104 of $Si_3N_4$ as a starting structure. On top of the silicon nitride layer 1104, a trace is created, e.g. by depositing and patterning metallic contacts or semiconducting silicon. The patterning can be done by, e.g. RIE. The surfaces of traces 104 are oxidized to form the $SiO_2$ layer 1106 which acts as an alternative form of sacrificial layer 304', thereby forming intermediate structure 1107. Intermediate structure 1107 is overgrown with $Si_3N_4$ 1108 and back etched to form a planar surface 306 and to form alternative first intermediate structure 302'''. As will be evident to those skilled in the art, under this approach, when the sacrificial layer is subsequently removed, traces 104 will be separated from supports 102. Other variations of this technique may be employed to create alternative transverse cross-sections of trace 104. For example, the traces 104 may be created to have a rounded top, or to have a triangular or trapezoidal cross section. In addition, the cross section may have other forms, such as a triangle with tapered sides. As was explained above, once a first intermediate structure is formed, e.g., 302, a matted nanotube layer 312 is provided over the planar surface 306 of intermediate structure 302. In preferred embodiments, the non-woven fabric layer 312 is applied by spin coating a suspension of nanotubes as described in U.S. patent application Ser. Nos. 10/341,005, 10/341,055, 10/341,054 and 10/341,130, all incorporated by reference in their entireties. In other embodiments of the present invention, nanofabric layer 312 is grown over the structure through the use of a catalyst 308 and through the control of a growth environment. Other embodiments may provide the matted nanotube layer 312 separately and apply it directly over structure 302. Though structure 302 under this approach preferably includes the sacrificial layer to provide a planar surface to receive the independently grown or spun fabric, the sacrificial layer may not be necessary under such an approach.

Figure 12:
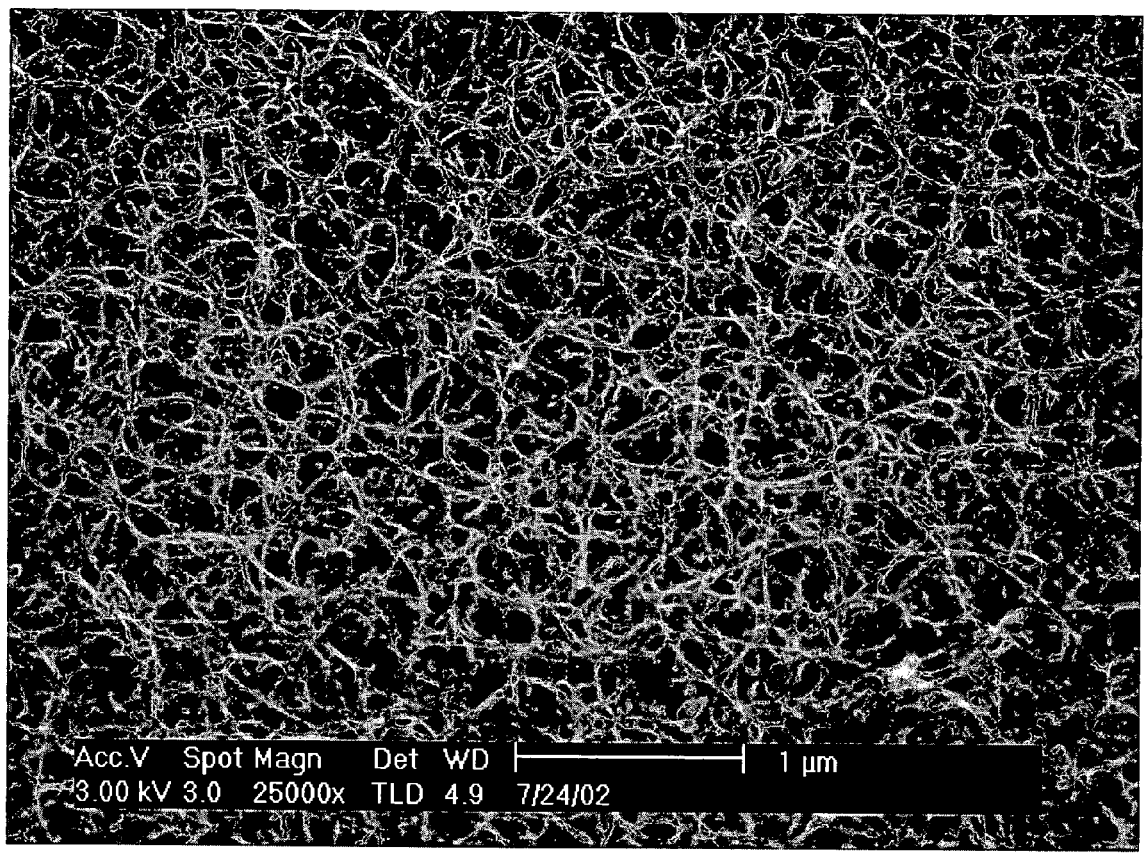
FIG. 12 illustrates the non-woven nanotube fabric, or matted nanotube layer, used to make certain embodiments of the invention.

Because the nanofabric application/creation processes cause the underside of such nanotubes to be in contact with planar surface 306 of intermediate structure 302, they exhibit a "self-assembly" trait as is suggested by FIG. 12. In particular, individual nanotubes tend to adhere to the surface on which they are applied or grown whenever energetically favorable, such that they form substantially as a "monolayer." Some nanotubes may grow over or become situated over another so the monolayer is not expected to be perfect. The individual nanotubes do not "weave" with one another but do adhere with one another as a consequence of van der Waals forces. FIG. 12 is a depiction of an actual nanotube non-woven fabric. Nanofabrics appropriate for use in the present invention may be more or less dense than that shown in FIG. 12. Because of the small feature sizes of nanotubes, even modern scanning electron microscopy cannot "photograph" an actual fabric without loss of precision; nanotubes have feature sizes as small as 1–2 nm which is below the precision of SEM. FIG. 12 for example, suggests the fabric's matted nature; not clear from the figure, however, is that the fabric may have small areas of discontinuity with no tubes present. Each tube typically has a diameter 1–2 nm (thus defining a fabric layer about 1–2 nm) but may have lengths of a few microns but may be as long as 200 microns. The tubes may curve and occasionally cross one another.

In certain embodiments, nanotubes grow substantially unrestrained in the x- and y-axis directions, but are substantially restricted in the z-axis (perpendicular to page of FIG. 12) as a consequence of the self-assembly trait. Other embodiments may supplement the above approach to growing matte 312 with the use of field-oriented or flow-oriented growth techniques. Such supplementation may be used to further tailor growth such that any growth in one planar axis (e.g. the -x-axis) is retarded. This allows for a more even coverage of the desired area with a planar interwoven monolayer coating of nanotubes with a controllable density.

Figure 13:
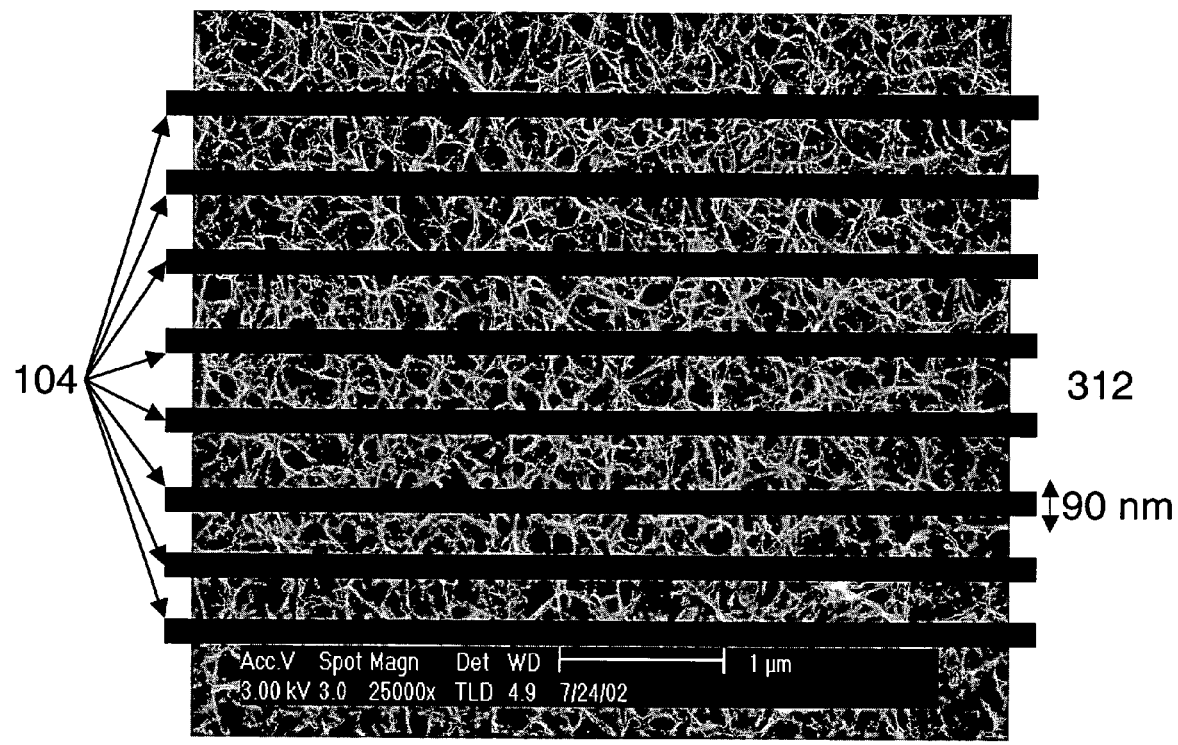
FIG. 13 illustrates the matted nanotube layer in relation to hidden, underlying traces of certain embodiments of the invention.

FIG. 13 is a plan view of the matted nanotube layer 312 with underlying traces 104.

As explained above, once the matted nanotube layer 312 is provided over the surface 306, the layer 312 is patterned and etched to define ribbons 101 of nanotube fabric that cross the supports 102. (See applications: U.S. Pat. Nos. 6,574,130, 6,643,165, 6,706,402; and U.S. patent application Ser. Nos. 09/915,093, 10/033,323, 10/033,032, 10/128, 117, 10/341,005, 10/341,055, 10/341,054, 10/341,130, 10/776,059, and 10/776,572 for patterning techniques.) The sacrificial layer is then removed (e.g., with acid) forming the array 322 described above in connection with FIG. 3. Because the matted layer of nanotubes 312 form a non-woven fabric that is not a contiguous film, etchants or other chemicals may diffuse between the individual nanotube "fibers" and more easily reach the underlying components, such as the sacrificial layer.

Subsequent metallization may be used to form addressing electrodes. Other embodiments use nanotube technology to implement addressing of memory cells instead of using metallized electrodes 112 and addressing lines (not shown).

More specifically, under certain embodiments described above, nanotubes are used to form NTRCM arrays. Certain embodiments use nanotube technology, whether in individual wire or belt form, to implement addressing logic to select the memory cell(s) for reading or writing operations. This approach furthers the integration of nanotube technology into system design and may provide beneficial functionality to higher-level system design. For example, under this approach the memory architecture will not only store memory contents in non-volatile manner but will inherently store the last memory address.

The nanotube-based memory cells have bistability characterized by a high ratio of resistance between "0" and "1" states. Switching between these states is accomplished by the application of specific voltages across the nanotube belt or wire and the underlying trace, in which at least one of the memory cell elements is a nanotube or a nanotube ribbon. In one approach, a "readout current" is applied and the voltage across this junction is determined with a "sense amplifier." Reads are non-destructive, meaning that the cell retains its state, and no write-back operations are needed as is done with DRAM.

Figure 14:
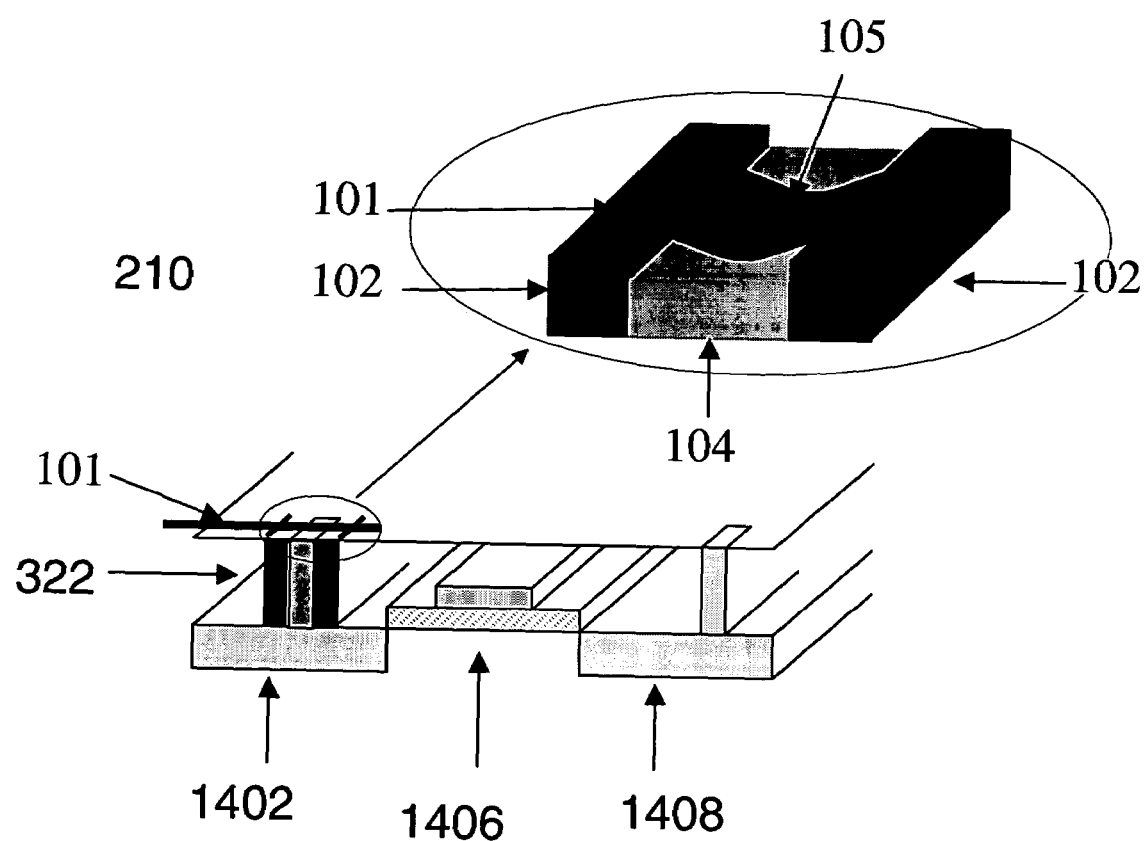
FIG. 14 is a three dimensional representation of a NPROM with a switch at the source.

FIG. 14 depicts one contemplated nanotube programmable read only memory (NPROM) configuration, structure 322 having an electromechanical CNT switch/FET interface. Specifically, it depicts an application of the invention whereby a CNT switch 105 is located at the source 1402.

Figure 15:
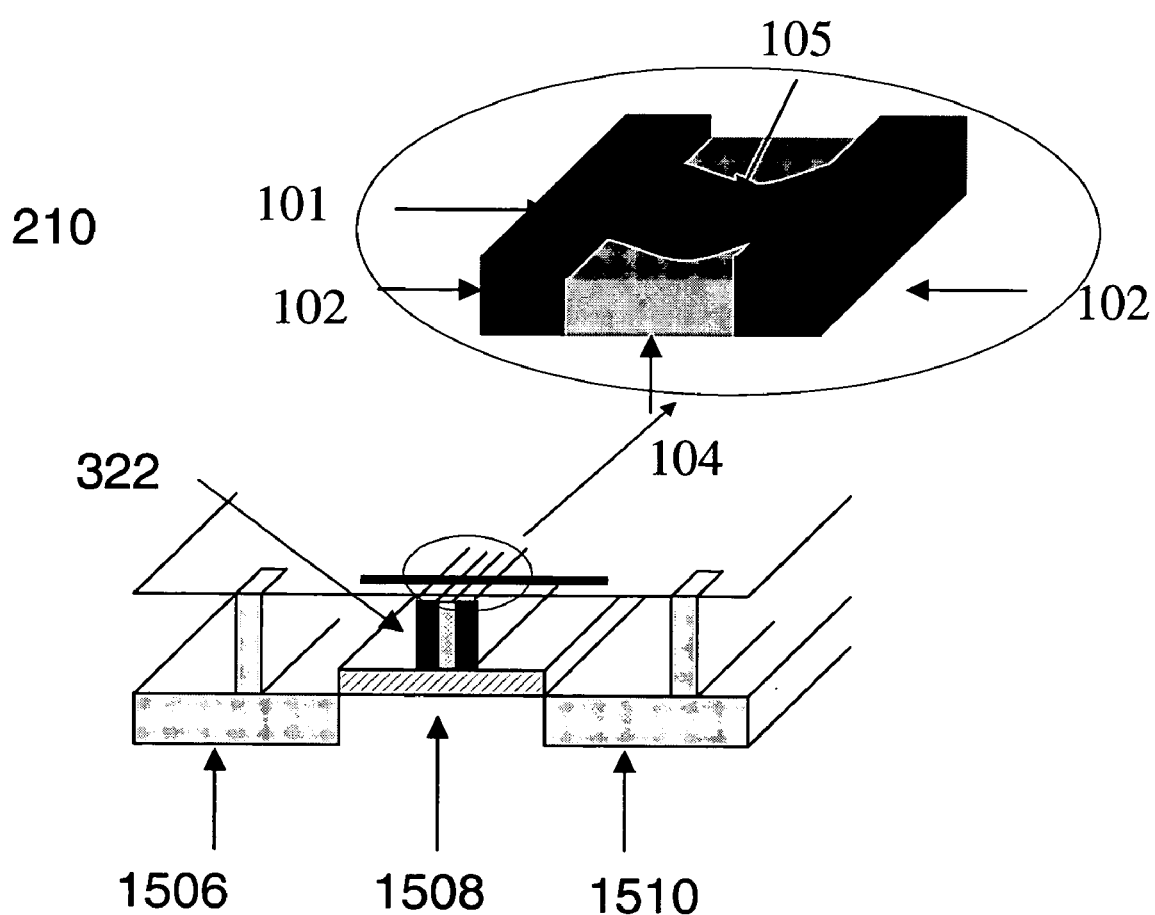
FIG. 15 is a three dimensional representation of a NPROM with a switch at the gate.

FIG. 15 depicts a three-dimensional rendering of a NPROM, structure 322. In this case, structure 322 is located at the gate 1508.

Figure 16:
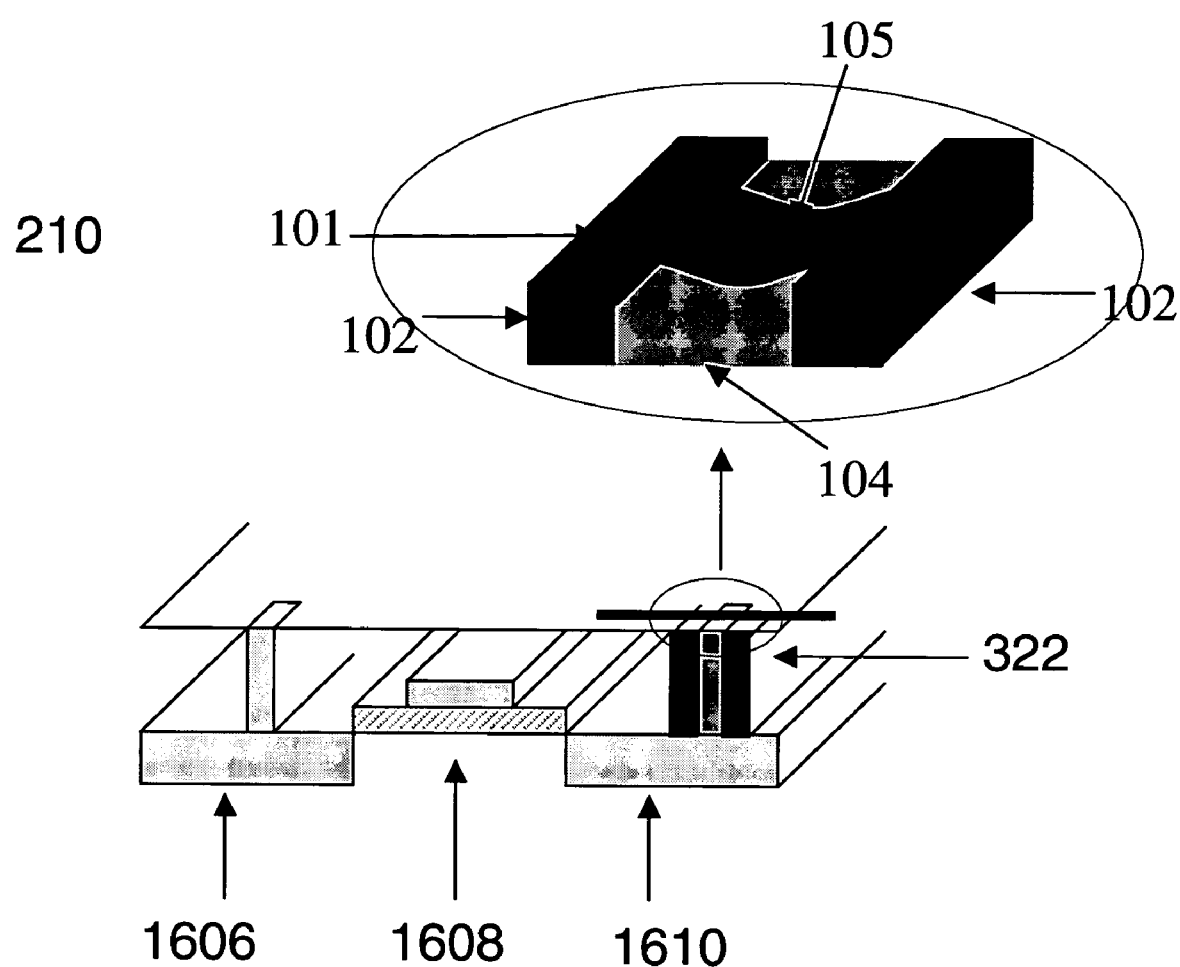
FIG. 16 is a three dimensional representation of a NPROM with a switch at the drain.

FIG. 16 depicts a three dimensional rendering of a NPROM, structure 322. In this case, structure 322 is located at the drain 1610.

FIGS. 2–16 illustrate carbon nanotube structures that may be combined with FET devices as illustrated in FIGS. 1A, 1B, and 1C. For the device illustrated in FIG. 1B, the electromechanical nanotube integration results in a nanotube transistor, or in this case, a nanotube PROM (NPROM). While the FETs used in these illustrations are NMOS, PMOS devices may also be used. In operation, if activated, these carbon nanotube structures will switch from an OFF state (or open position) as fabricated, to an activated switched ON state (or closed position). The OFF and ON states are non-volatile, and once activated to the ON state, the carbon nanotube remains in the ON state. Memory arrays may be formed using the elements illustrated schematically in FIGS. 1A, 1B, and 1C, and are referred to as one-time programmable (OTP) memory arrays using carbon nanotube ribbons or filaments integrated with FET devices. Memory products using these array structures are referred to as nanotube electromechanically programmable read only memories (NPROMs). Since each bit may only be programmed once, they are referred to as OTP NPROMs. The OFF state may be assigned the logical value of "1" or "0", and the ON state may be assigned the logical value of "0" or "1". Carbon nanotube programming requires exceeding the threshold voltage between the nanotube (an electrical conductor), and a reference electrode. Typical nanotube threshold voltages ($V_{NT\ TH}$) are in the range of 0.5 to 1.5 volts. Reading and programming voltages applied to the arrays are typically 1.8 volts or less, and memory arrays using nanotubes are scalable to less than 1 volt. These low-voltage, scalable nanotube devices enable the integration of these non-volatile nanotubes in industry standard, low voltage, single polysilicon CMOS semiconductor processes. "The International Technology Road Map for Semiconductors" (ITRS) 2002 Edition and 2002 updates, project product designs using a minimum (half-pitch) dimension of 130 nm and operating at an internal (core) voltage of 1.8 volts in 2002, a goal that has been achieved by the most advanced semiconductor manufacturers. The smallest OTP NPROM cell is 6 $F^2$, or 0.1 $um^2$ for present 130 um technology. The ITRS Road Map projects 100 nm semiconductor technologies operating at 1.2 volts in 2005. Corresponding OTP NPROM cell area is 0.06 $um^2$. These OTP NPROMs may be electrically programmed (written) at nanosecond rates in a single pass. The carbon nanotube switching speed is on the order of 1 ns, so the programming (write) time is therefore determined by delays in the array. Such array write (programming) delays may range in the 25 to 100 ns range, depending on memory array size. These electromechanical carbon nanotube switches are virtually insensitive to the adverse effects of radiation. In addition to stand-alone OTP NPROM memory products, the compatibility of carbon nanotube technology with the dense, low voltage, single poly CMOS logic technology, facilitates the embedding of fast read and fast OTP write, low voltage, non-volatile memory cores in logic chips, such as used in system-on-a-chip (SOC) applications.

The low voltage, scalable, fast read and programming (write), radiation insensitive, single polysilicon gate CMOS logic-compatible OTP NPROM technology compares favorably with traditional OTP EPROMs (for a description of OTP EPROMs, see Sharma, A. K., "Semiconductor Memories, Technology, Testing, and Reliability", IEEE Press, 1997, page 103) that require a dual polysilicon gate structure, high-voltage and high-current hot electron write-compatible semiconductor technology. Programming (write) time for hot electron transition to the floating gate to increase the threshold voltage ($V_{TH}$) of the dual gate structure is in the 10 microsecond to 1 millisecond range. The requirements of the optimized specialized dual poly OTP EPROM technology is not compatible with the requirements of the low voltage CMOS logic technology, and does not support optimized embedded macros or cores in system-on-a chip applications.

Figure 17:
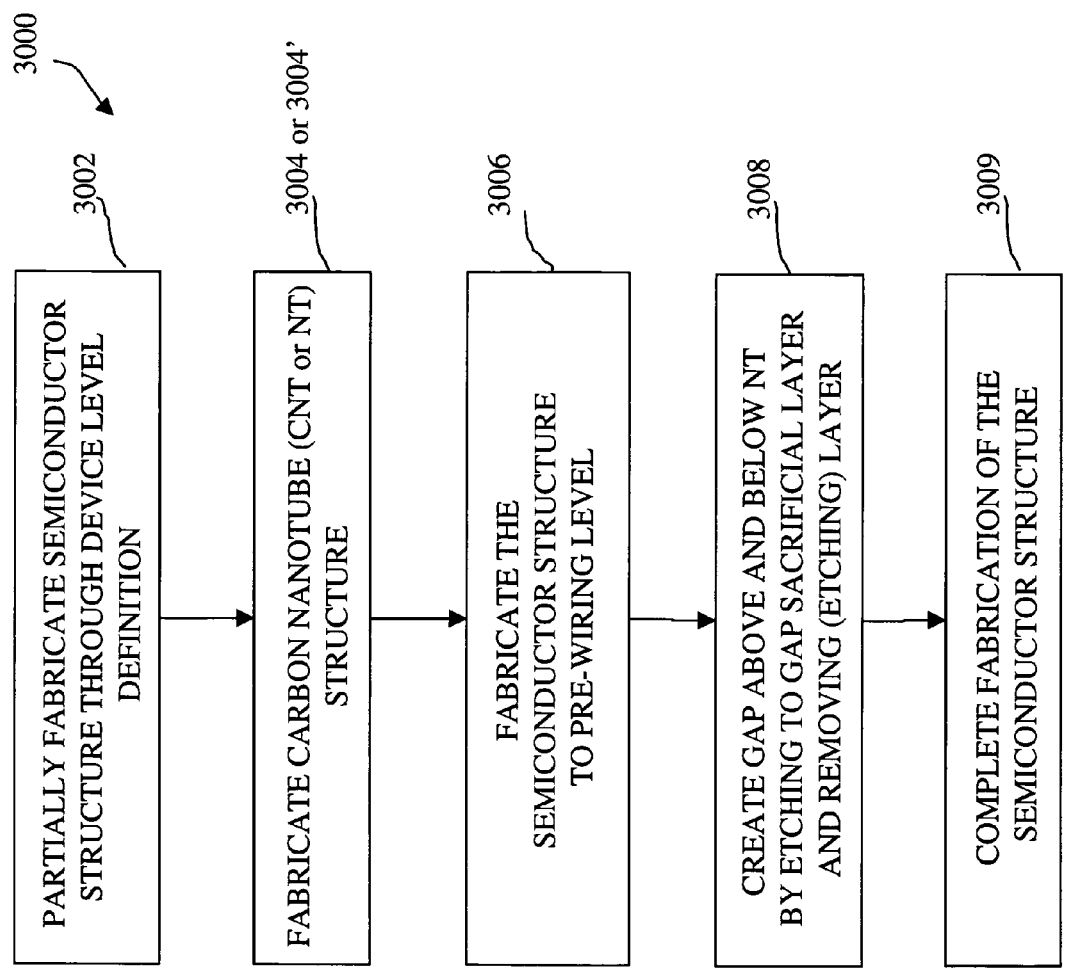
FIG. 17 is a flow chart of the steps in a process for integrating embodiment 1 or embodiment 2 nanotube structures in a semiconductor process.
Figure 18:
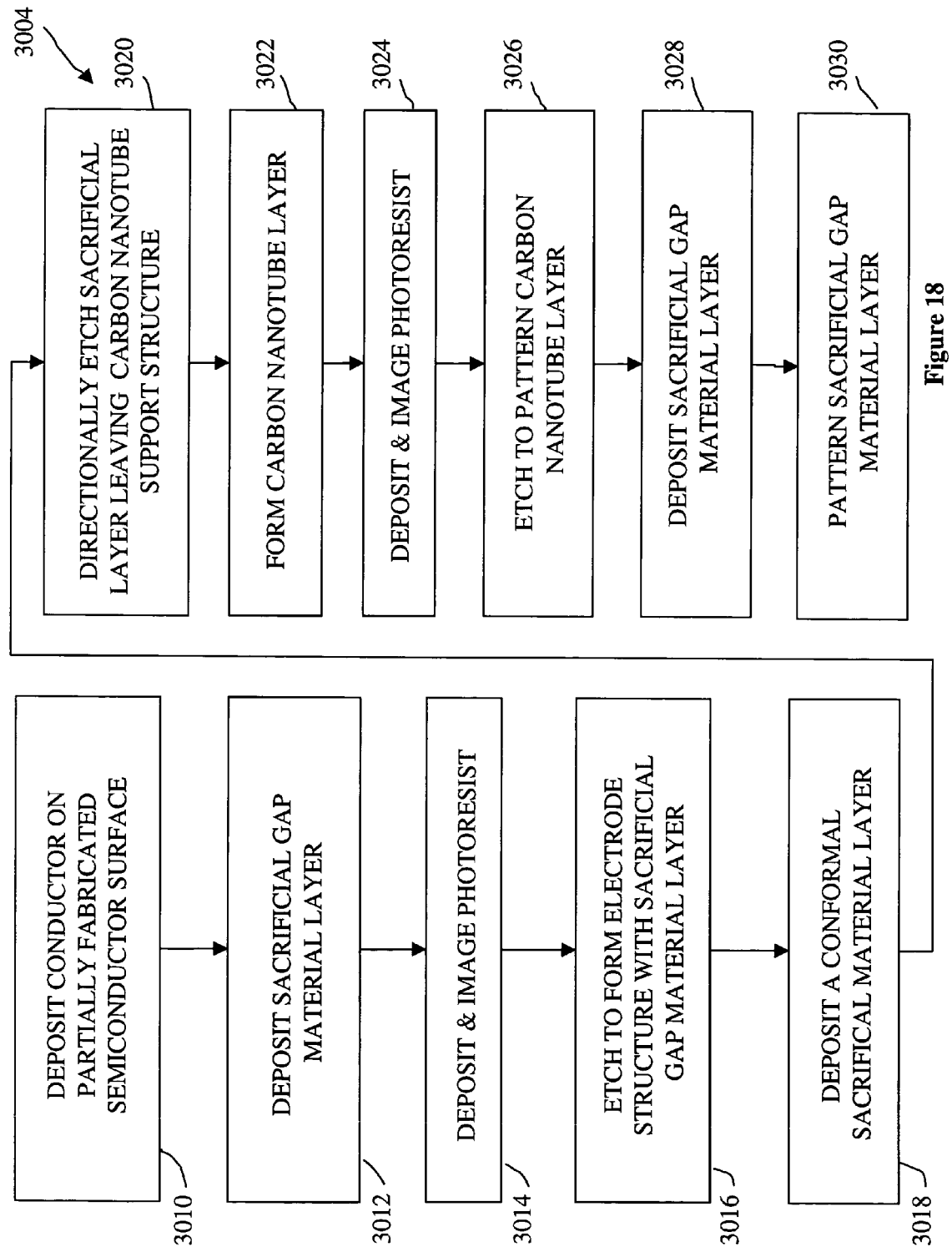
FIG. 18 is a flow chart of the steps in a process for fabricating an embodiment 1 nanotube structure on a partially processed semiconductor wafer.
Figure 18:
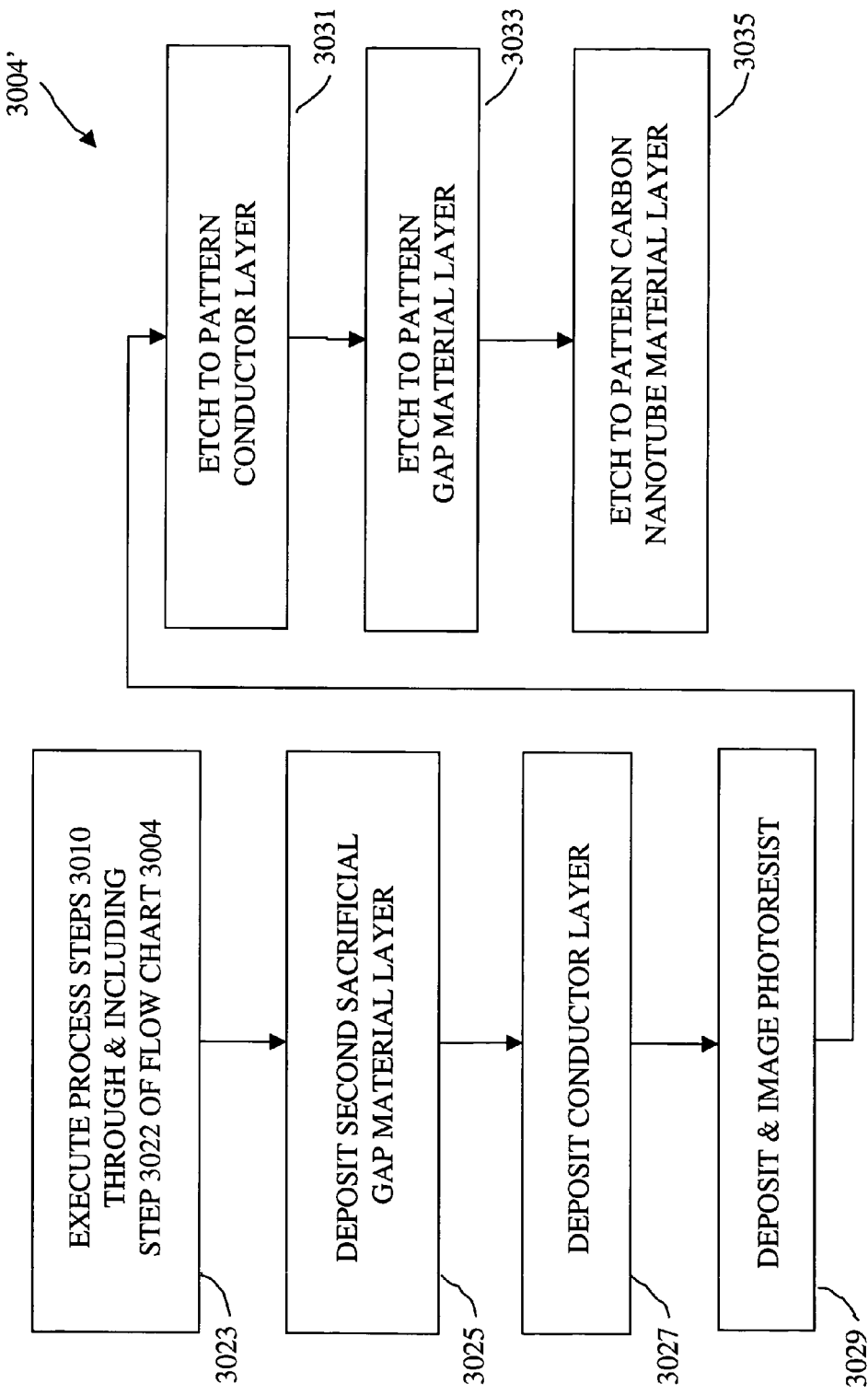
Figure 19:
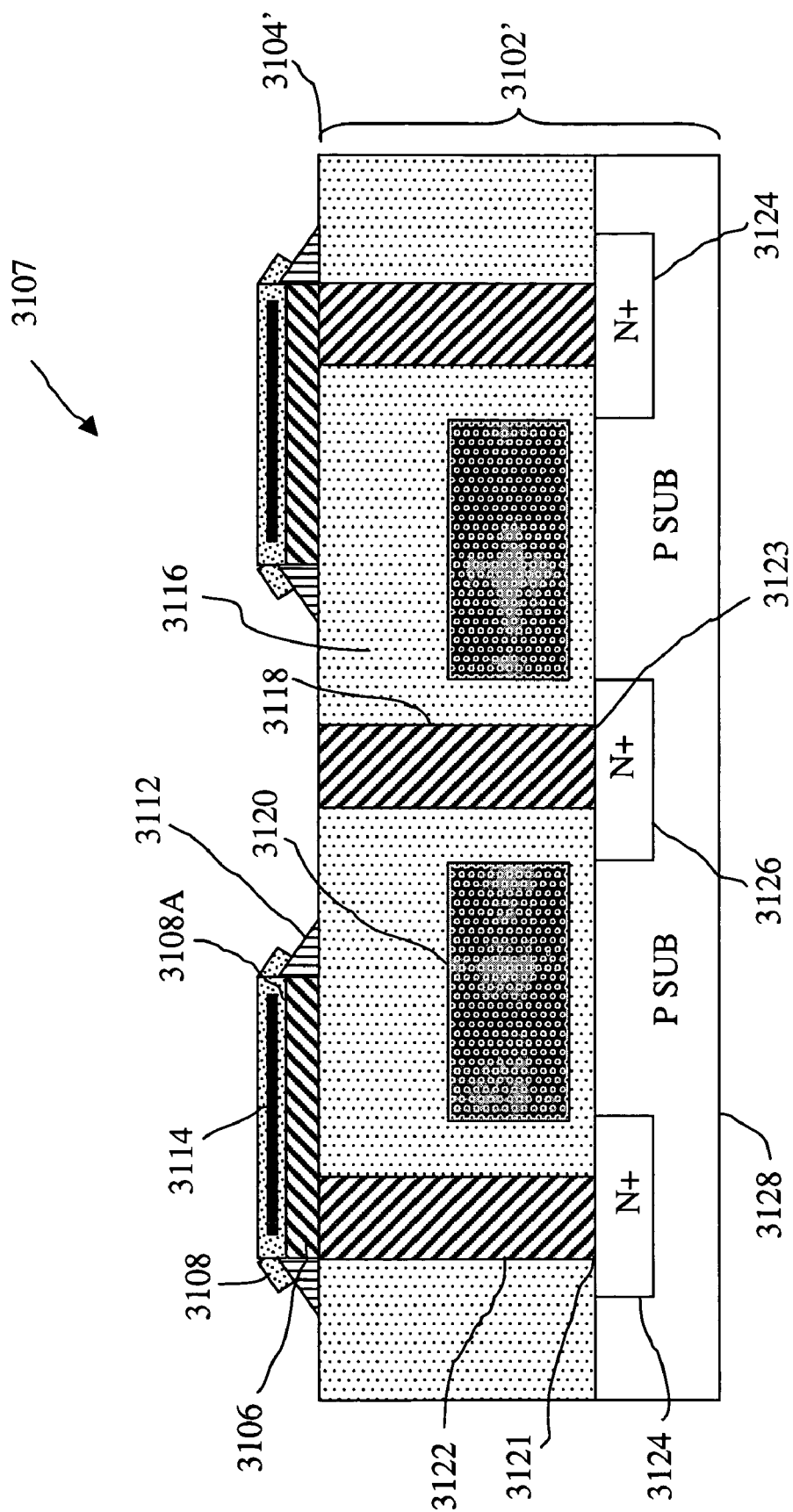
FIG. 19 illustrates a cross section of a partially processed semiconductor structure including an embodiment 1 nanotube structure fabricated on the top surface.
Figure 19:
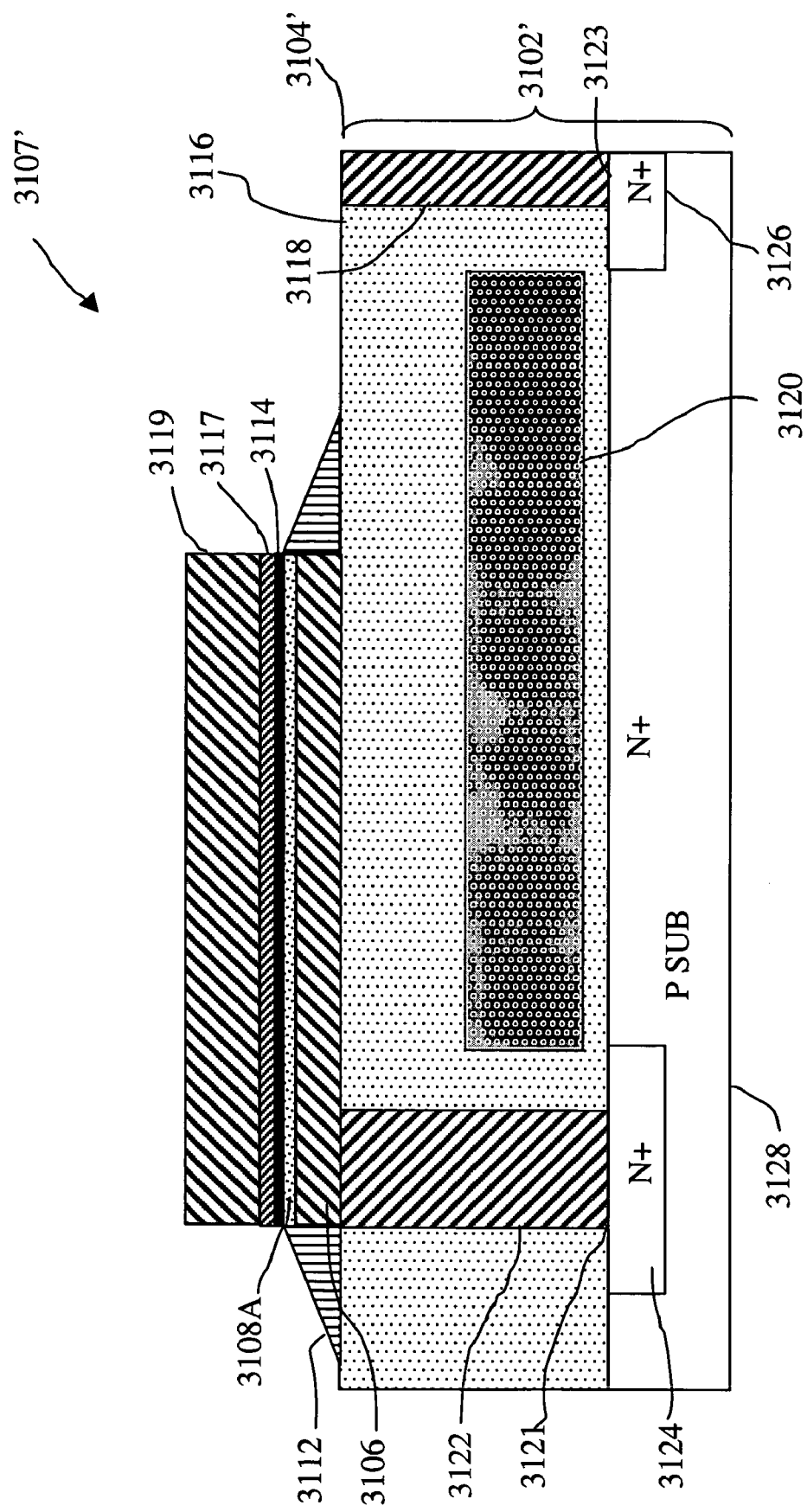

Fabrication Steps and Structures that Integrate Carbon Nanotube Electromechanical Structures with Low-Voltage Single-Polysilicon CMOS Technology FIGS. 17 and 18 illustrate steps for fabricating a first preferred embodiment of the invention; such steps are described in detail below. FIG. 19 and FIGS. 20A–F illustrate integrated carbon nanotube and CMOS semiconductor structures corresponding to FIGS. 17 and 18. FIG. 18' illustrates steps for fabricating a second preferred embodiment of the invention; such steps are described in detail below. FIG. 19' and FIGS. 20G–J illustrate integrated carbon nanotube and CMOS semiconductor structures corresponding to FIG. 18'. In general, a partially completed semiconductor structure is formed using known industry techniques, through at least the FET device definition level, so as to form a base layer on which to fabricate the carbon nanotube (CNT or NT) structure. The fabrication steps for the carbon nanotube structure are described. Known semiconductor processing continues until the pre-wiring level. In regard to the first preferred embodiment of the invention, reference is made to the flow charts of FIGS. 21 and 22 for showing fabrication steps, and the corresponding structures of FIGS. 23A–F, that illustrate gap formation in the NT device (switch) region of the integrated nanotube—semiconductor structure to enable operation of the NT switch. Insulation is then applied and planarized, via holes are etched as needed, and wiring is deposited and patterned as illustrated in FIGS. 23G, 23H 23H', 23I, 23I', 23J, 23K, and 23L. Semiconductor fabrication continues and ends with final passivation (not shown) using known industry techniques. In regard to the second preferred embodiment of the invention, reference is made to the flow chart of FIG. 21' that has been added for illustrating the fabrication steps, and the corresponding structures of FIGS. 23F', 23F", 23F"', and 23F"", that illustrate a second preferred method of gap formation in the NT device (switch) region of the integrated nanotube—semiconductor structure to enable operation of the NT switch. Insulation is then applied and planarized, via holes are etched as needed, and wiring is deposited and patterned as illustrated in FIGS. 23G', 23H", and 23I". Semiconductor fabrication continues and ends with final passivation (not shown) using known industry techniques.

The structures are consistent with the requirements of the ITRS Road Map for low voltage, high performance, and single polysilicon CMOS technology. The dimensions referred to herein are typical for current advanced semiconductor fabrication. However, the invention is not to be construed to be limited to only devices and structures fabricated with these dimensions, as it is expected that device and structure dimensions will be further reduced by advances in processing technology. The expected improvements in semiconductor technology capability are documented in the ITRS Road Map.

The nanotube integration with semiconductor technology is described in terms of bulk silicon technology, including CMOS, BiCMOS or bipolar technologies. However, nanotube integration is also compatible with silicon-on-insulator (SOI) technology, and strained silicon combined with bulk or SOI silicon technology. Nanotube structures also scale with geometry and voltage and are compatible with more advance transistor structures such as non-planar double and triple gate transistors (See Geppert, L., "The Amazing Vanishing Transistor Act", IEEE Spectrum, October 2002, pages 28 to 33; "Triple Gate Double Play", IEEE Spectrum, November 2002, page 18) implemented with or without strained silicon. Nanotubes may also be integrated with non-silicon, or mixed silicon and non-silicon semiconductor technologies. Some examples of these are SiGe, or SiC technology; GaAs technology and GaAs-on-Silicon technology; GaAlAs technology and GaAlAs-on-Silicon technology; InP technology and InP-on-Silicon technology; or InGaAs technology and InGaAs-on-Silicon technology, and still others such as combined Si, Ge, GaAs, GaAlAs, HgTe, InP technology. These structures of the present invention are also compatible with any suitable Group III/Group V or Group II/Group VI semiconductor technology, or combinations of such technologies.

FIG. 17 is a flow chart of the process for integrating embodiment 1 or embodiment 2 nanotube structures;

The first step according to FIG. 17: A semiconductor structure is partially fabricated through at least device-level definition using industry standard processes and techniques (step 3002 of flow chart 3000).

The semiconductor industry standard fabrication is the same for nanotube embodiment 1 and nanotube embodiment 2. FIG. 19 illustrates a cross section of intermediate structure 3107 of the semiconductor structure after completion of step 3002, including nanotube embodiment 1 formed after completion of the standard semiconductor fabrication steps. The cross section of the semiconductor cell region of intermediate structure 3107 consists of NMOS FET devices with N+ drain regions 3126, and N+ doped source regions 3124 in p-type monocrystalline silicon substrate 3128. NMOS FET polysilicon gates 3120 control the FET channel region fabricated in the conventional manner. Shared conductive stud 3118 contacts drain 3126 in contact region 3123. Contact studs 3122, one for each nanotube structure, physically and electrically connect NT electrode 3106 to FET source 3124 at contacting region 3121. The NT structure rests on (is supported by) the planar oxide region 3116. The NT structure consists of electrode 3106, the nanotube fabric layer (filament or ribbon) 3114 in contact with supports 3112 (contact region is not visible in this cross sectional view), a sacrificial layer 3108 above and below NT ribbon in the NT device or switch region. Film thicknesses are in the range of 100 to 200 nm, typical of 130 nm minimum dimension (half-period) semiconductor technology. nanotube fabric layer 3114 film thickness is on the order of 1–5 nm, nanotube fabric layer 3114 minimum dimension is typically 130 nm, nanotube fabric layer 3114 length in the NT device region (suspended length after removal of sacrificial layer 3108) is on the order of 100 to 150 nm, and the thickness of lower portion of sacrificial layer 3108A situated between nanotube fabric layer 3114 and electrode 3106 is typically in the range of 5 to 15 nm. The NMOS FET channel length can be on the order of 100 to 130 nm as defined by polysilicon gate 3120 and diffusions 3124 and 3126. The cross section incorporating all semiconductor structures between the bottom layer of p-substrate 3128 and the top layer of insulator 3116 forms the base 3102' upon which the NT structure is fabricated. Base layer 3102' having planar top surface 3104'.

FIG. 19' illustrates a cross section of intermediate structure 3107'. Intermediate structure 3107' is a semiconductor structure after completion of step 3002 including nanotube embodiment 2 formed after completion of the standard semiconductor fabrication steps. Intermediate structure 3107' shows a semiconductor cell region consisting of NMOS FET devices with N+ drain regions 3126, and N+ doped source regions 3124 in p-type monocrystalline silicon substrate 3128. NMOS FET polysilicon gates 3120 control the FET channel region which can be fabricated in a conventional manner. Shared conductive stud 3118 contacts drain 3126 in contact region 3123. Contact studs 3122, one for each nanotube structure, physically and electrically connect NT electrode 3106 to FET source 3124 at contact region 3121. The NT structure rests on (is supported by) the planar oxide region 3116. The NT structure consists of electrode 3106, the nanotube fabric layer (filament or ribbon) 3114 in contact with supports 3112 (contact region is not visible in this cross sectional view), a sacrificial layer 3108A between NT ribbon and switch electrode 3106, a second sacrificial layer 3117; in the case of intermediate structure 3107', sacrificial layer 3117 is a thin conductive layer, in some embodiments of the present invention, sacrificial layer may be constructed of insulator and in other embodiments, semiconductor. The material from which sacrificial layer 3117 is chosen depends up on the physical characteristics of the final product. Sacrificial layer 3117 is disposed between nanotube fabric layer 3114 and conductor 3119. Combined electrical conductors 3117 and 3119 form a low resistance local and a low resistance interconnect NT structure. Film thicknesses are in the range of 100 to 200 nm, typical of 130 nm minimum dimension (half-period) semiconductor technology. Nanotube fabric layer 3114 film thickness is on the order of 1–5 nm, nanotube fabric layer 3114 minimum dimension is typically 130 nm. Nanotube fabric layer 3114 length in the NT device (switch) region (suspended length after removal of portions of the sacrificial layers) formed later in the process, and is on the order of 25 to 75 nm (sub-minimum lithographic dimensions), and the thickness of the portion of sacrificial layer 3108A between nanotube fabric layer 3114 and electrode 3106 is typically in the range of 5 to 15 nm. The NMOS FET channel length is on the order of 100 to 130 nm as defined by polysilicon gate 3120 and diffusions 3124 and 3126. The cross section incorporating all semiconductor structures between the bottom layer of p-substrate 3128 and the top layer of insulator 3116 forms the base 3102' upon which the NT structure is fabricated. Base layer 3102' having planar top surface 3104'. The second step according to FIG. 17 depends upon the desired composition of the final product. If a carbon nanotube structure (nanotube embodiment 1) is desired then the next step is 3004 (fabricate the carbon nanotube structure) if another nanotube structure (i.e. nanotube embodiment 2) is desired, then use step 3004' (fabricate nanotube structure). The substeps of step 3004, (fabricate the carbon nanotube structure) are more fully described in the flow chart of FIG. 18. The substeps of step 3004', (fabricate the nanotube structure) are more fully described in the flow chart of FIG. 18'.

Figure 23A:
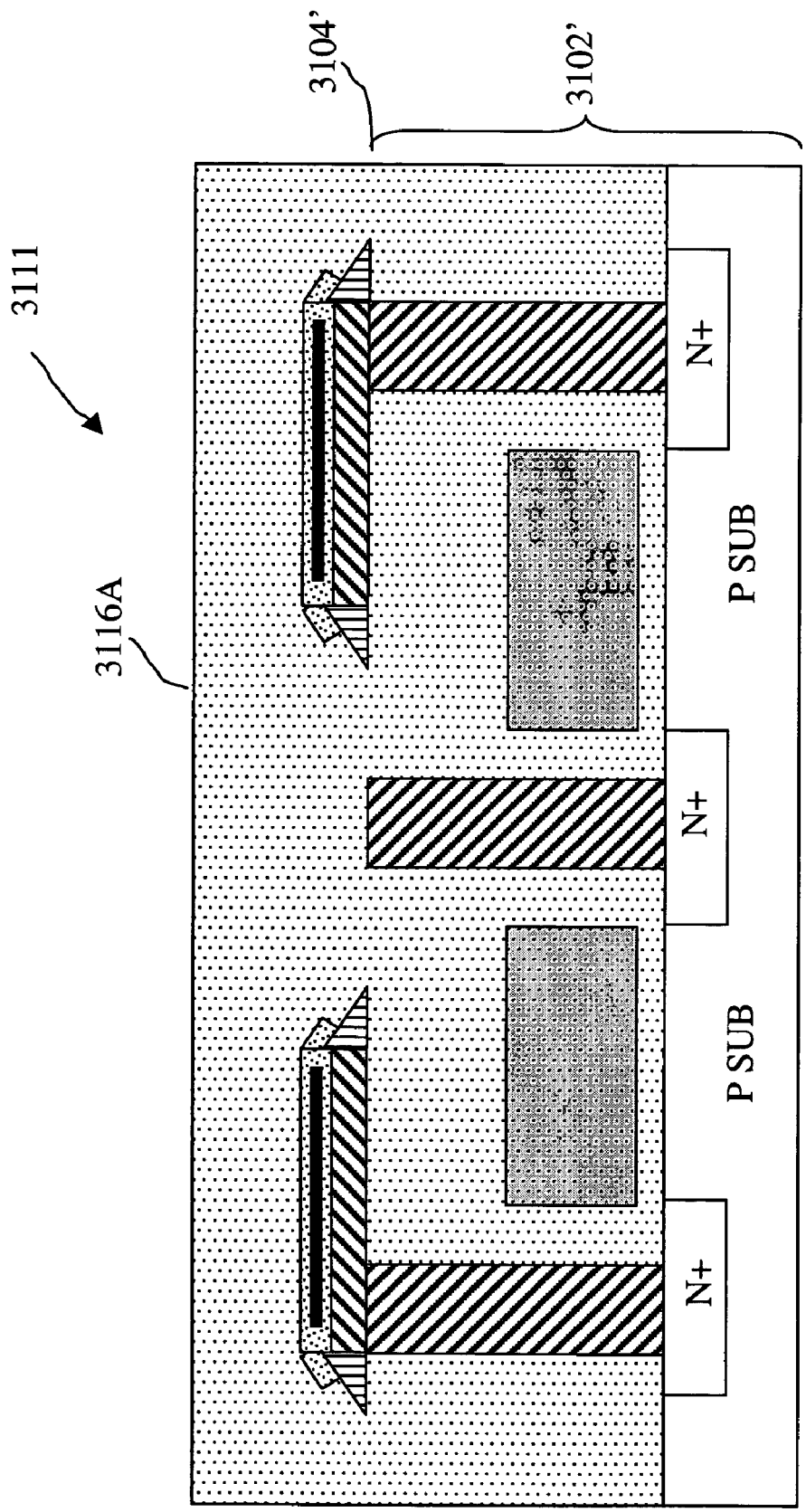
FIG. 23A illustrates the cross section of FIG. 19 after additional processing. The embodiment 1 nanotube structure is used by way of example, however, embodiment 2 nanotube structure may be substituted.

The next step according to FIG. 17 is step 3006; fabricate the semiconductor structure to the pre-wiring level. Fabrication is continued using conventional semiconductor processing techniques to a pre-wiring level. The integrated carbon nanotube structure—semiconductor structure 3111', after completion of Step 3006, is illustrated in FIG. 23A. FIG. 23A shows structure 3111 much like structure 3107 in FIG. 19 which has been processed to include encapsulation over the nanotube structures in an insulator, structure 3111 having top surface 3116A.

Figure 21:
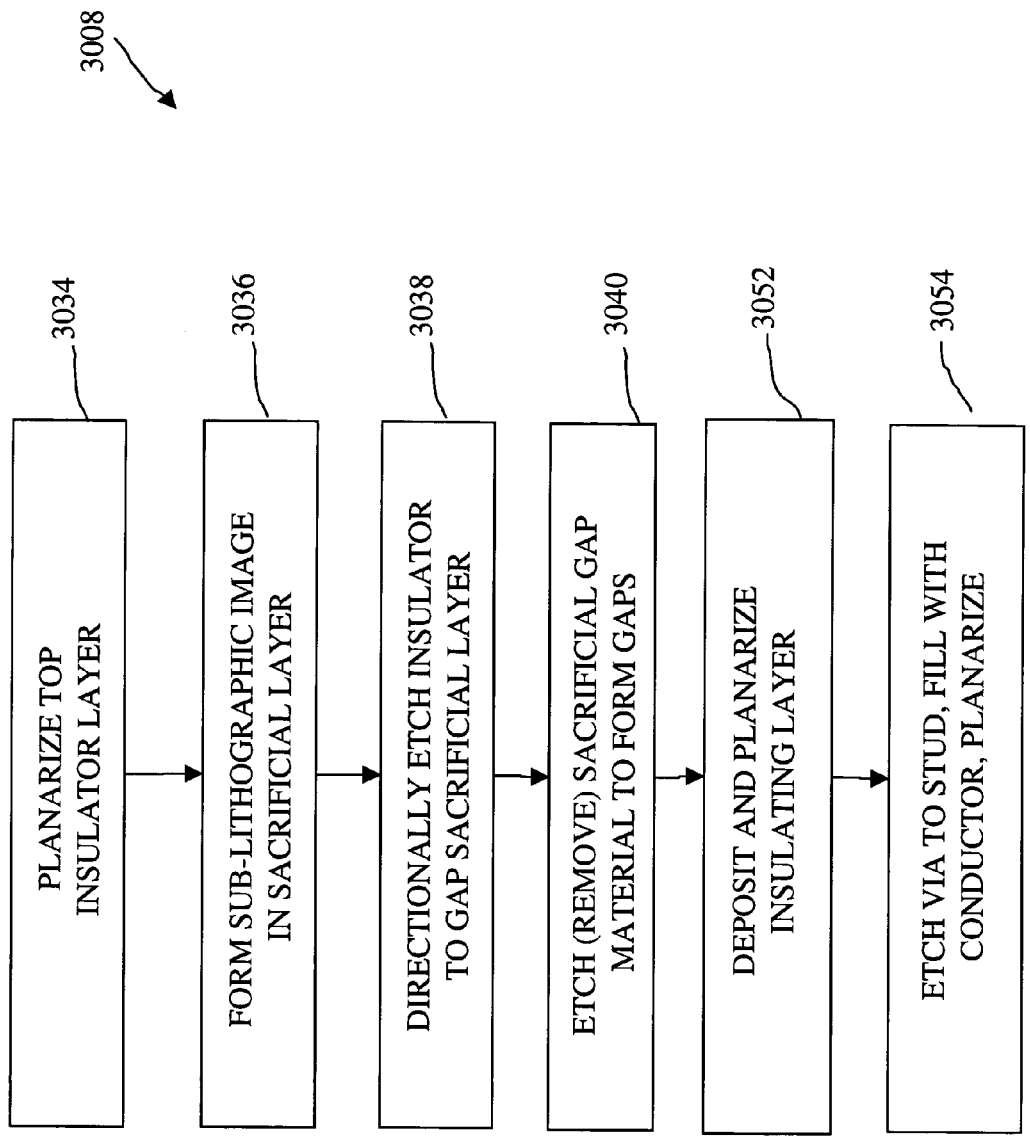
FIG. 21 is a flow chart of the steps in a process for removing the sacrificial insulator layers surrounding the embodiment 1 nanotube structure.
Figure 21:
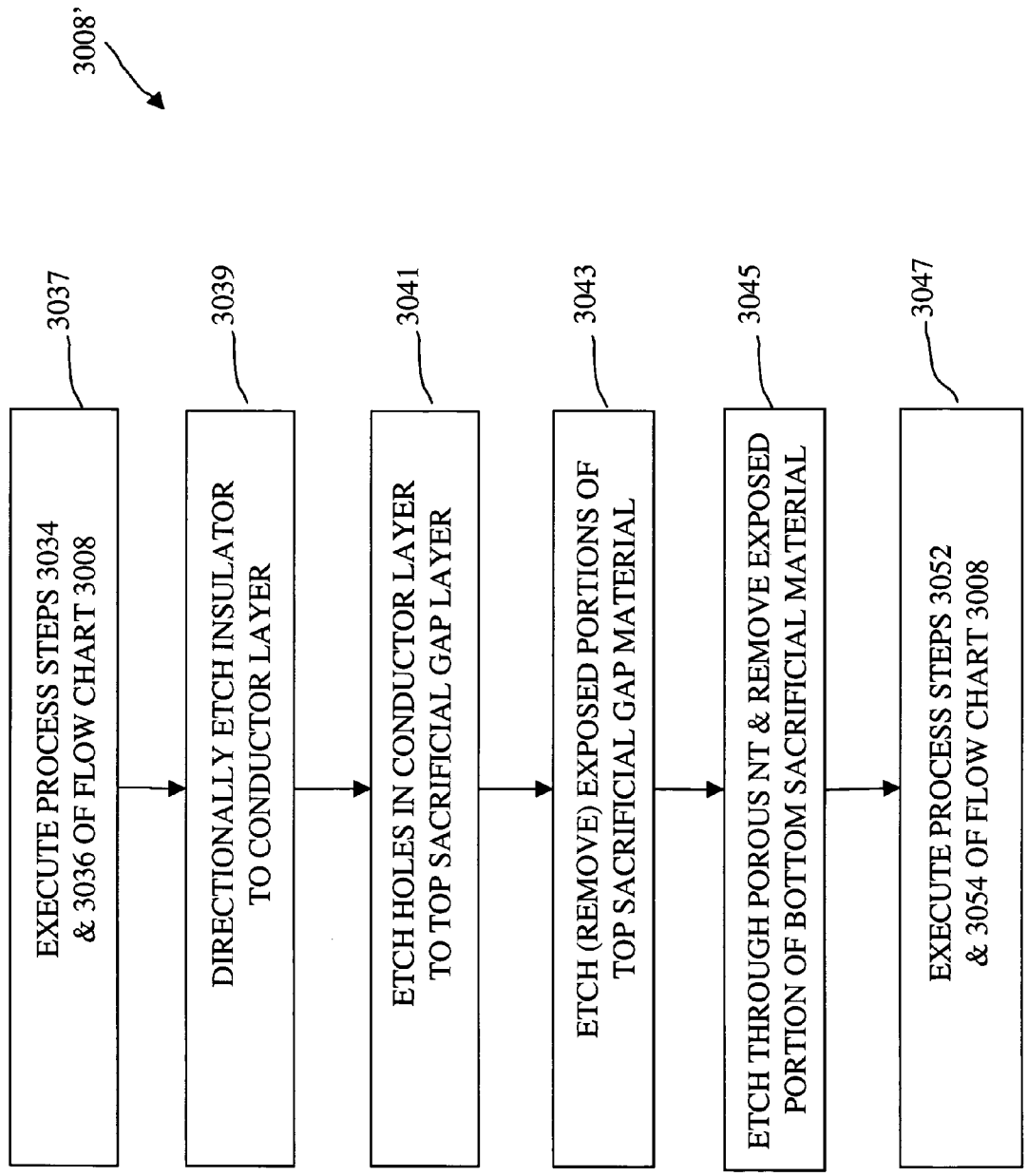

The next step according to FIG. 17 is step 3008 if step 3004 was chosen above: alternatively, if step 3004' was chosen above, then the next step is step 3008', create the gap region above and below the (carbon) nanotube by etching to gap sacrificial layer and removing the sacrificial layer in the NT switch region. The substeps of step 3008 and 3008' are more fully described in flow chart form as illustrated in FIG. 21 and FIG. 21' respectively and are described below.

The last step according to FIG. 17 is step 3009; complete fabrication of the semiconductor structure to the external contact and passivation layers (not shown).

FIG. 18 illustrates the substeps of step 3004 in flow chart form; the chart describes steps used to fabricate nanotube structure 3105, nanotube embodiment 1, on surface layer 3104, as illustrated in FIGS. 20A–F, where 3005A, 3005B, and 3005C are different views of nanotube structure 3105.

Surface 3104 is the top surface of base 3102 that may contain a variety of structures with a variety of top surface layers. For example, the top surface layer 3104 may be a conductor, semiconductor, or insulating layer, or a combination of all three. (For example, intermediate structure 3107, shown in cross section in FIG. 19 contains a particular combination of materials and layers, with base region 3102' corresponding to 3102, and top surface 3204' corresponding to 3204.)

Figure 20A:
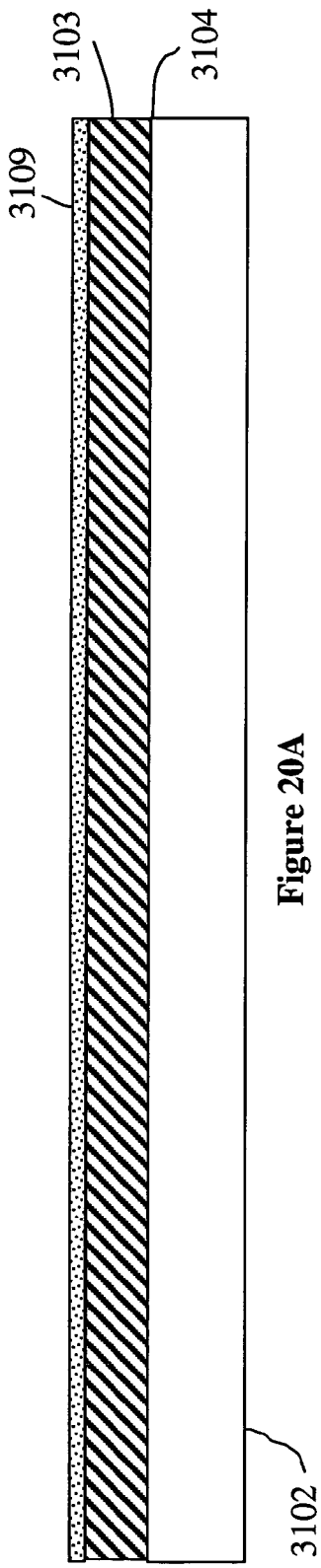
FIG. 20A illustrates a cross section of a conductor layer and a sacrificial insulator layer deposited as the first steps in fabricating a nanotube structure on a base layer.

The first substep of step 3004 according to FIG. 18 is substep 3010; deposit conductor on partially fabricated semiconductor surface . . . . This first step describes the deposition of conductor layer 3103 on surface 3104, as shown in FIG. 20A. By way of example, conductor layer 3103 may be tungsten, aluminum, copper, gold, nickel, chrome, polysilicon, or combinations of conductors such as chrome-copper-gold. Conductor thickness may be in the range of 50 to 150 nm.

The next substep of FIG. 18 is substep 3012; deposit sacrificial gap material layer. A sacrificial layer 3109 of gap material such as $Si_3N_4$, for example, is deposited on conductor layer 3103 as illustrated in FIG. 20A. The sacrificial layer thickness controls the separation (or gap) between the nanotube fabric and conductor layer 3103 in the nanotube switch region. In a preferred embodiment, this separation or gap dimension is approximately 1/10 of the suspended length of the electromechanical nanotube. For a nanotube switch design with suspended length of 130 nm, the gap is therefore chosen as 13 nm. Sacrificial layer 3109 is deposited to a thickness of 13 nm. FIG. 20A illustrates the partially processed nanotube structure after completion of step 3012.

The next substep according to FIG. 18 is sub-step 3014; deposit and image photoresist. Such patterning can be done using known techniques.

The next step according to FIG. 18 is substep 3016; etch to form electrode structure with sacrificial gap material layer. Sacrificial layer 3109 is etched. The photoresist layer (not shown) is removed. Etched sacrificial layer 3109 is used as the mask layer for etching conductor layer 3103. Alternatively, the photoresist layer is used to etch both sacrificial layer 3109 and conductor layer 3103, and then the photoresist is removed (not shown). The etched structure forms the NT switch region control electrode 3106 and gap layer 3108A illustrated in FIG. 20B.

Figure 20B:
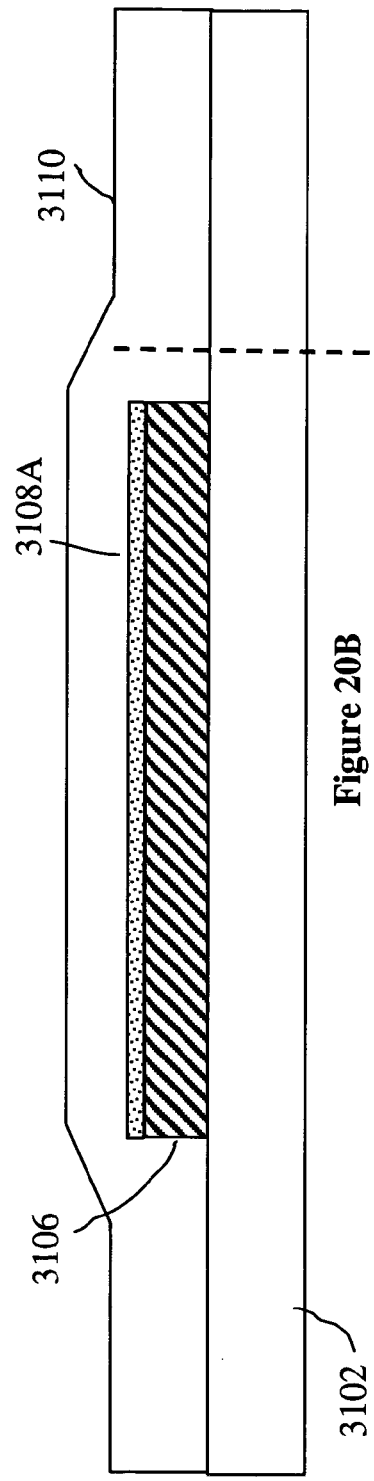
FIG. 20B illustrates a cross section of a patterned electrode, a sacrificial insulator, and a conformal sacrificial film.

The next step according to FIG. 18 is substep 3018; deposit conformal sacrificial material layer. Conformal sacrificial layer 3110 is deposited over the combined control electrode 3106 and gap layer 3108A structure. Conformal layer 3110 may be formed using a variety of insulating materials such as $SiO_2$, $Si_3N_4$, $Al_2O_3$, and polyimide, or conducting materials such as aluminum, copper, nickel, chromium, and tungsten, for example. In this implementation, $SiO_2$ is selected. The $SiO_2$ may be conformably deposited as spin-on-glass, or using Low Pressure Chemical Vapor Deposition (LPCVD), or by other conformal deposition techniques. The thickness of the deposited $SiO_2$ layer depends on the thickness of the combined control electrode 3106 and sacrificial layer 3108A, and may range from 70 nm to 175 nm, for example. The structure after completion of substep 3018 is illustrated in FIG. 20B.

Figure 20C:
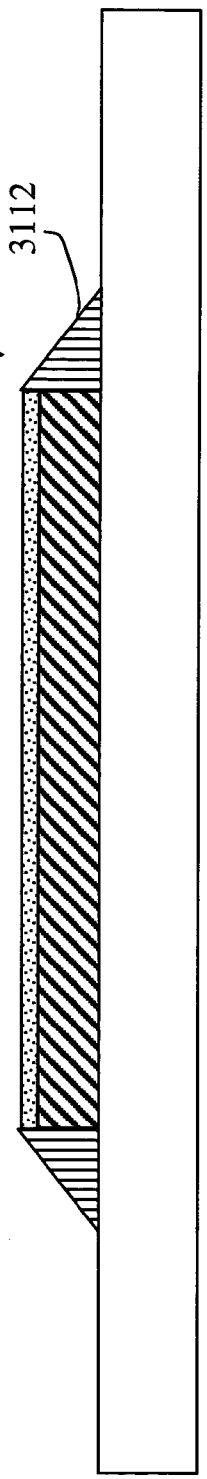
FIG. 20C illustrates a cross section of a patterned electrode, a sacrificial insulator, and angled NT supports.

The next step according to FIG. 18 is substep 3020; directionally etch sacrificial layer leaving carbon nanotube support structure. Conformal layer 3110 is directionally etched using sputter etching, reactive ion beam (RIT) etching, or other techniques. The directional etching of layer 3110 results in the formation of nanotube support regions 3112, prior to the deposition of the nanotube layer, as illustrated in FIG. 20C.

The next step according to FIG. 18 is substep 3022; form the carbon nanotube layer by spin-on technique or other appropriate technique as described in incorporated references: U.S. Pat. Nos. 6,574,130, 6,643,165, 6,706,402; and U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties. The carbon nanotube layer has a thickness of approximately 1–5 nm for devices using single-walled nanotubes and 5–20 nm and greater for devices using multiwalled nanotubes.

The next step according to FIG. 18 is substep 3024; deposit and form an image in photoresist using conventional processes.

The next step according to FIG. 18 is substep 3026; pattern the carbon nanotube fabric layer 3114 by etching using appropriate techniques as described in the previous patent applications of Nantero, Inc.: U.S. Pat. Nos. 6,574,130, 6,643,165, 6,706,402; and U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties.

The next step according to FIG. 18 is substep 3028; deposit the sacrificial gap material layer over the carbon nanotube. One example is a layer of $Si_3N_4$, of thickness 5–50 nm depending upon the performance specifications required for the nanotube device.

The next step according to FIG. 18 is substep 3030; pattern the sacrificial gap material layer 3108B using standard wet or dry etching conditions which is dependent upon the type of sacrificial gap material chosen, (as shown in FIG. 20F), thus completing carbon nanotube fabrication step 3004.

Illustrations of the completed carbon nanotube structures for embodiment 1 are shown in FIGS. 20D–F. FIG. 20D shows plan view of intermediate structure 3105, FIG. 20E shows a cross section of intermediate structure 3105 taken at A–A' as shown in FIG. 20D, and FIG. 20F shows a cross section of intermediate structure 3105 taken along the line of B–B' as shown in FIG. 20D. The elements in FIGS. 20A–F correspond to elements of FIG. 3. For example, base 3102 corresponds to a combination of layers 110 and 109; planar surface 3104 corresponds to planar surface 316. Also, electrode 3106 corresponds to conductive trace 104, support 3112 corresponds to support structure 108, and the portion 3108A of sacrificial layer 3108 corresponds to sacrificial layer 304.

FIG. 18' illustrates step 3004' which describes substeps used to fabricate nanotube structure 3105', nanotube embodiment 2, on surface 3104, illustrated in FIGS. 20A–C, and FIGS. 20G–J.

The first substep of step 3004' according to FIG. 18' is substep 3023; execute steps 3010 through and including substep 3022 of step 3004. Surface 3104 is the top surface of base 3102 that may contain a variety of structures with a variety of top surface layers. For example, the top surface layer 3104 may be a conductor, semiconductor, or insulating layer, or a combination of all three. Cross section 3107' contains a particular combination of materials and layers, with base region 3102' corresponding to 3102, and top surface 3204' corresponding to 3204.

The next substep of step 3004' is substep 3025; deposit a second sacrificial gap material layer 3117. One example is thin conductor layer of TiW, of approximate thickness 5–50 nm depending upon the performance specifications required for the nanotube device. Sacrificial gap material layer 3117 is illustrated in FIG. 20G.

The next substep of step 3004' is substep 3027; deposit conductive layer 3119. The material of conductive layer 3119 may be tungsten or aluminum, for example, of thickness 100 to 200 nm, for example. Conductive layer 3119 is illustrated in FIG. 20H.

The next substep of step 3004' is substep 3029; deposit and form an image in photoresist using conventional processes.

Figure 20J:
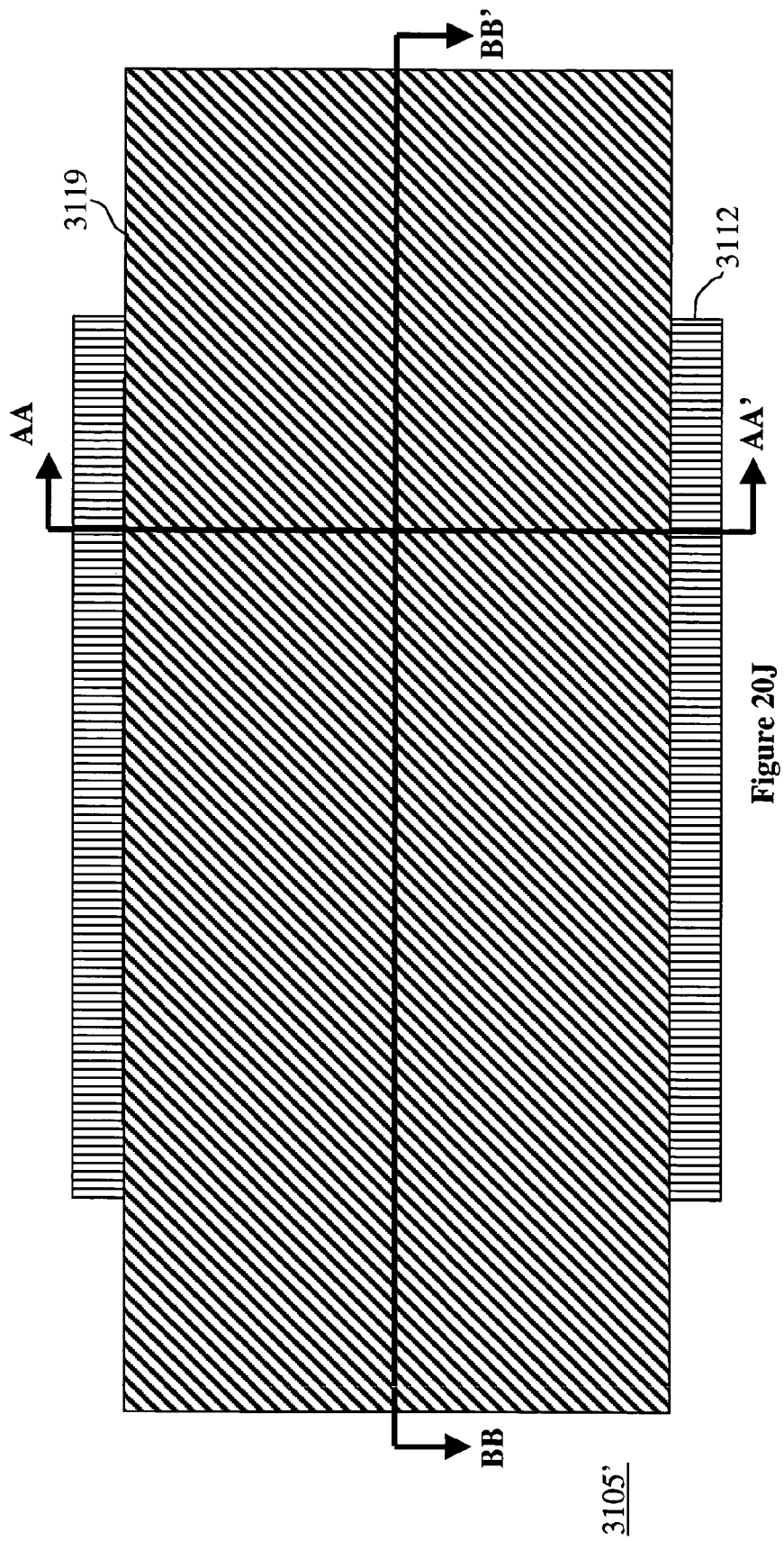
FIG. 20J illustrates a plan view of a embodiment 2 nanotube structure.

The next substep of step 3004' is substep 3031; etch to pattern conductive layer 3119, as illustrated in FIGS. 20I–J.

The next substep of step 3004' is substep 3033; etch to pattern gap material layer 3117, as illustrated in FIG. 20I.

The next substep of step 3004' is substep 3035; etch to pattern the carbon nanotube fabric layer 3114, illustrated in FIG. 20I, using appropriate methods and techniques as described in previous patent applications of Nantero, Inc.: U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341,130, 10/776,059, and 10/776,572, the contents of which are hereby incorporated by reference in their entireties.

Illustrations of the completed carbon nanotube structures for embodiment 2 are shown in FIGS. 20H–J. FIG. 20J shows a plan view of intermediate structure 3105'. FIG. 20I shows a cross sectional view of intermediate structure 3105' taken at AA–AA' as shown in FIG. 20J, and FIG. 20H shows a cross sectional view of intermediate structure 3105' taken at BB–BB' as shown in FIG. 20J. The elements in FIGS. 20A–C, and FIGS. 20G–J, correspond to elements of FIG. 3. For example, base 3102 corresponds to a combination of layers 110 and 109; planar surface 3104 corresponds to planar surface 316. Also, electrode 3106 corresponds to conductive trace 104, support 3112 corresponds to support structure 108, and the portion 3108A of sacrificial layer 3108 corresponds to sacrificial layer 304.

Step 3008 from FIG. 17 is illustrated in substeps as shown in the flow chart of FIG. 21 and includes preferred fabrication steps for creating the gap above and below the carbon nanotube layer for nanotube embodiment 1.

The first sub step of step 3008 is substep 3034; planarize top insulator layer 3116 as needed to create substantially planar surface 3116A of intermediate structure 3111 as illustrated in FIG. 23A. FIG. 23A illustrates a cross section of intermediate structure 3111, an embodiment 1 nanotube structure; an embodiment 2 nanotube structure could be substituted, however.

Figure 22:
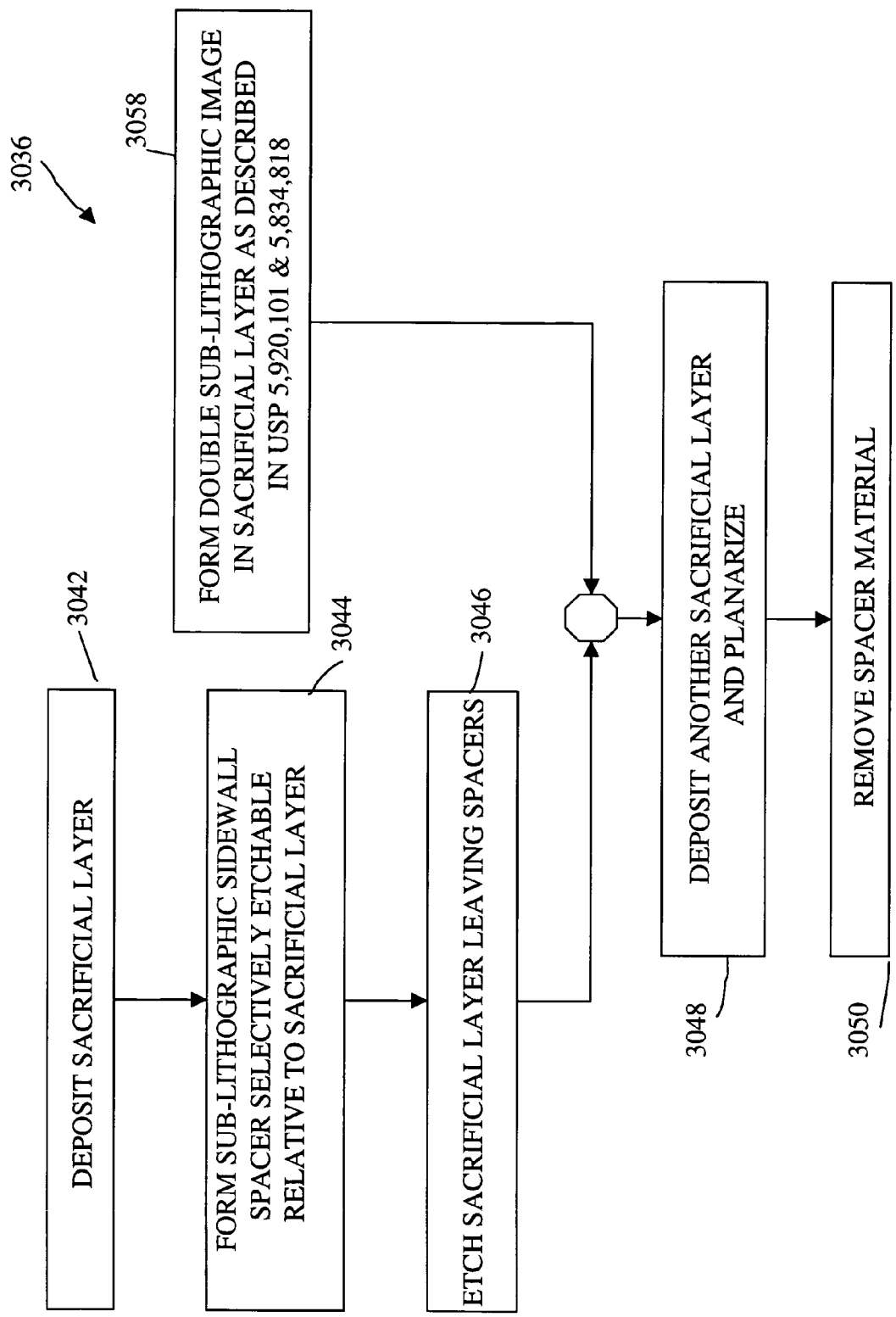
FIG. 22 is a flow chart of the steps in a process for forming sub-lithographic images in a sacrificial masking layer to define regions for a reach-through etch for embodiment 1 and embodiment 2 integrated nanotube structures.
Figure 23B:
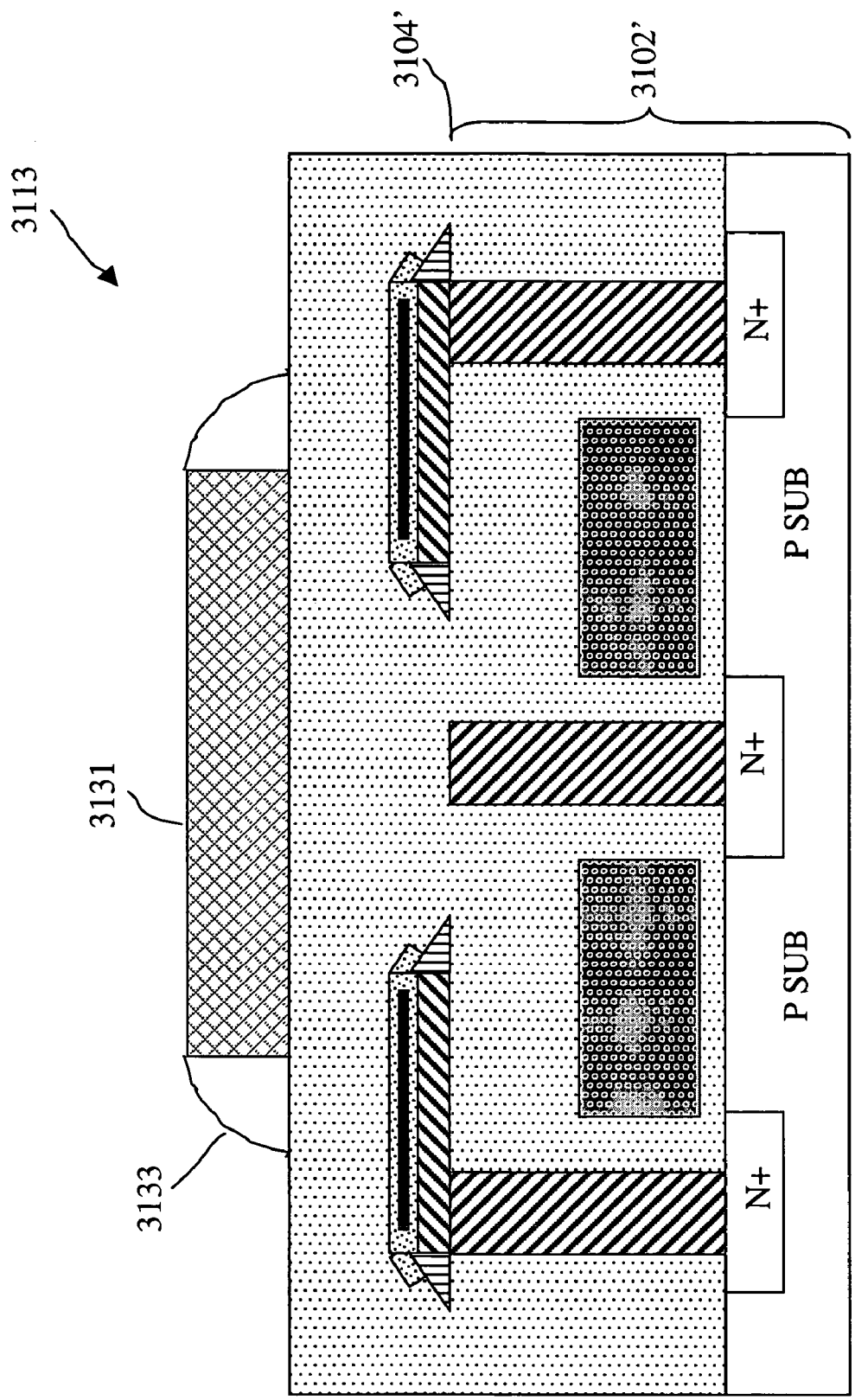
FIG. 23B illustrates the use of a sacrificial layer to generate a sub-lithographic sidewall structure. The embodiment 1 nanotube structure is used by way of example, however, embodiment 2 nanotube structure may be substituted.
Figure 23C:
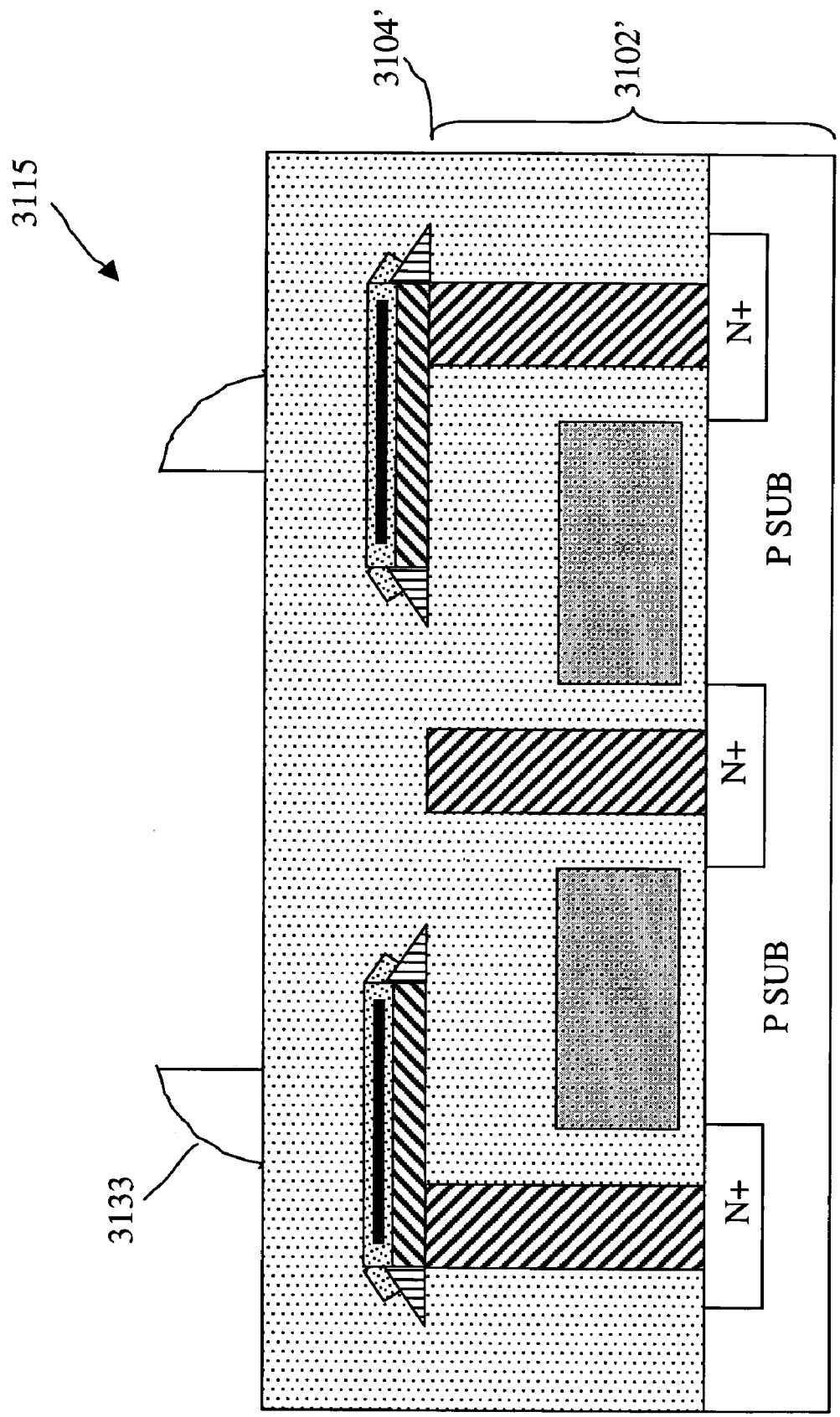
FIG. 23C illustrates the sub-lithographic sidewall structures after removal of the sacrificial material. The embodiment 1 nanotube structure is used by way of example; however, an embodiment 2 nanotube structure may be substituted.

The next substep of step 3008 is substep 3036 which is further divided into substeps as illustrated in FIG. 22: deposit and pattern sacrificial layer 3131 (substep 3042), as illustrated in FIG. 23B, (an embodiment 1 nanotube structure, an embodiment 2 nanotube structure could be substituted, however.). Sacrificial layer 3131 is deposited with a thickness in the range of 50 to 100 nm, and then patterned. Examples of materials for layer 3131 are SiN4, $Al_2O_3$, $SiO_2$, polyimide, and photoresist. The material for sacrificial layer 3130 is selected such that it is impervious to the etch chosen (RIE, for example) for SiO2 oxide 3116, and sacrificial layer 3108 nitride etch. Examples $Al_2O_3$, photoresist, polyimide, etc.

Figure 23D:
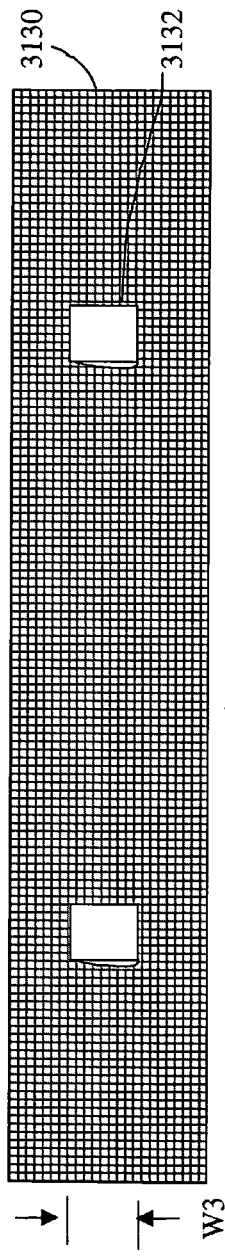
FIG. 23D illustrates a plan view of an embodiment 1 nanotube structure having a sacrificial mask layer with sub-lithographic regions removed. These regions are sub-lithographic in two orthogonal directions.
Figure 23E:
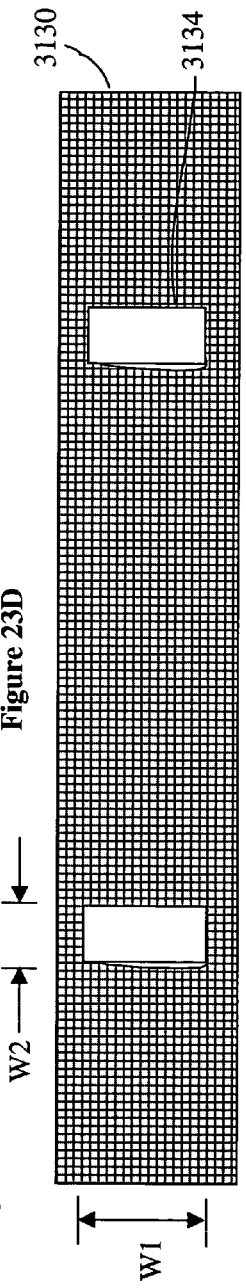
FIG. 23E illustrates a top view of another sacrificial layer with sub-lithographic regions removed. These regions are sub-lithographic in one direction and may be applied to both embodiment 1 and embodiment 2 nanotube structures, but are shown for embodiment 1.
Figure 23F:
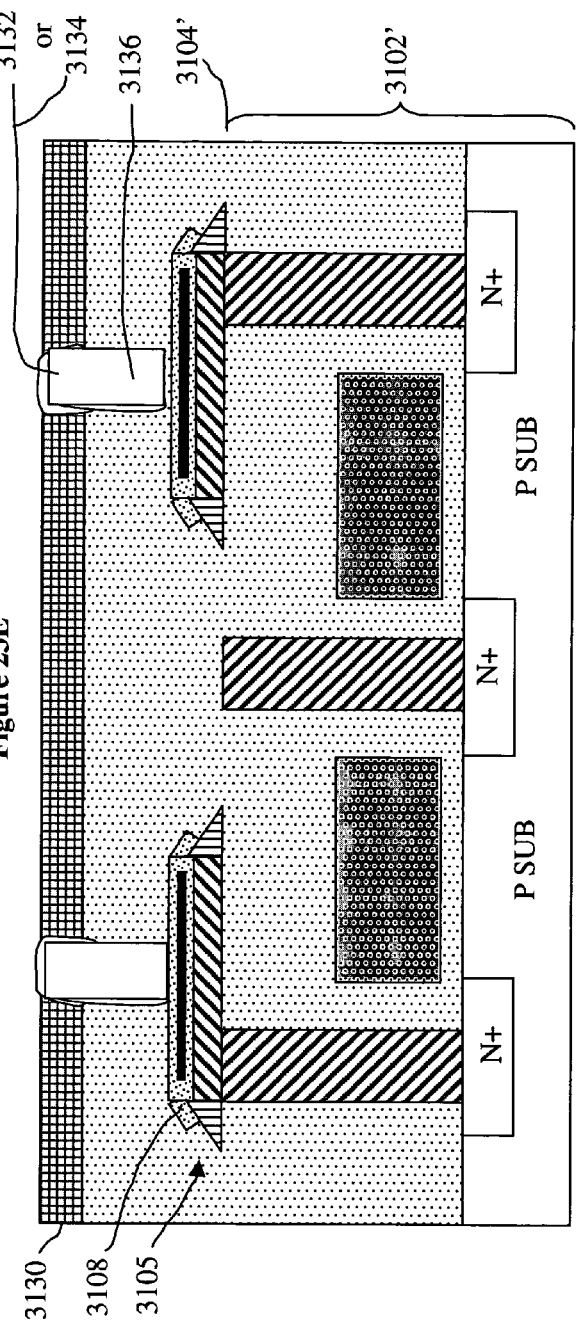
FIG. 23F illustrates a cross section of a partially processed semiconductor structure with directional via holes in an insulator reaching the sacrificial insulator of an embodiment 1 nanotube structure.
Figure 23F:
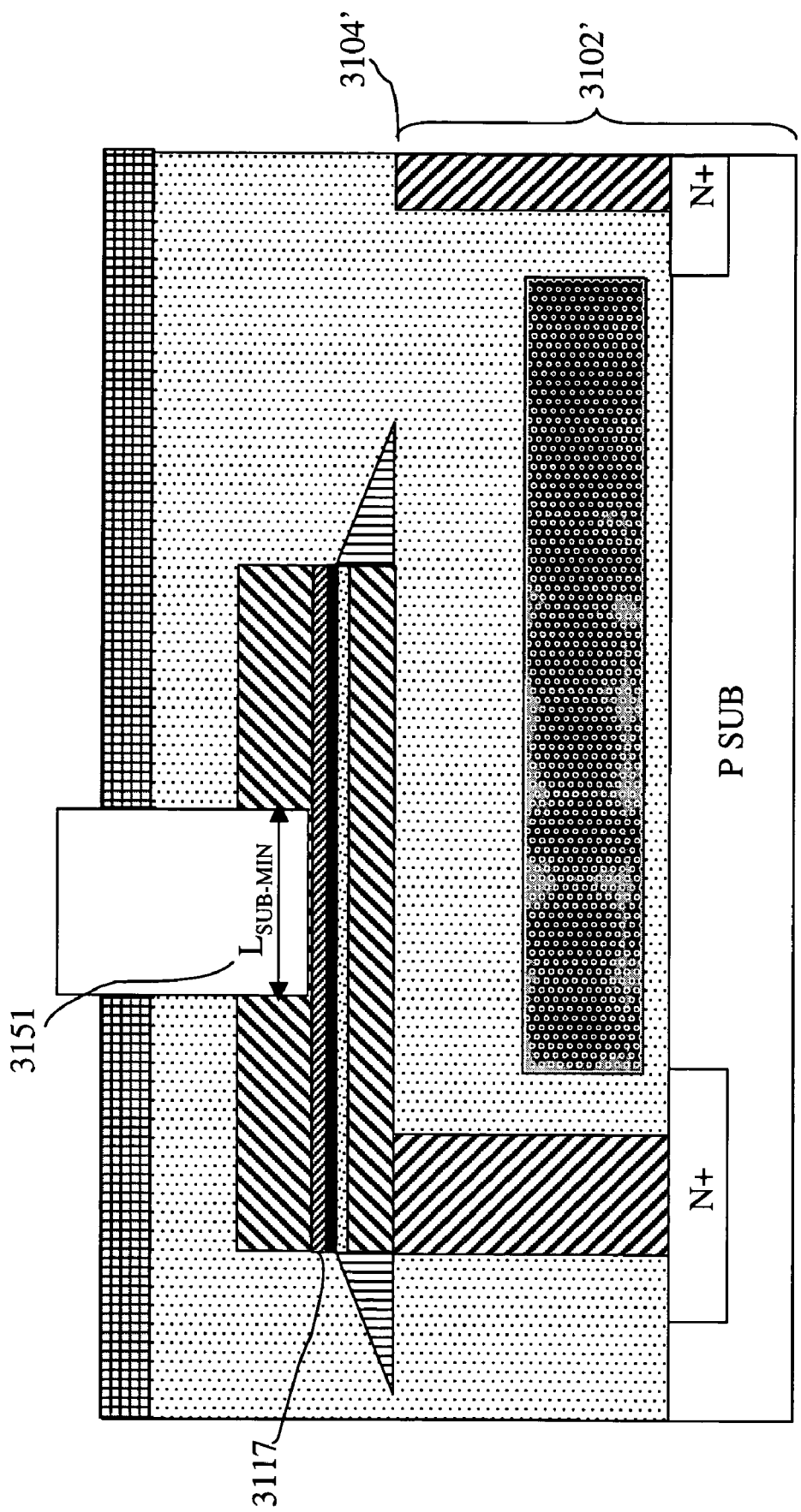
Figure 23F:
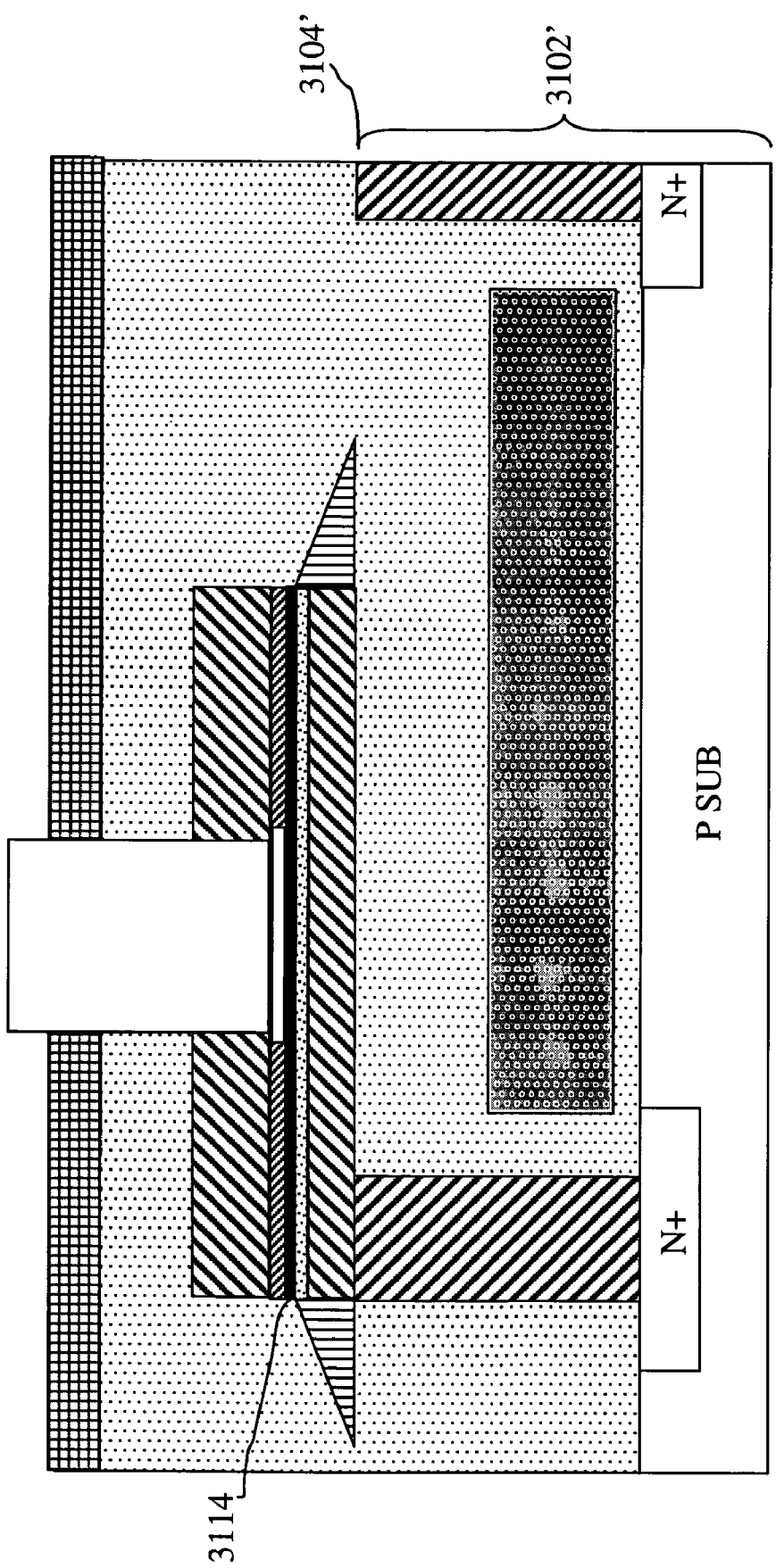
Figure 23G:
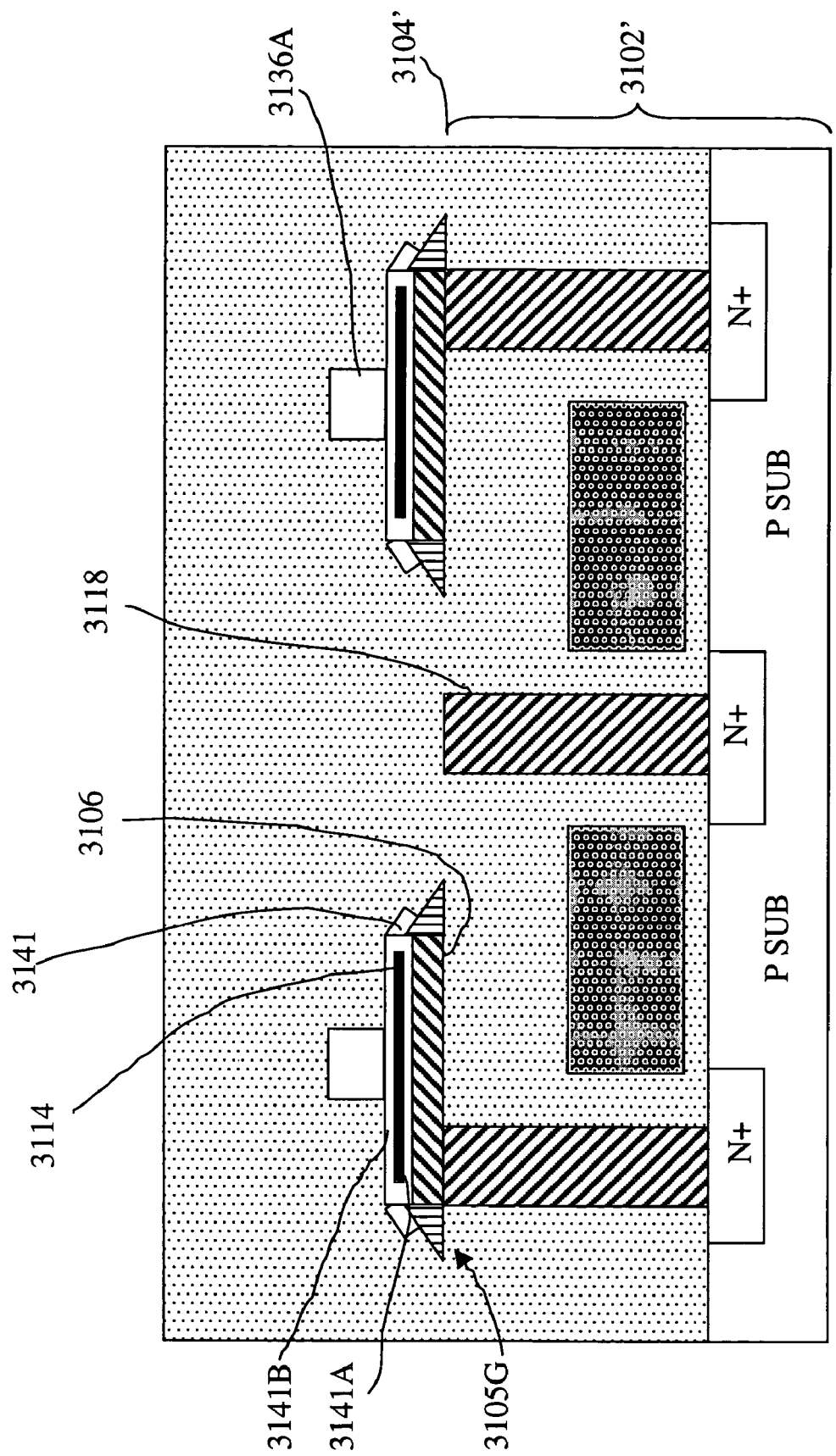
FIG. 23G illustrates a cross section of a partially processed semiconductor wafer with nanotube sacrificial layer material removed such that the embodiment 1 nanotubes are suspended (released)
Figure 23G:
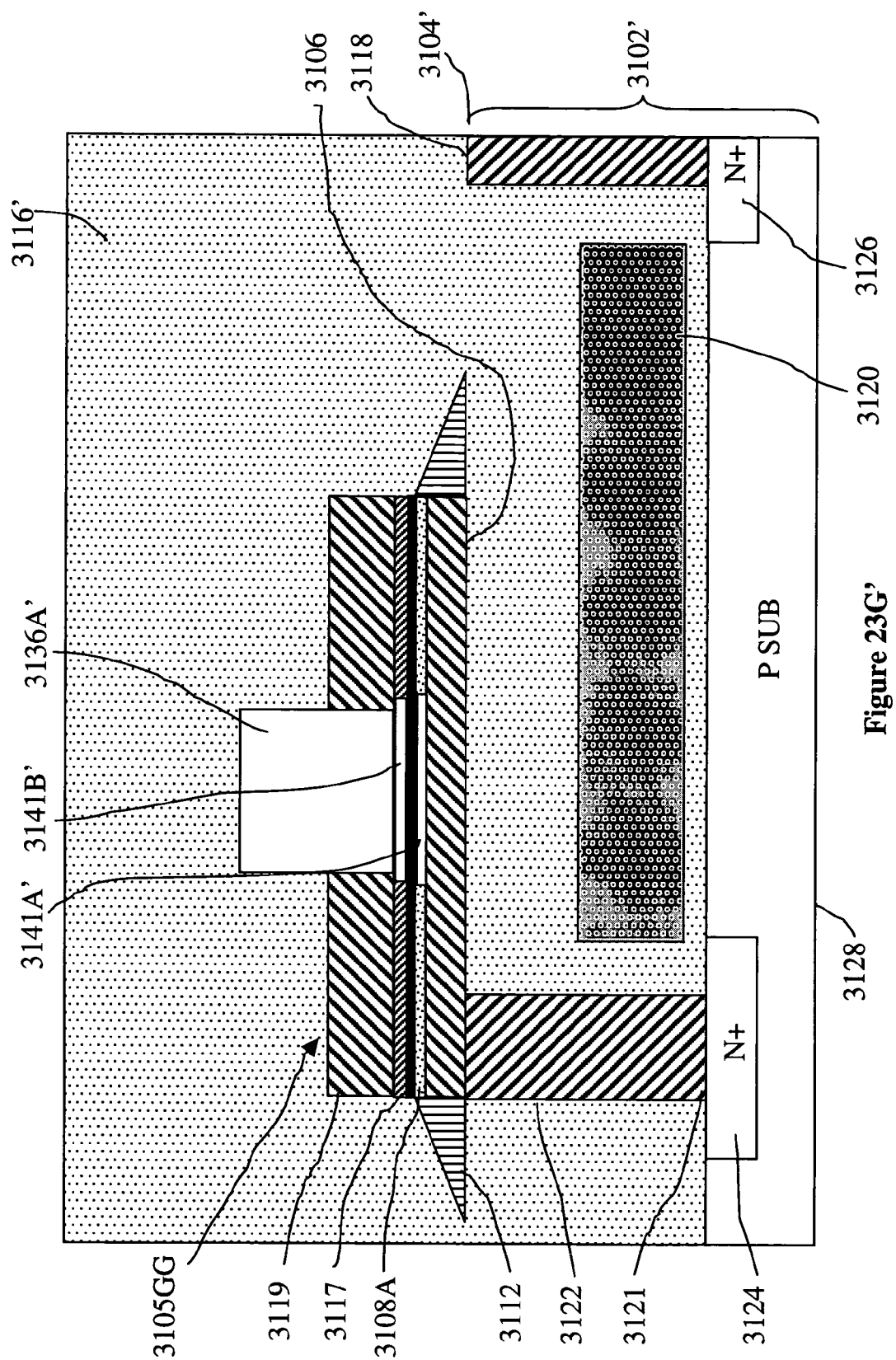
Figure 23H:
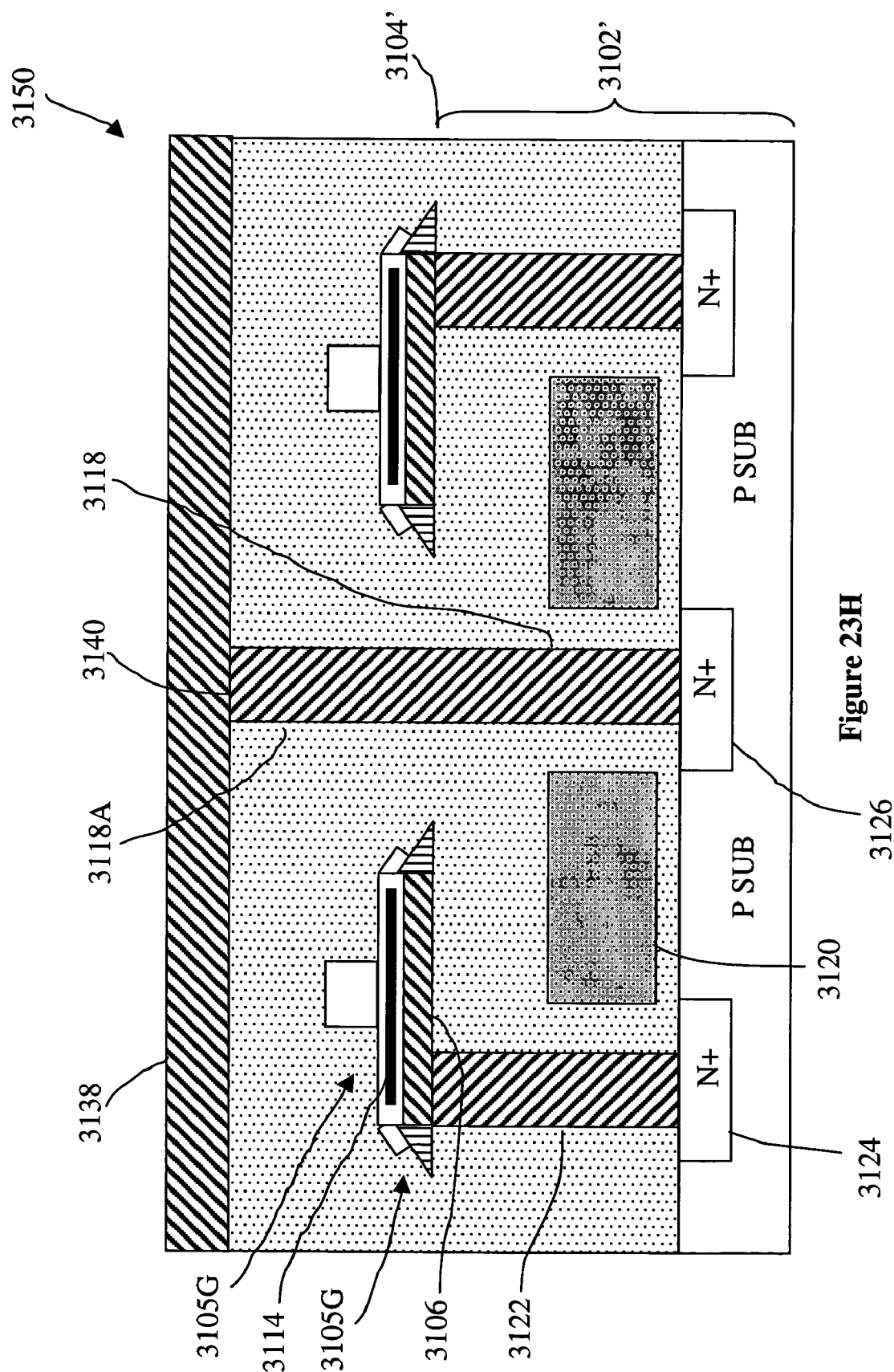
FIG. 23H illustrates a cross section of a completed semiconductor structure with an embedded integrated released embodiment 1 nanotube structure, contact studs, and surface wiring.
Figure 23H:
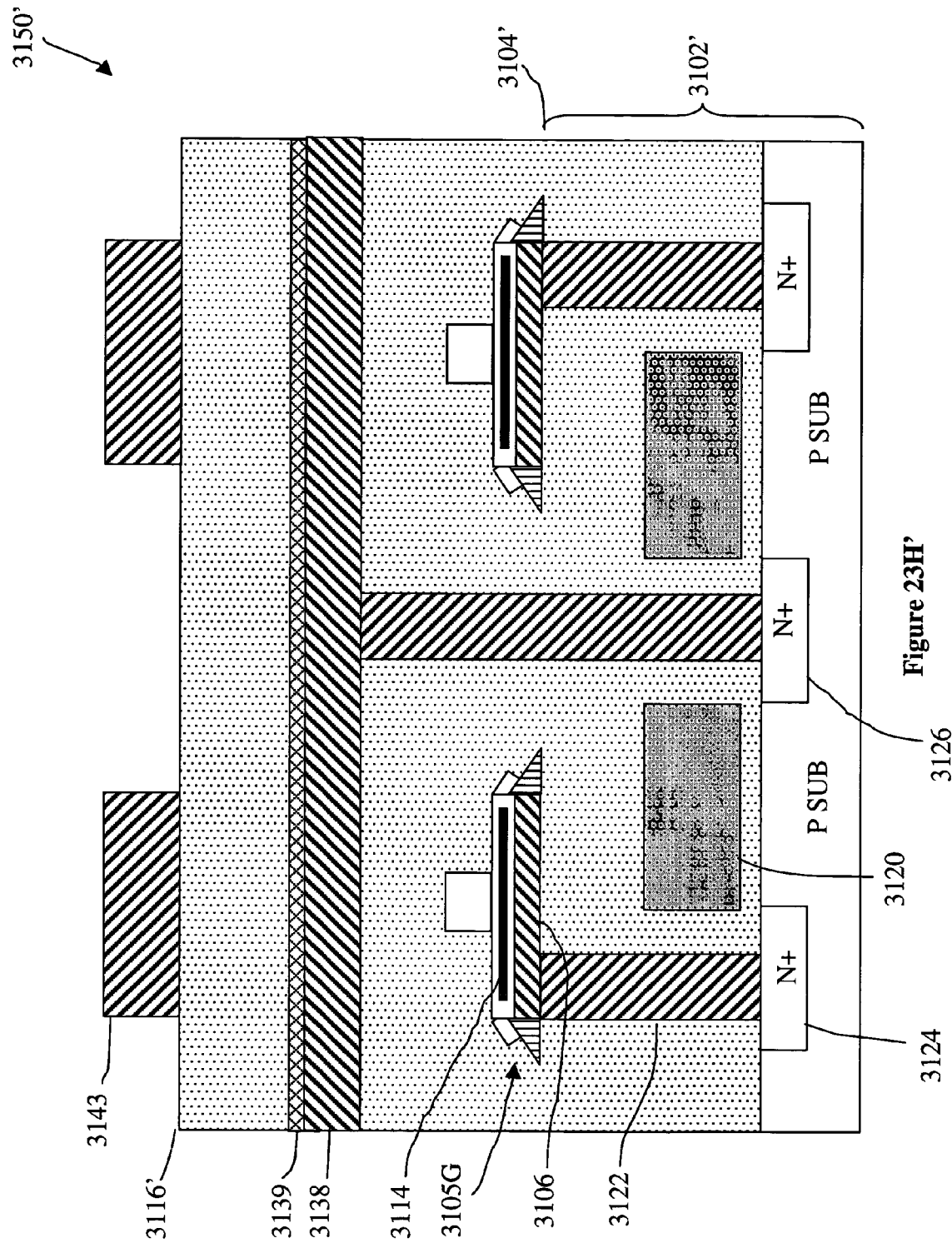
Figure 23H:
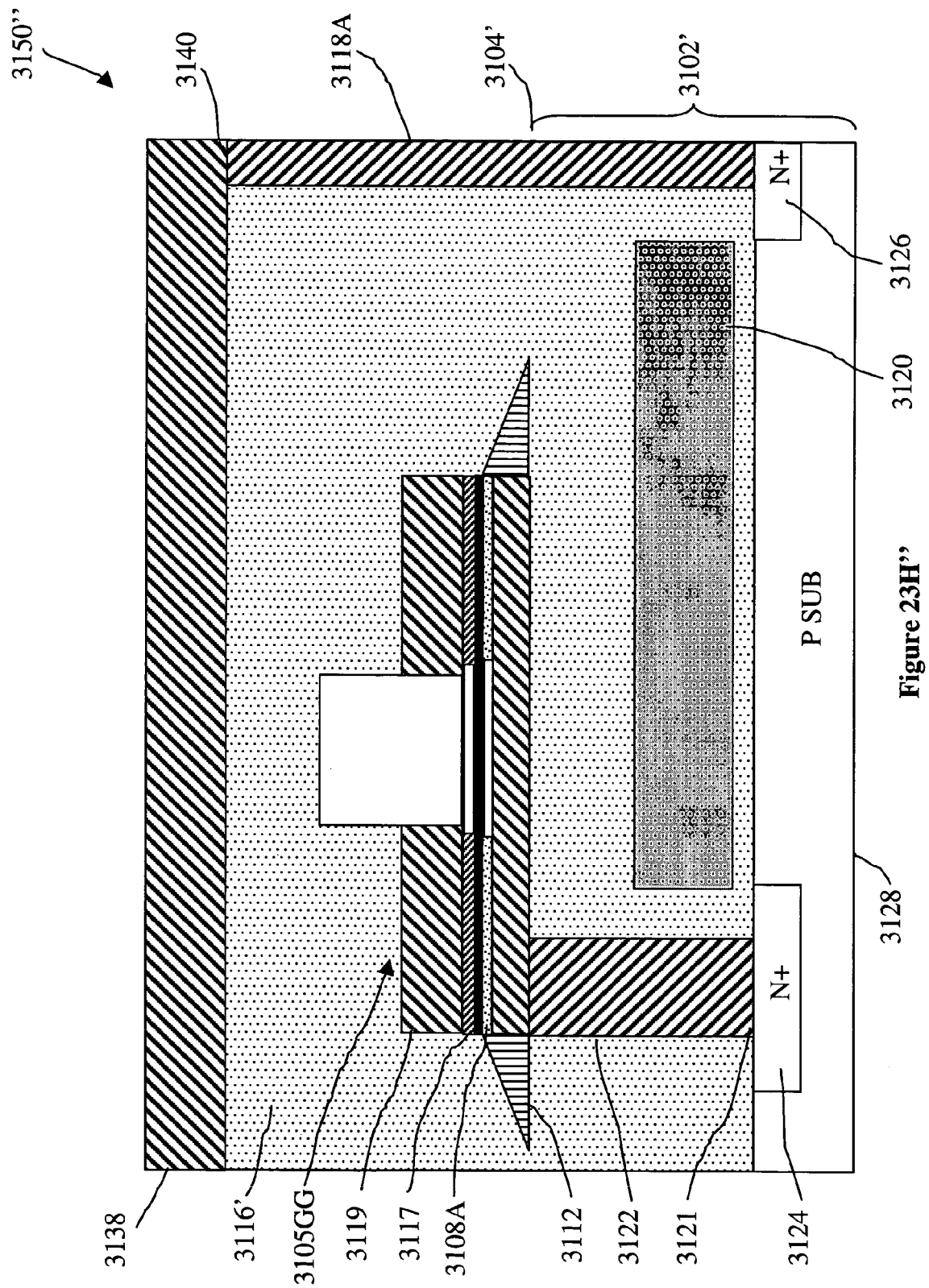

Next, perform substep 3036; embed sub-photolithographic images 3132 or 3134 in a sacrificial layer 3130 as illustrated in FIGS. 23D–F, all described in flow chart form in FIG. 22. The material for sacrificial layer 3130 is selected such that it is impervious to the etch chosen (RIE, for example) for SiO2 oxide 3116, and sacrificial layer 3108 nitride etch. Examples $Al_2O_3$, photoresist, polyimide, etc.

Flow Chart 3036, FIG. 22, illustrates steps to form the sub-lithographic images 3132 or 3134 in sacrificial layer 3130 used in etching insulating layer 3116 to form opening 3136 in the dielectric layer, $SiO_2$ for example, reaching sacrificial layer 3108, as illustrated in FIGS. 23D,E, and F. The FIG. 23D, E, and F illustrations incorporate nanotube 3105, embodiment 1, however, nanotube 3105', embodiment 2 may be substituted instead. Sub-lithographic image 3132 has two approximately orthogonal sub-lithographic dimensions W2 and W3 and may be used with nanotube embodiments 1 and 2. Sub-lithographic image 3134 has one sub-lithographic dimension W2 and may be used with nanotube embodiment 1.

Next, perform substep 3044, sacrificial sidewall spacers 3133 are formed along the edges sacrificial layer 3131 using fabrication techniques similar to those of steps 3018 and 3020, then sacrificial sidewall spacers are patterned, resulting in intermediate structure 3113 illustrated in FIG. 23B. The material of sacrificial sidewall spacers 3133 should be different than the material of sacrificial layer 3131, and should be selectively etchable over sacrificial layer 3131. One suitable material system is to use $Si_3N_4$ for layer 3131 and SiO2 for layer 3133.

The next substep, 3046 is to remove sacrificial gap material to form gaps 3131 leaving layer spacers 3133 as shown in FIG. 23C, intermediate structure 3115, shown in cross section. Spacer 3133 has one sub-lithographic dimension W2, and one approximately orthogonal minimum dimension W1.

The next substep is 3048; deposit another sacrificial layer 3130 and planarize. The material for sacrificial layer 3130 is selected such that it is impervious to the etch chosen (RIE, for example) for SiO2 oxide 3116, and sacrificial layer 3108 nitride etch. Examples include but are not limited to: $Al_2O_3$, photoresist, polyimide, etc.

Next is substep 3050; remove spacer material, thereby completing the substeps of substep 3036, illustrated in the flow chart of FIG. 22.

An alternative to substeps 3042, 3044 and 3046 is substep 3058. A double sub-lithographic image 3132 with two approximately orthogonal sub-lithographic images W2 and W3 may be formed in sacrificial layer 3130 using process techniques described in U.S. Pat. Nos. 5,920,101 and 5,834,818. Alternatively, nano-imprint technology may be used. In this method, the sub-lithographic bumps are formed on a hard mask, and are pressed into a soft photoresist layer. These sub-lithographic bumps may be made of silicon, for example. Substep 3050 or alternatively substep 3058 completes the substeps of 3036.

FIG. 23F illustrates the embodiment 1 nanotube structure 3105 integrated in a semiconductor structure prior to etching to remove the sacrificial gap material and suspend the nanotube.

After completing the substeps of FIG. 22, the next substep of step 3008 is substep 3038: directionally etch insulator to gap sacrificial layer, as outlined in the flow chart of FIG. 21. For a $SiO_2$ insulator and $Si_3N_4$ sacrificial layer system, the $Si_3N_4$ layer 3108 can act as an etch stop for the $SiO_2$ etch.

The next substep of substep 3008 is substep 3040; etch (remove) sacrificial gap material 3130 to form gaps 3108. The etch may be done by any appropriate method, e.g. by wet etch. This releases the electromechanical carbon nanotube structure in the NT switch region by creating separation or gap regions 3141A and 3141B. Gap 3141A between nanotube fabric layer 3114 and electrode 3106 is 13 nm. Gap 3141B between nanotube fabric layer 3114 and oxide 3116 is preferably between 5–50 nm but can be adjusted depending upon performance specifications desired. Such elements are illustrated in FIG. 23G, the released embodiment 1 nanotube structure 3105G. The released nanotube structure of embodiment 1 is referred to as 3105G, as distinguished from the unreleased embodiment 1 nanotube structure 3105.

The next substep of substep 3008 is substep 3052; deposit and planarize an insulator layer, by any appropriate method, e.g. by low pressure chemical vapor deposition (LPCVD), so as not to fill the entire hole. The insulator partially fills the sub-lithographic gaps in the insulator layer, but does not fill down to gap region 3141 as shown in FIG. 23G. Partially filled via hole 3136A remains. Partial stud 3118 remains.

The end of substep 3008 is substep 5054; etch via to studs 3118, fill holes with conductor material 3118A such as tungsten, for example, and planarized. Wiring layer 3138 is deposited and patterned. Wiring layer 3138 contacts stud 3118A at contact region 3140 of intermediate structure 3150, as shown in FIG. 23H. Final processing to the passivation layer is not shown.

Figure 23I:
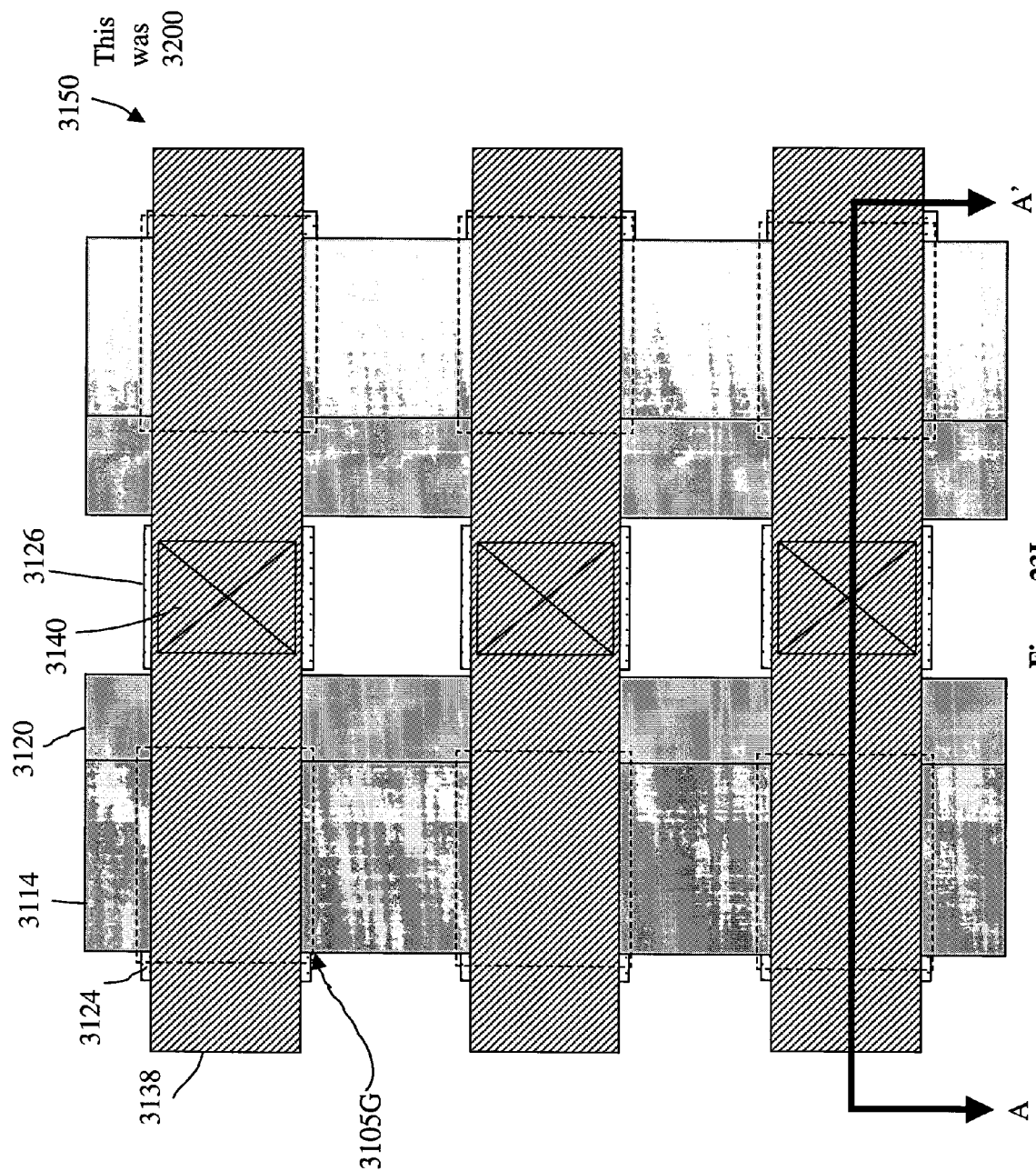
FIG. 23I illustrates a plan view of FIG. 23H.
Figure 23I:
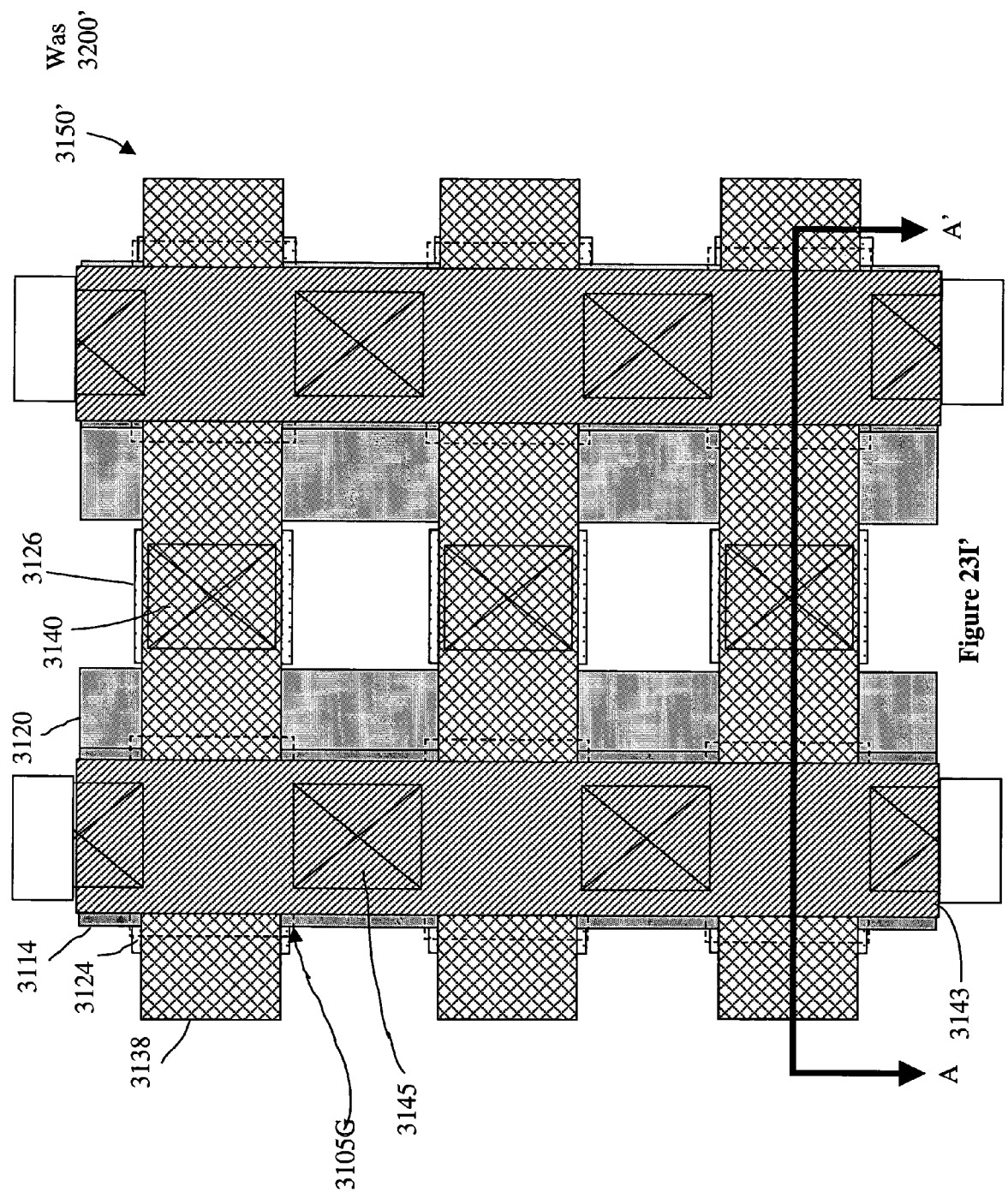
Figure 23I:
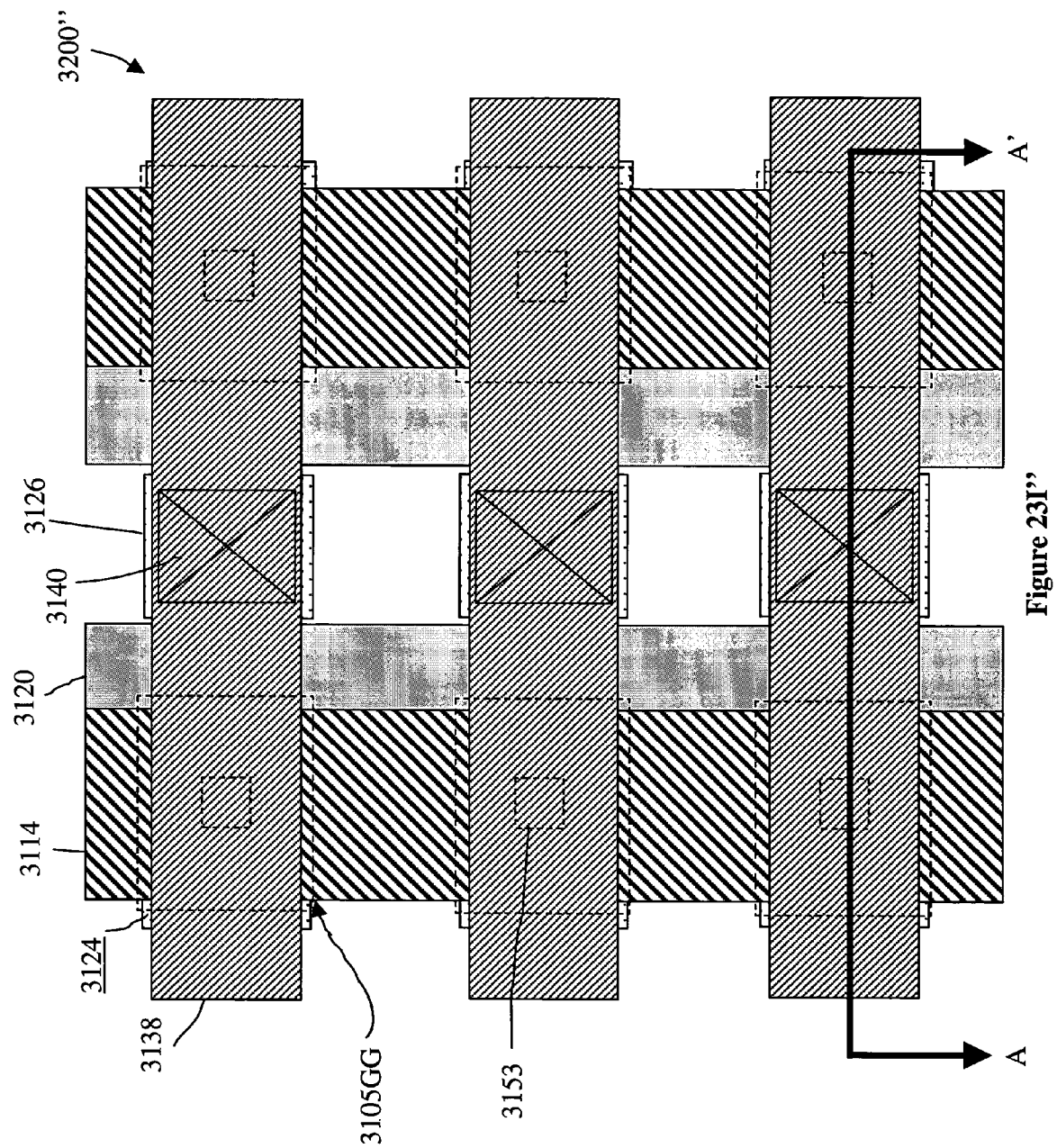

FIG. 23I illustrates intermediate structure 3150 (a memory or storage cell) in plan view. The cross section shown in FIG. 23H is taken along bit line 3138 (AA') of plan view in FIG. 23I. The storage (memory) cell shown in FIG. 23I includes word line 3120, bit line 3138, and nanotube fabric layer 3114. Vertical stud 3122 contacts source diffusion 3124 and electrode 3106 of NT structure 3105G, nanotube embodiment 1. Nanotube fabric layer 3114 and NT structure 3105G (nanofabric switch) overlay word line 3120 for greater cell density. Bit line 3138 contacts stud 3118 at contact 3140, and stud 3118 connects bit line 3138 to diffusion 3126, shared between two devices in adjacent cells. The cell layout pitch along the bit line requires 3 minimum features (3F), and the cell pitch along the word line requires 2 minimum features (2F), so the cell area is $6F^2$.

In embodiments of the present invention using high resistivity nanotube fabric, e.g. 10 to 100,000 Ohms per square, stitching electrodes may be used. In order to use the embodiment 1 nanotube structure 3105G for both a switching device and an array wire, as illustrated in FIGS. 23H and 23I, it is necessary to reduce the Ohms per square of the nanotube fabric. One approach to reduce such resistance is to use metal strapping of the nanotube layer. FIGS. 23H' and 23I' illustrates metal strapping line 3143 connected to nanotube fabric layer 3114 used in this instance as an array line in the region between memory cells by contact 3145. Metal strapping line 3143 may have a thickness in the range of approximately 100 to 200 nm. For a tungsten (W) strapping line, the sheet resistance is in the range of 0.15 to 0.60 Ohms per square, depending on line thickness and width. For an aluminum (Al) strapping line, the sheet resistance is in the range of 0.05 to 0.18 Ohms per square, depending on line thickness and width, (see Itoh, K., "VLSI Memory Chip Design", Springer 2001, Table 2.3, page 61). In order to minimize the risk of shorting between strapping line 3143 and bit line 3138, bit line 3138 may be coated with a conformal insulating layer 3139, such as $Si_3N_4$, resistant to the $SiO_2$ etch used to form the via hole for contact 3145.

FIGS. 23J–L show structures resulting from fabrication steps used to coat the top and sides of bit line 3138 with an insulator, $Si_3N_4$ for example, resistant to $SiO_2$ process etch when forming via holes 3145 (shown in FIG. 23I'). FIG. 23J illustrates a portion of insulating layer 3116, supporting metal layer 3138' and insulating layer 3139'

FIG. 23K illustrates patterned layers 3138' and 3139' forming bit line conductor 3138 of tungsten or aluminum, for example with a top insulating layer 3139, of $Si_3N_4$, for example. (Tungsten and Aluminum are used as non-limiting examples, one skilled in the art will appreciate and that any appropriate conductor may be used.) Conformal insulating layer 3147, for example $Si_3N_4$, is deposited and then directionally etched to form an insulating sidewall 3149 for bit line 3138. Bit line 3138, with insulator 3139 on top, and sidewall insulation 3149 is illustrated in FIG. 23L.

The substeps of step 3008' are described in flow chart form in FIG. 21' and are preferred fabrication steps for creating the gap above and below the carbon nanotube layer for nanotube embodiment 2.

The first substep of step 3008' is substep 3037; execute process steps 3034 and 3036 of step 3008, (see FIG. 21). These process steps result in combined nanotube and semiconductor structures illustrates in FIGS. 23A–F, except that nanotube embodiment 1 3105 is replaced with nanotube embodiment 2 3105'. FIG. 23F, showing nanotube embodiment 2 3105' instead of nanotube embodiment 1 3105 is illustrated in FIG. 23F', just prior to etching of the nanotube structure. FIG. 23D' is the same as FIG. 23D, except that sub-lithographic mask layer opening 3132' is selected to optimize the characteristics of nanotube structure 3105'. Hole 3136' in the dielectric layer reaches conductor 3119 of nanotube embodiment 2 3105'. FIG. 20I illustrates a cross sectional view of nanotube embodiment 2 3105' taken at AA–AA' (see FIG. 20J).

The next substep of step 3008' is substep 3039; directionally etch insulator 3116, $SiO_2$ for example, until conductor 3119 is reached, acting as an etch stop. This etch creates sub-minimum dimension etch hole 3136' in the dielectric as shown in FIG. 23F'.

The next substep of step 3008' is substep 3041; etch holes in conductor layer 3119 to top sacrificial gap layer. This etch can be done directly through conductor 3119, transferring the sub-minimum dimension of opening 3136' into conductor 3119 as sub-minimum ($L_{SUB-MINIMUM}$) opening 3151, illustrated in FIG. 23F''.

The next substep of step 3008' is substep 3043; etch (remove) exposed portions of top sacrificial gap material. This step can be conducted using the sub-minimum dimensioned opening 3151 in conductor 3119 as an etch mask; etch and remove the portion of top sacrificial gap layer 3117 just below the opening, as illustrated in FIG. 23F''', exposing the switching region of nanotube fabric layer 3114.

The next substep of step 3008' is substep 3045; etch through porous nanotube fabric and remove exposed portion of bottom sacrificial material. Nanotube fabric layer 3114 is porous. Using the opening in conductive layer 3117 as a mask, etch through nanotube fabric layer 3114 and remove the portion of the bottom sacrificial layer 3108A just below the opening in conductive layer 3117. Etching through nanotube fabric layer 3114 leaves fabric 3114 substantially unchanged because the nanotube filaments in the fabric typically occupy less than 5% of the fabric area, and the etch flows around the nanotubes filaments to etch sacrificial film 3108A below. The switching portion of nanotube fabric layer 3114 is now released as illustrated in FIG. 23F''''. The released nanotube structure of embodiment 2 is referred to as 3105GG, to distinguish the released nanotube from the unreleased embodiment 2 nanotube structure 3105'. The released nanotube length can be a sub-minimum lithographic dimension of 25 to 75 nm, for example, and fits well within the minimum FET channel length region $L_{MIN}$, on the order of 100 nm, for example. The gap between nanotube fabric layer 3114 and switching electrode 3106 may range from 2.5 to 10 nm, for example. Sub-lithographic minimum dimensions for the nanotube result in superior characteristics for the switching region of scaled, smaller sub-minimum dimensions. The released (suspended) portion of nanotube fabric layer pinned (horizontal movement is constrained) by films 3117 and 3108A (i.e. conductive layer 3117 and first sacrificial gap layer 3108A).

The final substep of step 3008 is substep 3047; execute process steps 3052 and 3054 of step 3008 to complete the structure with embodiment 2 nanotubes. Deposit and planarize an insulator layer (substep 3052) resulting in the cross section as illustrated in FIG. 23G', with partially filled sub-lithographic gap 3136' in insulator 3116'. Then, stud via holes are etched, filled, planarized (substep 3054) resulting in stud 3118 extended by 3118A to the planarized surface of insulator 3116'. Bit line 3138 is then deposited and patterned; the resulting cross section is illustrated in FIG. 23H". Wiring layer 3138 contacts stud 3118A at contact region 3140 of intermediate structure 3150". Final processing to the passivation layer is not shown.

FIG. 23I" is a plan view of intermediate structure 3150" and can be a storage (memory cell). Cross section 3150" taken is along bit line 3138 (AA') of plan view of intermediate structure 3150", as shown in FIG. 23I". FIG. 23I" illustrates a storage (memory) cell and includes word line 3120, bit line 3138, and nanotube fabric layer 3114. Nanotube fabric layer 3114 also includes conductive layers 3117 and 3119 (as illustrated in FIG. 23H", but not in FIG. 23I") and could be appropriately referred to as a nanotube wiring layer. Vertical stud 3122 contacts source diffusion 3124 and electrode 3106 of NT structure 3105GG, nanotube embodiment 2. Nanotube fabric layer 3114 and NT switch structure 3105G (shown within dotted lines) overlay word line 3120 for greater cell density. Bit line 3138 contacts stud 3118 at contact 3140, and stud 3118 connects bit line 3138 to diffusion 3126, shared between two devices in adjacent cells. Nanotube sub-lithographic switch region 3153 illustrates the area occupied by the sub-lithographic dimensions of nanotube 3105GG. The cell layout pitch along the bit line requires 3 minimum features (3F), and the cell pitch along the word line requires 2 minimum features (2F), so the cell area is $6F^2$. Carbon Nanotube-on-Source Storage (Memory).

FIGS. 20A–F, and associated fabrication steps, illustrate a nanotube embodiment 1 structure 3105 that integrates with semiconductor technology, independent of cell type or structure. Nanotube structure 3105 is formed on surface 3104 of base layer 3102, where base layer 3102 accommodates a wide variety of structures. In the specific example of the integration of nanotube structure 3105 into a cell structure, the preferred NT-on-Source cell has been illustrated in detail. In FIG. 19, base 3102 becomes base 3102' corresponding to a partially processed NT-on-Source cross section with nanotube electrode 3106 and NPROM source 3124 electrically connected by stud 3122. FIGS. 23A–G, and FIGS. 23H, H', I, I' and FIGS. 23J–L, (along with associated fabrication steps) describe a process for the formation of the NT-on-Source cell. FIG. 23G illustrates released embodiment 1 nanotube structure 3105G. FIG. 23H illustrates the NT-on-Source cell cross section prior to passivation. FIG. 23H' illustrates the NT-on-Source cell with nanotube fabric layer 3114 strapped with metal line 3143 for low resistance array wiring. FIG. 23I illustrates a plan view of the NT-on-Source cell layout corresponding to FIG. 23H. FIG. 23I' illustrates a plan view of NT-on-Source cell layout corresponding to FIG. 23H'.

FIGS. 20A–C and FIGS. 20G–J, and associated fabrication steps, illustrate a nanotube embodiment 2 structure 3105' that integrates with semiconductor technology, independent of cell type or structure. Nanotube structure 3105' is formed on surface 3104 of base layer 3102, where base layer 3102 accommodates a wide variety of structures. In the specific example of the integration of nanotube structure 3105' into a cell structure, the preferred NT-on-Source cell has been illustrated in detail. In FIG. 19', base 3102 becomes base 3102' corresponding to a partially processes NT-on-Source cross section, with nanotube electrode 3106 and NMOS FET source 3124 electrically connected by stud 3122. FIGS. 23D', 23F', 23F", 23F"', 23F"", 23G', and FIGS. 23H", 23I", and also associated fabrication steps describe a process for the formation of the NT-on-Source cell. FIG. 23G' illustrates released embodiment 2 nanotube structure 3105GG. FIG. 23H" illustrates the NT-on-Source cell cross section prior to passivation. FIG. 23I" illustrates a top view of the NT-on-Source cell layout corresponding to FIG. 23H".

Figure 24:
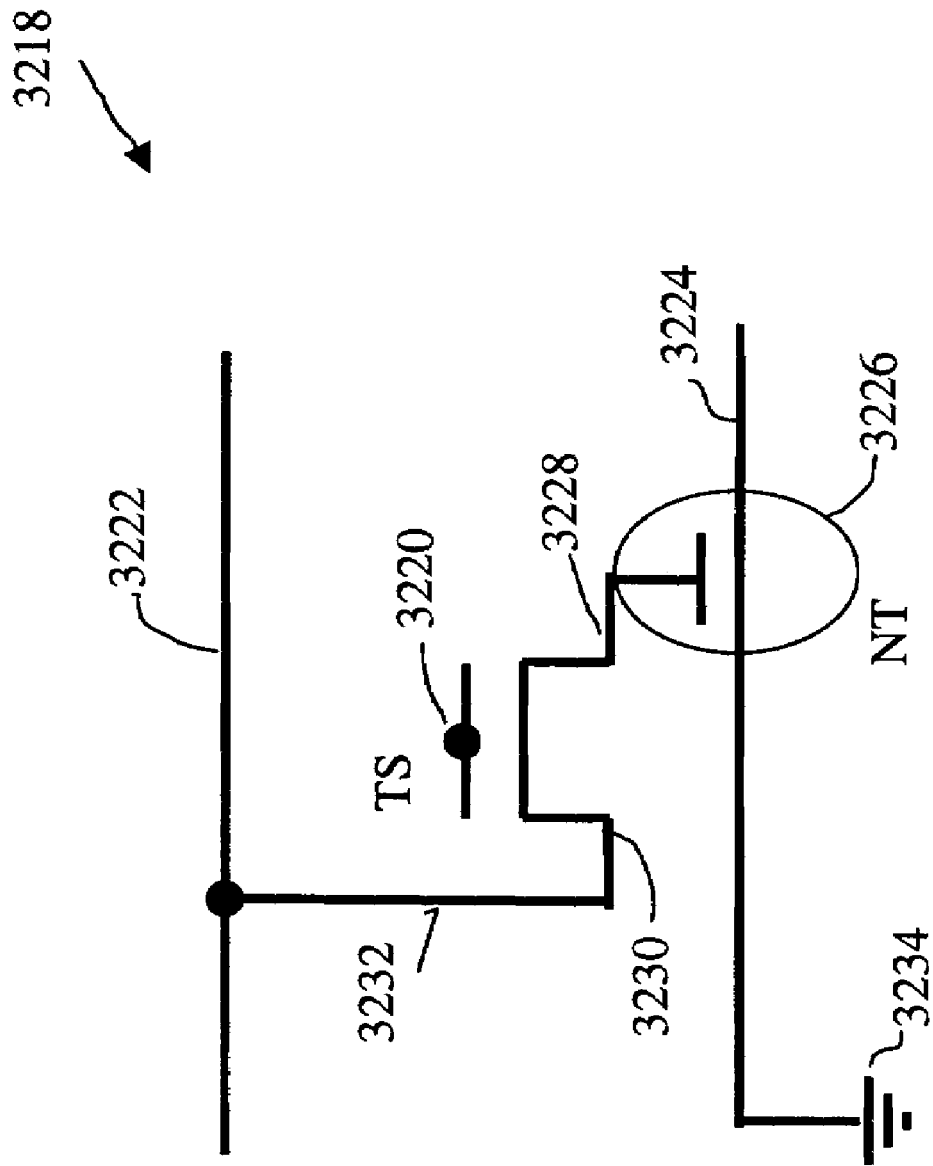
FIG. 24 is a schematic representation of a NT-on-Source OTP memory cell.

FIG. 24 is a schematic of single NT-on-Source cell 3218, and is a more detailed schematic representation of the schematic illustrated in FIG. 1C. Cell 3218 corresponds to structures 3150, and 3150' illustrated in FIGS. 23I and 23I', respectively, for embodiment 1, nanotube structure 3105G, and layout 3150" illustrated in FIG. 23I" for embodiment 2, nanotube structure 3105GG. Word line 3220 corresponds to word line 3120, bit line 3222 corresponds to bit line 3138, and bit line connection 3232 connects bit line 3222 to drain 3230, where drain 3230 corresponds to drain 3126 of FIGS. 23H, H', and H". Source 3228 corresponds to 3124, and nanotube fabric layer 3224 corresponds to nanotube fabric layer 3114 in FIG. 23I, and is grounded at terminal 3234. Nanotube 3224 corresponds to nanotube wire/nanotube fabric layer 3114 and low resistance metal strapping 3143 in FIG. 23I'. Nanotube structure 3224 corresponds to nanotube wire/nanotube fabric layer 3114 in FIG. 23I". The switching portion of nanotube array wire 3224 is labeled NT 3226, i.e. nanotube fabric switch 3226 is shown within an oval and is contiguous with nanotube array line 3224. NT 3226 is illustrated in FIGS. 23H, H' as embodiment 1 nanotube structure 3105G, and in FIG. 23H" as embodiment 2 nanotube structure 3105GG.

Figure 25:
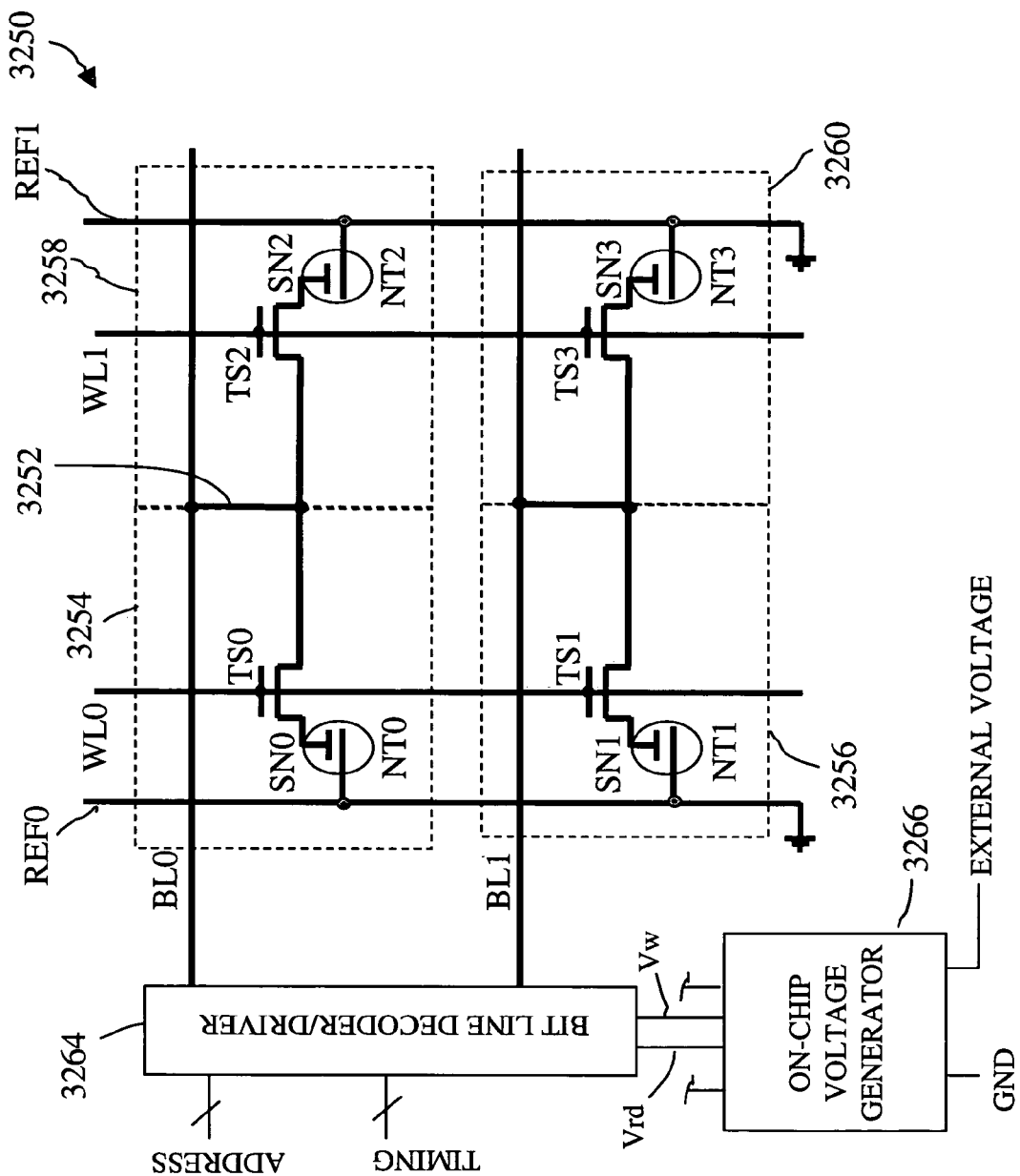
FIG. 25 is a schematic representation of a NT-on-Source OTP memory system using a differential sense amplifier/latch sensing scheme.
Figure 25:
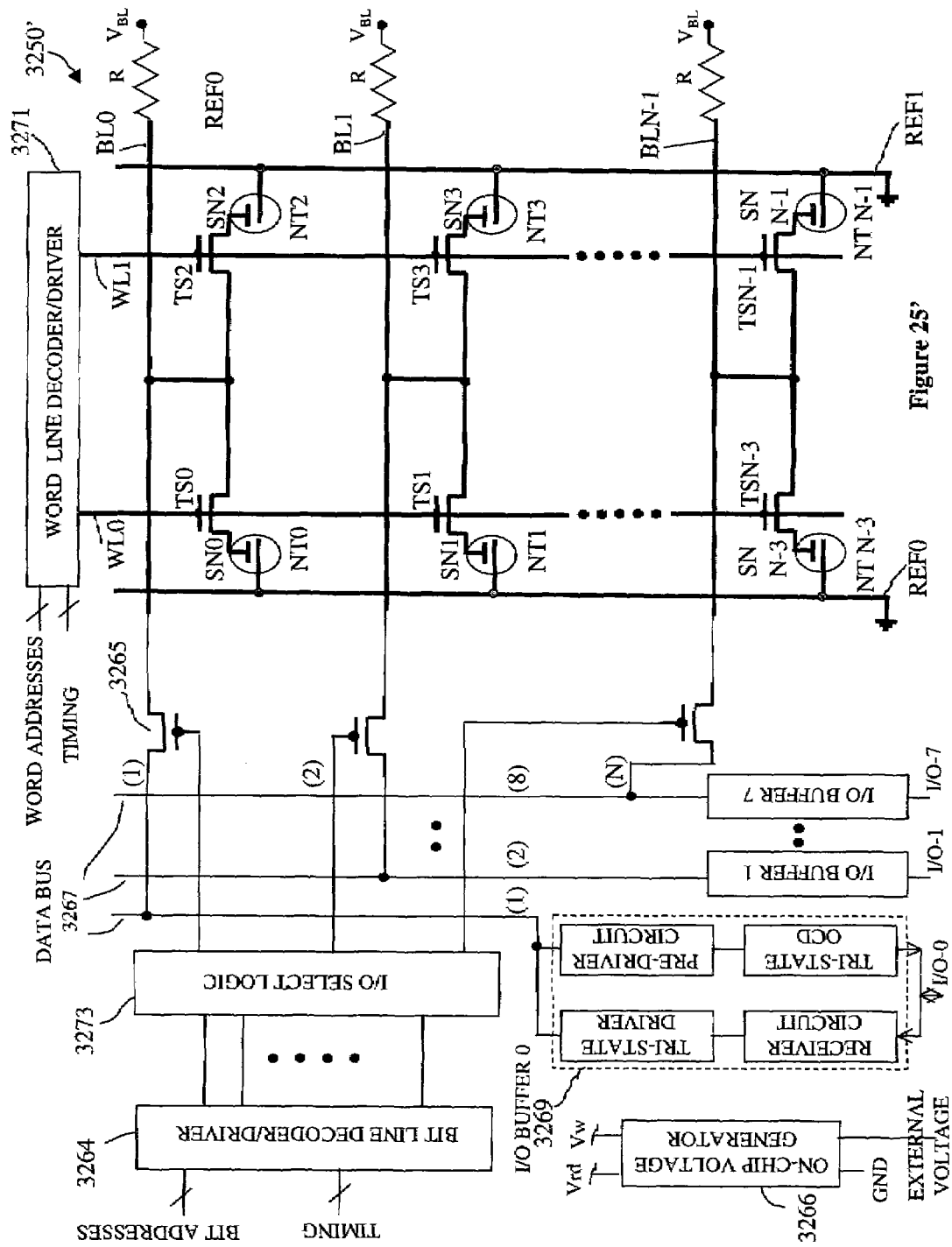

NT-on-Source schematic 3218 forms the basis of non-volatile storage (memory) OTP NPROM array system 3250, illustrated in FIG. 25. The NT structure forms non-volatile storage cells when integrated with an NPROM transistor in a memory array system as illustrated in FIG. 25; the cells comprising a matrix of non-volatile storage cells 3254, 3256, 3258, and 3260 in accordance with the preferred embodiment of the invention. OTP NPROM memory array 3250 also comprises read and write word lines (WL0, WL1, etc.), and read and write bit lines (BL0, BL1, etc.). Bit Line Decoder/Driver 3264 is used to select bit lines to be activated. The bit lines are selected based on the address inputs and timing inputs. The applied bit line voltage levels are generated by On-Chip Voltage Generator 3266. Vrd is the read voltage, and VW is the write voltage. Non-volatile storage cell 3254, as with all the other cells of the present invention, is comprised of: select transistor TS0, and the nanotube structure comprising: nanotube NT0, and select node SN0. The gate of TS0 is coupled to WL0, the drain of TS0 is coupled to BL0, the source of TS0 is coupled to select electrode (node) SN0. NT0 is the switch portion of nanotube array line REF0 (typically ground). Connection 3252 connects BL0 to the shared drain of transistors TS0 and TS2.

After fabrication, all nanotubes in array 3250 are in the OFF or open position. The OTP memory allows for unlimited read operations, but only one write operation per bit location. For a write operation, transistor TS0 is activated by WL0, and the voltage Vw of BL0 is applied through transistor TS0 to select node SN0. If the applied voltage Vw between nodes SN0 and REF0 (ground) exceeds the nanotube threshold voltage $V_{NT\ TH}$, the nanotube structure switches to the ON state or logic "1" state, that is, nanotube REF0 and source SN0 are electrically connected. The near-Ohmic connection between SN0 and REF0 represents the ON state. If the applied voltage $V_W$ is zero, the cell remains in the OFF or "0" state, with no electrical connection between SN0 and REF0.

For a read operation, BL0 is driven high and allowed to float. WL0 is driven to a high voltage and transistor TS0 turns on. BL0 is connected by the conductive channel of transistor TS0 to select node SN0. If cell 3254 is in the ON state, then there will a conductive path between SN0 and REF0 (ground), and the bit line voltage Vrd will decrease as the bit line is discharged through TS0, to SN0, to REF0 (ground). If, however, cell 3254 is in the OFF state, then the path from BL0 through the TS0 channel to SN0 will indicate high impedance (high megaOhm to terraOhm) to REF0 (ground) and bit line voltage Vrd will be unchanged. The sense amplifier/latch circuit (not shown) detects changes in BL0 voltage. If the voltage Vrd on BL0 has decreased, the latch is set to a logic "1" state. If the voltage Vrd is unchanged, then the latch is set to a logic "0" state. The read operation is nondestructive read out (NDRO) of the cell information. Also, if external power is lost, the information in the array is preserved (nonvolatile storage).

Figure 26:
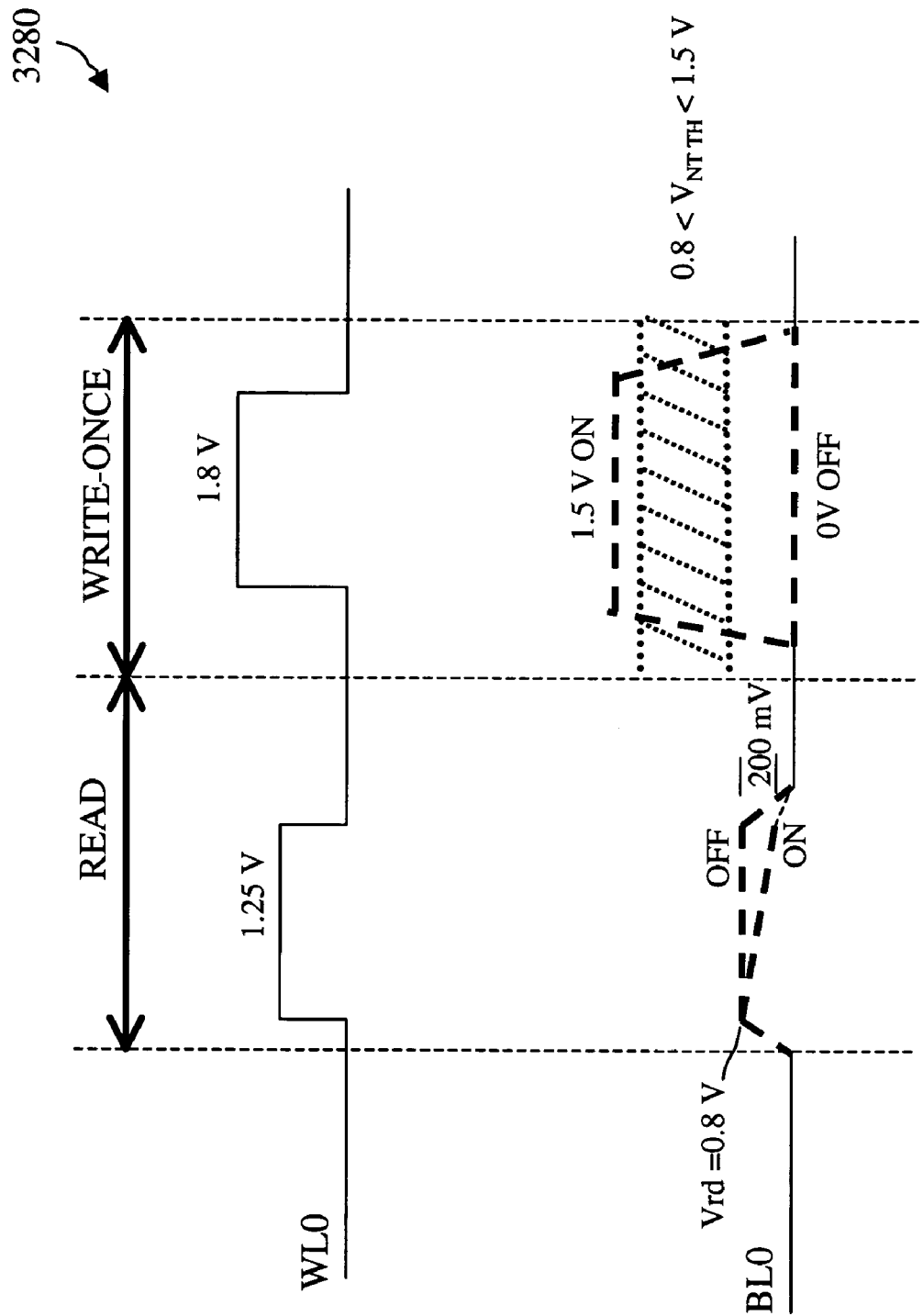
FIG. 26 is an illustration of read and write-once NT-on-Source memory system waveforms of the FIG. 25 memory system.
Figure 26:
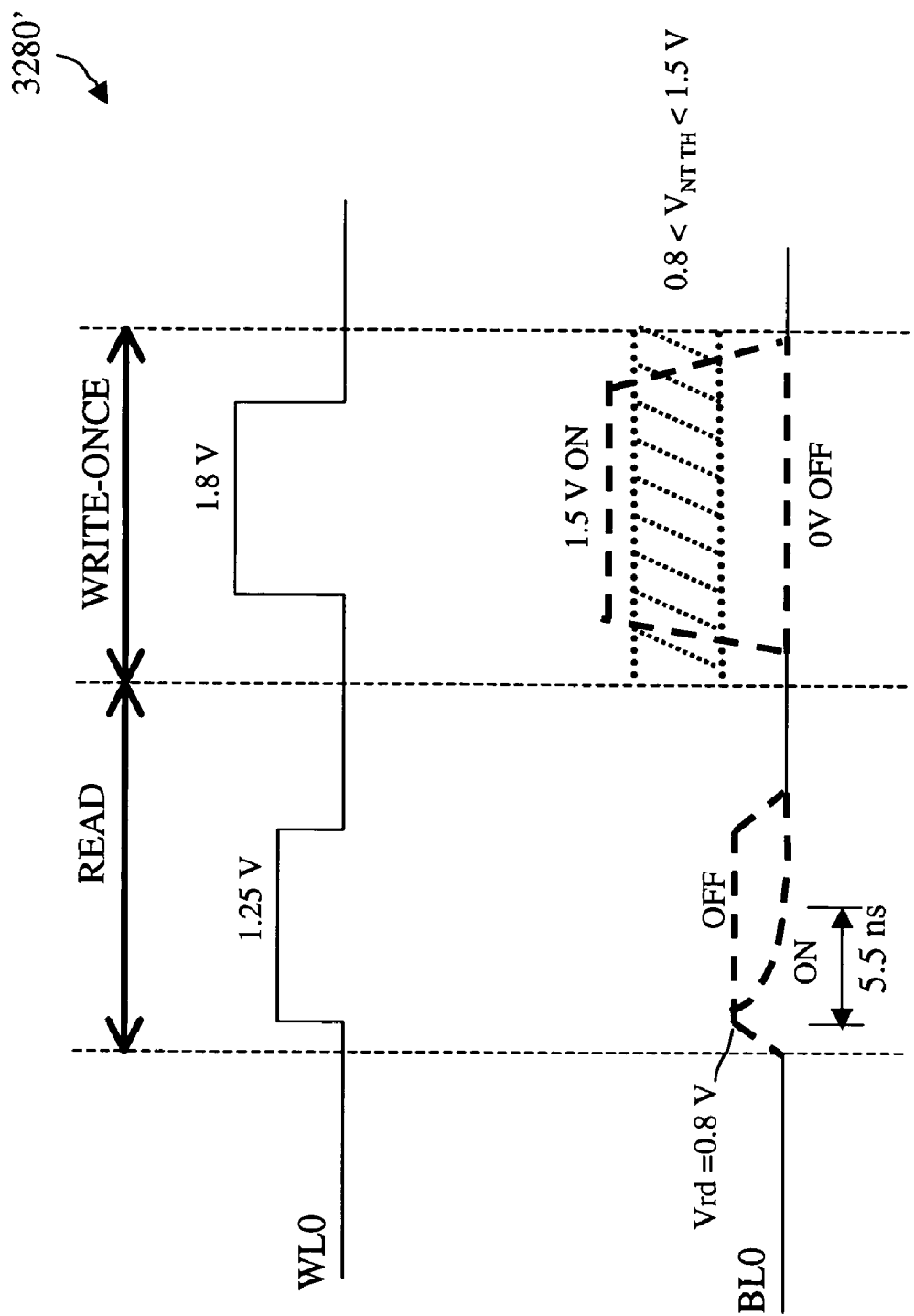

FIG. 26 illustrates the operational waveforms 3280 of memory system 3250, illustrated in FIG. 25, during read and write-once (OTP) operations. During the read operation, cell 3254 is selected by charging BL0 to a voltage Vrd=0.8 volts, for example, and driving WL0 high, 1.25 volts, for example. If the cell is in the OFF (logic "0") state, Vrd is unchanged. If the cell is in the ON (logic "1") state, then the voltage Vrd decreases. The difference in BL0 voltage Vrd between ON and OFF states is typically 200 mv. This difference is amplified and latched (circuit not shown).

All cells in OTP memory array 3250 are in the OFF or open position after fabrication. At the start of the write-once cycle, cell 3254 is in the OFF state. Cell 3254 is selected when BL0 is driven to voltage Vw, which is typically in the 0.8 to 1.5 volt range for writing a logical "1" state (cell transition from OFF to ON) and WL0 is driven to a high voltage, typically 1.8 volts. If BL0 voltage is zero when WL0 is driven to a high voltage, the cell remains in the OFF or logical "0" state. The NT threshold voltage is set in the range of $0.8 < V_{NT\ TH} < 1.5$ volts.

In order to prevent an undesired write during the read operation, lower NT threshold voltage 0.8 volts is used to avoid disturb during read when BL0 is set at 0.8 volts. If a lower NT threshold voltage of 0.5 volts is desired, for example, then BL0 read voltage must be less than 0.5 volts. The upper limit of NT threshold voltage, 1.5 volts, is determined by the WL0 voltage of 1.8 volts. WL0 of 1.8 volts was selected for compatibility with SIA roadmap voltage levels for 130 nm low voltage, high performance, and single poly CMOS semiconductor technology.

The invention provides a dense NT-on-Source OTP NPROM system with non-volatile non-destructive readout (NDRO) memory cell in a memory array that prevents read and write-once interference from adjacent cells.

The NT-on-Source OTP NPROM memory system 3250' illustrated in FIG. 25' is a modification of NT-on-Source array memory system 3250 of FIG. 25, with the same memory cell array, but with a different read and write architecture. More specifically, unlike the memory system 3250, memory system 3250' has no sense amplifier/latch sensing scheme. Each bit lines is connected through a pass device 3265 to a chip data bus 3267 that connects directly with I/O buffers 3269 that interface off-chip to receive and transmit data. I/O buffer 3269 includes a pre-driver circuit and a tri-state OCD for transmitting data off-chip in the conventional manner. I/O buffer 3269 also includes a receiver circuit and a tri-state driver to receive off-chip data in the conventional manner. There are N pass devices, labeled 1, 2, 3 . . . N. One terminal of pass device 3265 connects to each of the N bit lines, BL0 to BLN−1. The other terminal of pass device 3265 connects to the eight data lines (1–8) shared by the N bit lines. Each bit line is also connected through a resistor R, typically 100 to 10,000 Ohms for example, to the bit line voltage source $V_{BL}$. $V_{BL}$ value varies depending on the operation performed. In write mode, $V_{BL}$ is set at Vw=1.5 volts, for example. In read mode, VBL is set at Vrd=0.8 volts, for example.

As in memory system 3250, all nanotubes in the memory array of memory system 3250' are in the OFF or open position after fabrication. The OTP memory allows for unlimited read operations, but only one write operation per bit location. For a write operation, word line decoder/driver 3271 is used to select WL0 which transitions from zero to 1.8 volts, for example, activating N FET devices. Off-chip data is transmitted by eight I/O buffers 3269 to each of the eight data bus lines 3267. Bit line decoder driver 3264 drives I/O select logic circuit 3273 which selects 8 of the N transfer devices. If the data bus voltage is low, zero volts for example, then bit line BL0 is held near zero, and TS0 transmits zero volts to the SN0 switching terminal of NT0 which remains in the OFF state. If the data bus voltage is high, 1.5 volts for example, then transistor TS0 transmits the high BL0 voltage to node SN0 of NT0, and NT0 switches to the ON state. Eight bits in the memory array of memory system 3250' are written simultaneously.

For the memory system 3250' non-destructive read operation, WL0 is selected and N transistors, TS0 to TSN−1 are activated. If NT0 is in the ON state, then current flows from $V_{BL}$, through resistor R, through the channel of transistor TS0, through NT0 to ground and the bit line voltage drops near zero. If NT0 is in the OFF state, then current cannot flow through NT0 to ground and the voltage remains in the high state. N bit lines BL0–BLN−1 are in a low or high voltage state depending on whether the corresponding nanotube NT0 to NT-N−1 is in the ON or OFF state. Bit line decoder/driver 3264 drives I/O select logic circuit 3273 which selects 8 of the N transfer devices. Each of the eight data bus lines 3267 are connected to one of the N bit lines, transmitting the eight selected bits from 8 bit lines to data bus 3267. The pre-driver circuit and tri-state OCD are used to transmit the high or low voltage off-chip for each of the eight I/O terminals. A sense amplifier/latch is not required.

FIG. 26' illustrates the operational waveforms 3280' of memory system 3250' during read and write-once (OTP) operations. The write operation waveforms are the same as those of FIG. 26. During the non-destructive read-out read operation, transistor TS0 is selected by driving word line WL0 to a high voltage, 1.5 volts for example. If NT0 is in the ON state, bit line BL0 current flows from VBL, through resistor R, through the channel of transistor TS0, through NT0 to ground. For a bit line of 250 fF, as a non-limiting example and a resistance value of 10,000 ohms, as a non-limiting example (circuit element R, resistance as illustrated in FIG. 25'), for example, the bit line discharge time constant RC=2.5 ns. The bit line discharge time≈2.2 RC=5.5 ns as illustrated in FIG. 26'. If NT0 is OFF, the bit line remains at a high voltage.

Carbon Nanotube-on-Drain Storage (Memory)

Figure 27A:
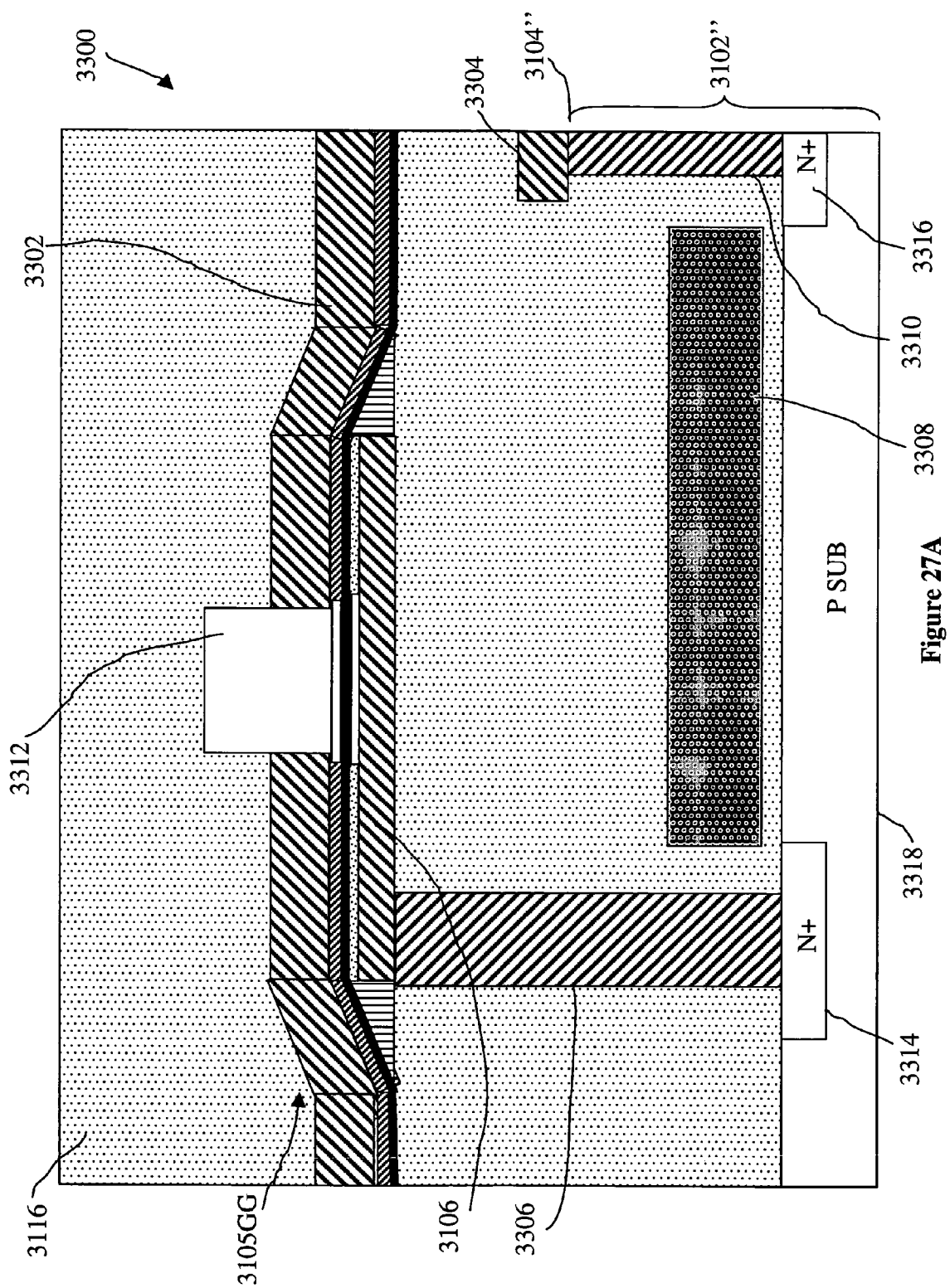
FIG. 27A illustrates a cross section of a semiconductor structure with embedded embodiment 2 nanotube structures in a NT-on-Drain configuration.

A carbon nanotube-on-drain (NT-on-Drain) structure is fabricated using the processes outlined in the flow chart in FIG. 17 (flow chart 3000 and included substeps), the processes outlined in FIG. 18' (step 3000' and included substeps) the processes outlined in the flow chart in FIG. 21' (flow chart 3008' and associated substeps), and the processes outlined in the flow chart in FIG. 22, (step 3036 and associated substeps). The embodiment 2 carbon nanotube structure 3105', illustrated in views 3105AA, 3105BB, and 3105CC of FIGS. 20H–J, is applied on surface 3104 of base 3102. FIG. 27A illustrates nanotube structure 3105GG, which is nanotube 3105' after further processing to define nanotube suspended length and gap regions, applied to the surface 3104'' of base region 3102'', where base region 3102'' is a partially processed NT-on-Drain semiconductor structure and corresponds to 3102 for FIGS. 20H–J. Base region 3102'' is the cross section incorporating all semiconductor structures between the bottom layer of p-substrate 3318 and the top layer of insulator 3116. The 3102'' partially processed structure is formed during step 3002 of flow chart 3000 when fabricating a NT-on-Drain cell structure.

FIG. 27A illustrates a cross sectional view of structure 3300 after completion of substep 3009 of flow chart 3000 (see FIG. 17); (final passivation layer is not shown). FIG. 27A illustrates a cross section of structure 3300, the semiconductor cell region consisting of NMOS FET devices with N+ drain regions 3314, and N+ doped shared source region 3316 in p-type monocrystalline silicon substrate 3318. NMOS FET polysilicon gates 3308 control the FET channel region fabricated in the conventional manner. Shared conductive stud 3310 contacts shared source 3316 and stitching conductor 3304. Stitching conductor 3304 and stud 3310 are optional, depending on the performance requirements of the array. Contact stud 3306, one for each nanotube structure 3105GG, physically and electrically connect NT electrode 3106 to FET drain 3314. The NT structure 3105GG rests on (is supported by) surface 3104'' of semiconductor base structure 3102''. The embodiment 2 nanotube fabric layer (filament or ribbon) 3114 and metal layers 3117 and 3119 form the array bit line 3302. The embodiment 2 nanotube switch region 3105GG is embedded and is a part of nanotube bit line 3302. Void region 3312 is the partially filled remnant of the vertical via used to create gaps 3141A' and 3141B' in NT structure 3105GG. Film thicknesses are in the range of 100 to 200 nm, typical of 130 nm minimum dimension (half-period) semiconductor technology. The NT bit line 3302 total film thickness is on the order of 100–200 nm, of which 1–5 nm is the thickness of the nanotube fabric layer 3114. The NT fabric layer 3114 suspended region length in the NT device region is on the order of 25 to 75 nm, and the switching region segment nanotube fabric layer 3114 of bit line 3302 is separated from the electrode 3106 by a gap 3141A in the range of 2.5 to 10 nm. The NMOS FET channel length is on the order of 100 to 130 nm as defined by polysilicon gate 3308 and diffusions 3314 and 3316. The cross sectional view of structure 3300 of FIG. 27A is taken along bit line 3302 (AA') as illustrated in FIG. 27B.

Figure 27B:
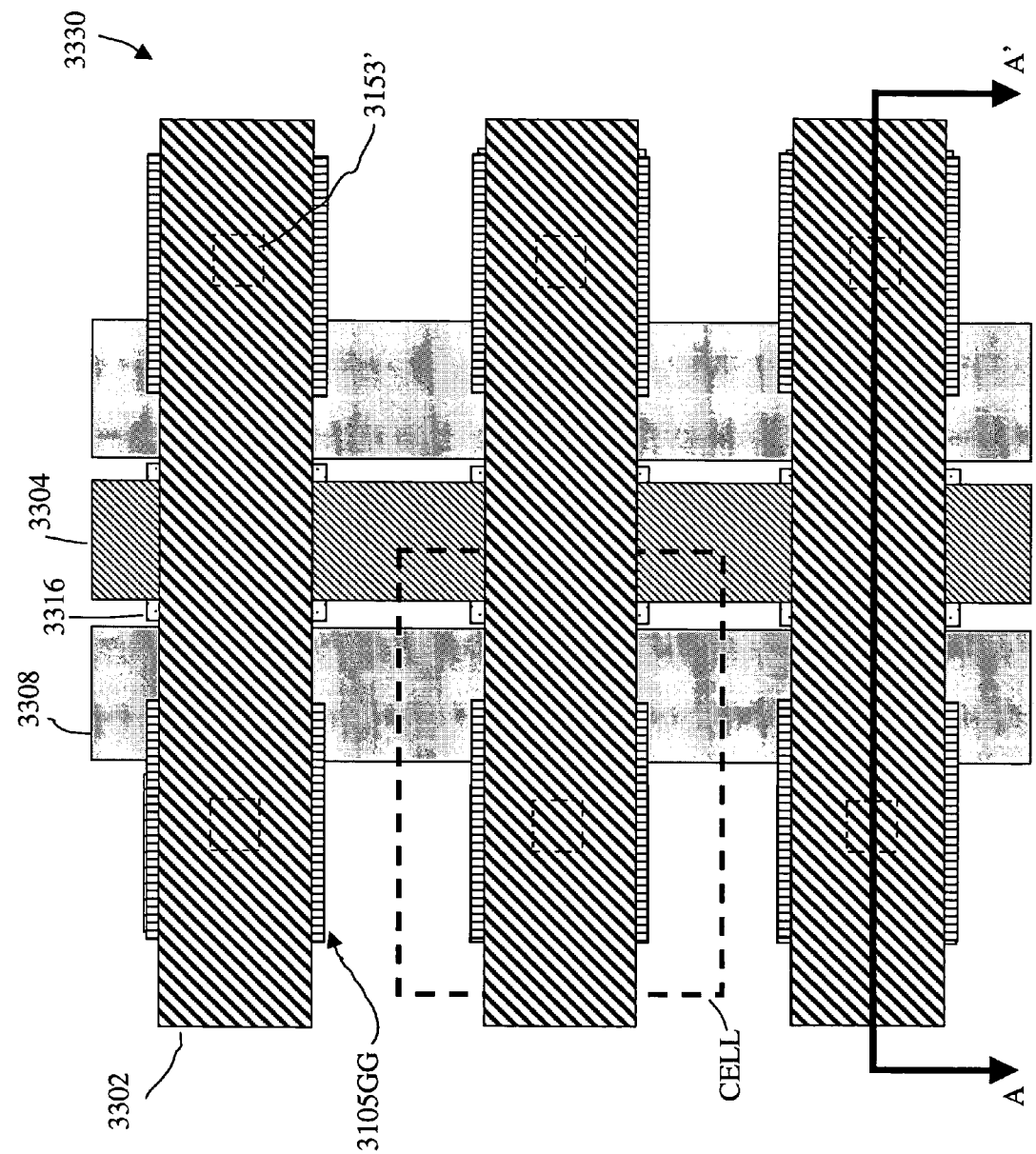
FIG. 27B illustrates a plan view of FIG. 27A.

FIG. 27B illustrates structure 3330 in plan view and includes word line 3308, nanotube bit line 3302, and optional wiring layer 3304. Vertical stud 3306 contacts drain diffusion 3314 and NT structure 3105GG at electrode 3106 (all shown in FIG. 27A). Nanotube structure 3105GG overlays word line 3308 for greater cell density. The nanotube sub-lithographic switch region is 3153'. The cell layout pitch along the bit line requires 3 minimum features (3F), and the cell pitch along the word line requires 2 minimum features (2F), so the NT-on-Drain cell area is $6F^2$.

FIG. 28A is a schematic of single NT-on-Drain cell 3350. Comparing cell schematic 3350 with structure 3330 illustrated in FIG. 27B, word line 3352 corresponds to 3308, NT bit line 3354 corresponds to 3302, drain connection 3358 connects the electrode of NT 3356 to drain 3360, where drain 3360 corresponds to drain 3314. Source 3362 corresponds to 3316, and is grounded. The switching region of nanotube wire 3354 is labeled NT 3356. The select transistor is labeled TS. NT is illustrated in FIGS. 20D–F as 3105, showing different views of nanotube structure 3105. FIG. 28A is a more detailed schematic representation of the FIG. 1A schematic.

FIG. 28B shows a capacitance network for nanotube switch 3356 and drain node 3360. Drain node 3360 has a total capacitance to substrate $C_{DEP}$, between terminals 3360 and 3362. Leakage currents $I_{L-CH}$ and $I_{L-CH}$ flow to substrate and FET channels respectively. Over a period of electrical inactivity of, for example 10 us to 1 ms, charge (electrons) from $C_{DEP}$ will be drained, and the voltage at node 3360 will be zero. When nanotube BL 3354 and word line 3352 are activated to select NT switch 3356, switch 3356 transitions from the OFF to ON state. Non-selected bits (word line at zero) along the bit line 3354 can be disturbed. To avoid disturbing bits, the total duration of the write-once bit line cycle must be much shorter than the discharge time of node 3360. For a capacitance ratio $C_{NT}$=2 $C_{DEP}$, a 1.5 volt transition of bit line 3354 will capacitively couple node 3360 to 1.0 volts, generating 0.5 volts across the NT switch. Selecting NT switches with nanotube threshold voltages $V_{NT\_TH}$ greater than 0.5 volts will prevent unselected bit disturb. A bit write-once time duration of less than 1 us will ensure that leakage-induced voltage decay at node 3360 will not disturb unselected bits.

Figure 29:
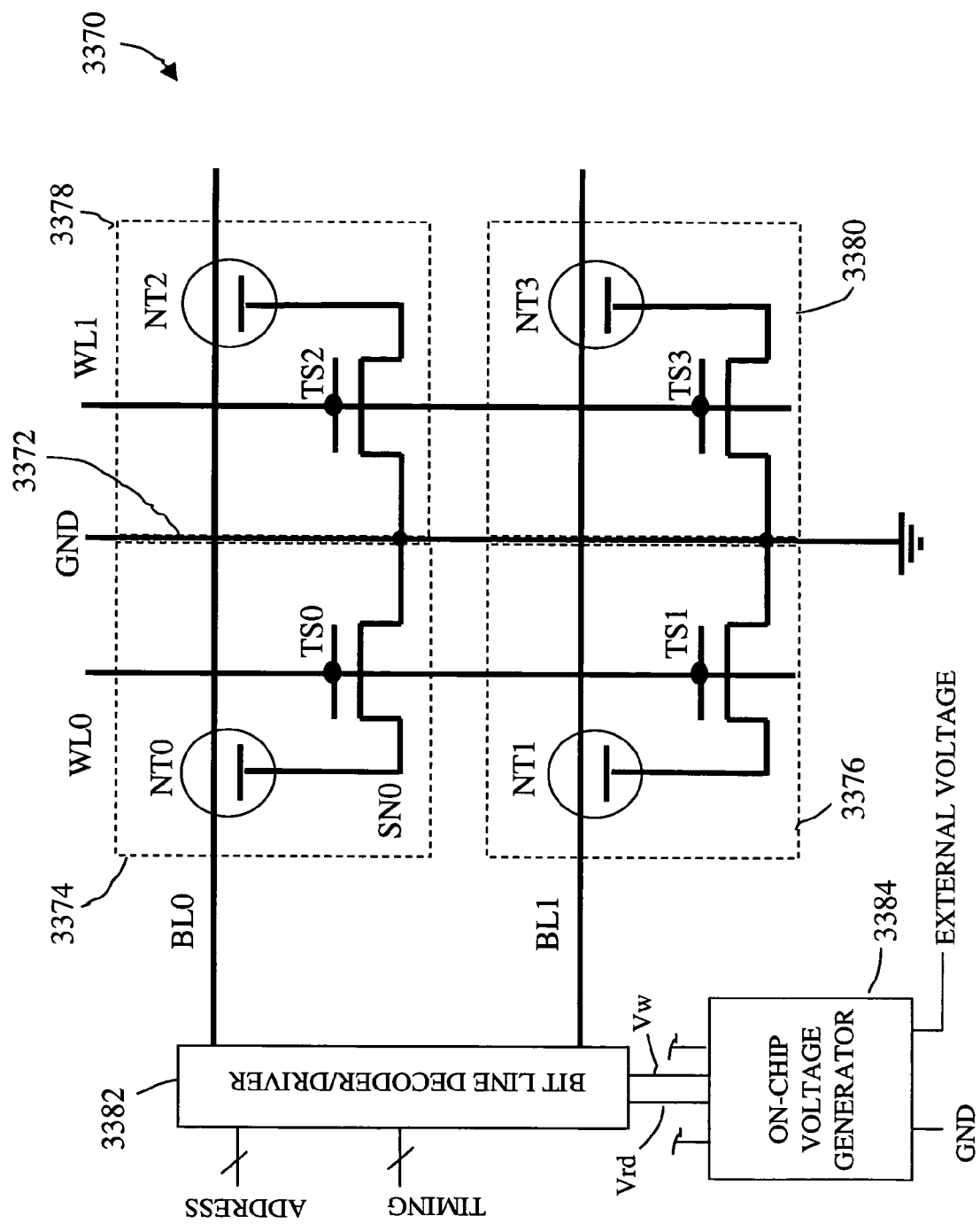
FIG. 29 is a schematic representation of a NT-on-Drain OTP memory system.

FIG. 29 illustrates an NT-on-Drain schematic 3350 which forms the basis of non-volatile storage (memory) OTP NPROM array system 3370. The NT structure forms non-volatile storage cells when integrated with an NMOS FET transistor in a memory array system as illustrated in FIG. 29, comprising a matrix of non-volatile storage cells 3374, 3376, 3378, and 3380 in accordance with a preferred embodiment of the invention. OTP NPROM memory array system 3370 is further comprised of read and write word lines (WL0, WL1, etc.), and read and write bit lines (BL0, BL1, etc.). Bit Line Decoder/Driver 3382 is used to select bit lines to be activated. The bit lines are selected based on the address inputs and timing inputs. The applied bit line voltage levels are generated by On-Chip Voltage Generator 3384. Vrd is the read voltage, and Vw is the write voltage. Non-volatile cell 3374, as with all the other cells of the present invention comprises select transistor TS0, and the nanotube structure comprising nanotube NT0, and select node SN0. The gate of TS0 is coupled to WL0, the drain of TS0 is coupled to select node SN0, which is in turn coupled to the NT0 electrode. NT0 is the switch portion of nanotube array line BL0. Connection 3372 connects common ground to the shared source of transistors TS0 and TS2.

After fabrication, all nanotubes in memory array system 3370 are in the OFF or open position. The OTP memory allows for unlimited read operations, but only one write operation per bit location. For a write operation, transistor TS0 is activated by WL0, and the voltage Vw of nanotube bit line BL0 is applied directly to NT0. If WL0 is high, then TS0 will connect drain node SN0 to ground. If the applied voltage Vw between nodes SN0 and nanotube BL0 exceeds the nanotube threshold voltage $V_{NT\ TH}$, the nanotube structure switches to the ON state or logic "1" state, that is, the switching region of nanotube BL0 connects to select node SN0. The near-Ohmic connection between BL0 and SN0 represents the ON state. If the applied voltage $V_W$ is zero, the cell remains in the OFF or "0" state.

For a read operation, BL0 is driven high and allowed to float. WL0 is driven to a high voltage and transistor TS0 turns on. If NT0 is in the ON state, BL0 is connected by the nanotube switch to SN0. If conductive channel of transistor TS0 is activated, then SN0 is connected to ground through transistor ST0. If cell 3374 is in the ON state, then there will a conductive path between BL0 and ground, and the bit line voltage Vrd will decrease as the bit line is discharged through TS0, to ground. If, however, cell 3374 is in the OFF state, then BL0 is not connected to SN0, and the path from BL0 through the TS0 channel to ground will indicate a high impedance (high megaOhms to terraOhm) to ground, and bit line voltage Vrd will be unchanged. The sense amplifier/latch circuit (not shown) detects changes in BL0 voltage. If the voltage Vrd on BL0 has decreased, the latch is set to a logic "1" state. If the voltage Vrd is unchanged, then the latch is set to a logic "0" state. The read operation is nondestructive read out (NDRO) of the cell information. Also, if external power is lost, the information in the array is preserved (nonvolatile storage).

Figure 30:
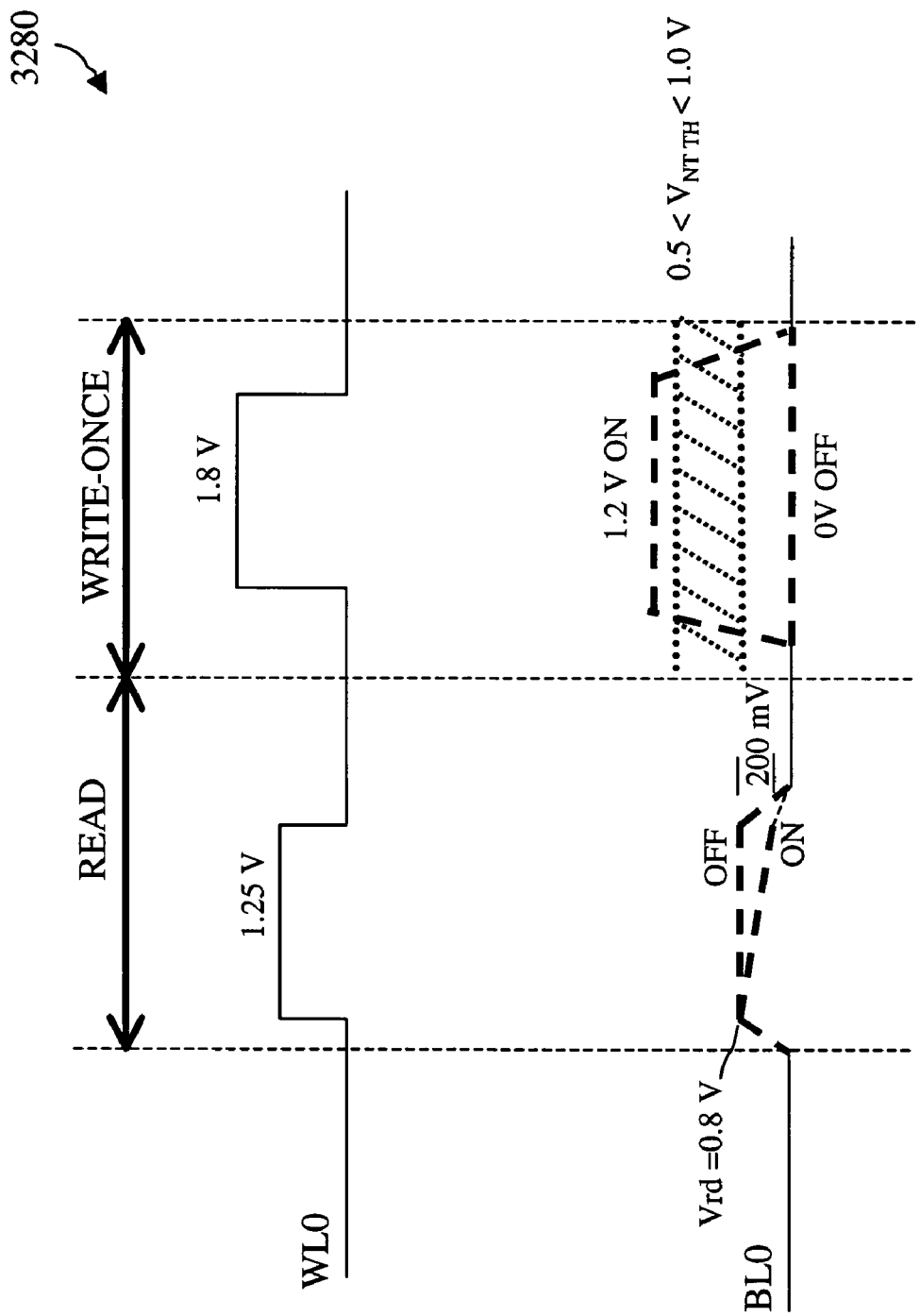
FIG. 30 is an illustration of read and write-once NT-on-Drain memory system waveforms associated with FIG. 29.

FIG. 30 illustrates the operational waveforms 3280 of memory array system 3370 illustrated in FIG. 29 during read and write-once (OTP) operations. During the read operation, cell 3374 is selected by charging BL0 to a voltage Vrd=0.8 volts, for example, and driving WL0 high, 1.25 volts, for example. If the cell is in the OFF (logic "0") state, Vrd is unchanged. If the cell is in the ON (logic "1") state, then the voltage Vrd decreases. The difference in BL0 voltage Vrd between ON and OFF states is typically 200 mv. This difference is amplified and latched (circuit not shown). Alternatively, the read operation may be performed without using a sense amplifier/latch scheme as described for memory array 3250', FIG. 25', and timing diagram 3280', FIG. 26'. The capacitance network of FIG. 28B determines the fraction of the BL0 voltage that appears across NT0 of FIG. 29. If, for example, $C_{NT}=2\ C_{DEP}$, then during read, the voltage applied to drain 3360 is 0.5 volts.

All cells in OTP memory array system 3370 are in the OFF or open position after fabrication. At the start of the write-once cycle, cell 3374 is in the OFF state. Cell 3374 is selected when BL0 is driven to voltage Vw, 1.5 volts for writing a logical "1" state (cell transition from OFF to ON), and WL0 is driven to a high voltage, typically 1.8 volts. If BL0 voltage is zero when WL0 is driven to a high voltage, the cell remains in the OFF or logical "0" state. The capacitance network illustrated in FIG. 28B determines the fraction of the BL0 voltage that appears across NT0 of FIG. 29. If, for example, $C_{NT}=2\ C_{DEP}$, then during write, the 1.5 volts on BL0 is reduced to 1.0 volts across NT0, between the nanotube and the select electrode.

The NT threshold voltage range is selected as $0.5<V_{NT\ TH}<1.0$ volts. The lower band of 0.5 volts is to avoid read disturb (the reading operation triggering unwanted switching of an OFF device to the ON state). The upper bound 1.0 is the maximum voltage across NT0 when write voltage $V_W=1.5$ volts is applied.

The invention provides a dense NT-on-Drain OTP NPROM system with non-volatile non-destructive readout (NDRO) memory cell ($6F^2$) in a memory array that prevents read and write-once interference from adjacent cells.

Carbon Nanotube Electromechanical Field Effect Transistor (NEMFET) (Used in a Carbon Nanotube-on-Gate Storage (Memory) Cell)

The Nanotube Electromechanical Field Effect Transistor or nanotube-on-gate (NT-on-Gate/NEMFET) structure is illustrated schematically in FIG. 1B. In the ON state, the nanotube contacts the gate electrode and the gate electrode voltage is defined by the nanotube voltage. In the OFF state, the gate is not contacted by the nanotube, and floats at an indeterminate voltage. The combined nanotube and FET may be fabricated using a single polysilicon gate industry standard CMOS process. The gate floats when the nanotube switch is in the OFF state. The storage mechanism is an electromechanical switching action, and not electrons stored on the floating gate as is the case with EPROM cells. Accordingly, there are no unique requirements for the gate and surrounding oxides. When the NT switch is in the OFF state, the floating gate voltage is determined by the capacitance coupling network of the structure. Modulating the gate voltage using this capacitance network modulates the voltage across the NT switch and may cause a transition from the OFF to ON. In the ON state, the NT wire is in contact with the polysilicon FET gate, and the polysilicon gate voltage is the same as the NT voltage. The polysilicon FET gate is not floating in the ON state. The carbon nanotube is an integral part of the transistor structure between the control gate and channel region, and the resulting device is a nanotube transistor (NT Transistor).

Figure 31B:
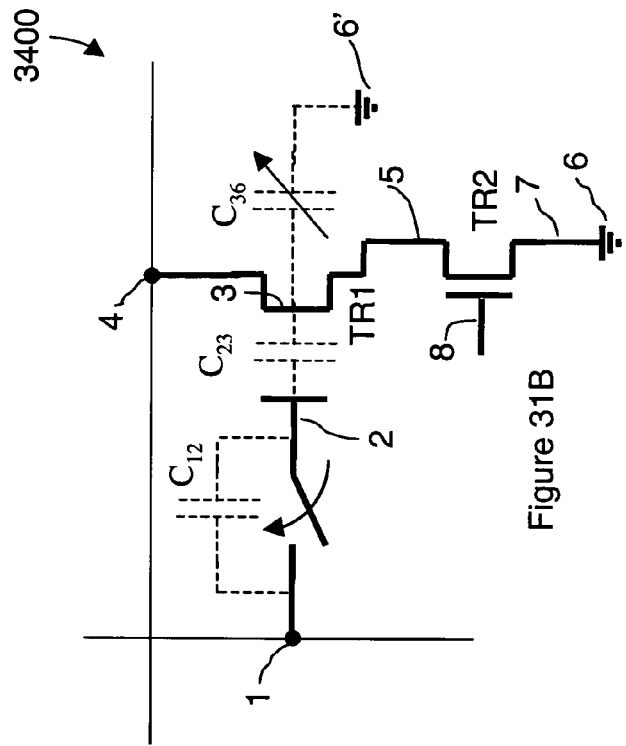
FIG. 31B is a schematic representation of a NT Transistor (NT-on-Gate) OTP memory cell, associated capacitance network, and a select transistor to eliminate adjacent cell disturb.
Figure 31A:
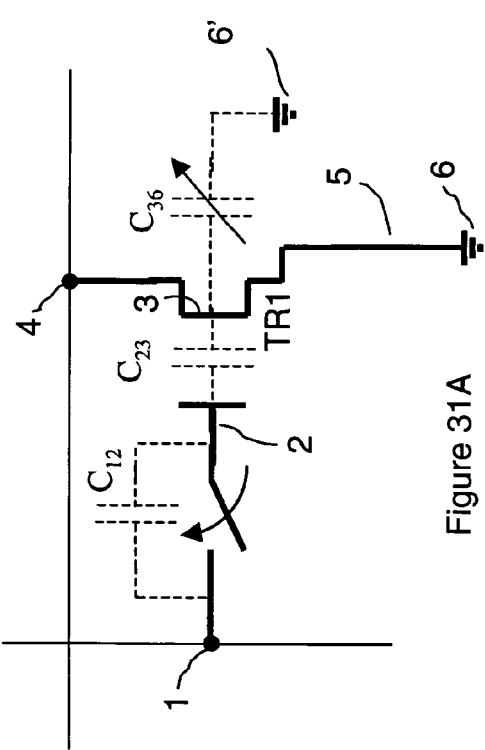
FIG. 31A is a schematic representation of a NT Transistor (NT-on-Gate) OTP memory cell and associated capacitance network.
Figure 31C:
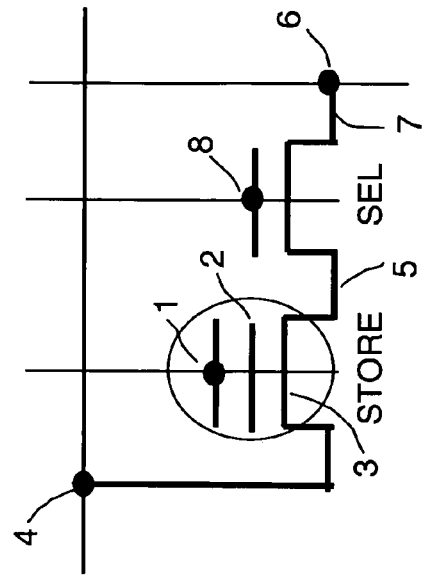
FIG. 31C is a schematic representation of a NT Transistor (NT-on-Gate) OTP memory cell, with transistors of FIG. 31B identified as store and select functions.

FIG. 31A is a schematic representation of FIG. 1B with the coupling capacitances added. Capacitance $C_{12}$ is the NT switch capacitance between the control gate node 1 and node 2, the floating gate. Node 3 indicates the channel region of the transistor TR1. Node 4 is the drain, and node 5 is the source (connected to ground 6) of the transistor TR1. $C_{23}$ is the capacitance between the polysilicon gate and the channel region 3 (gate oxide capacitance). $C_{36}$ is the depletion capacitance between the channel 3 and substrate 6'. For the capacitance network, nodes 6 and 6' are equivalent. When incorporating the schematic of FIG. 31A into a memory array, write disturb can occur. Accordingly, FIG. 31A is modified by adding a second series transistor TR2 between source node 5 and ground node 6 as illustrated in FIG. 31B. The source node 7 of transistor TR2 is connected to ground node 6. The drain node of TR2 and source node of TR1 are common node 5. Gate node 8 is used to select transistor TR2. When TR2 is turned off, sensitivity to bit disturb during write is eliminated. FIG. 31C is a redrawn schematic of FIG. 31B, with TR1 used as the storage node and transistor TR2 as the select transistor.

Figure 32A:
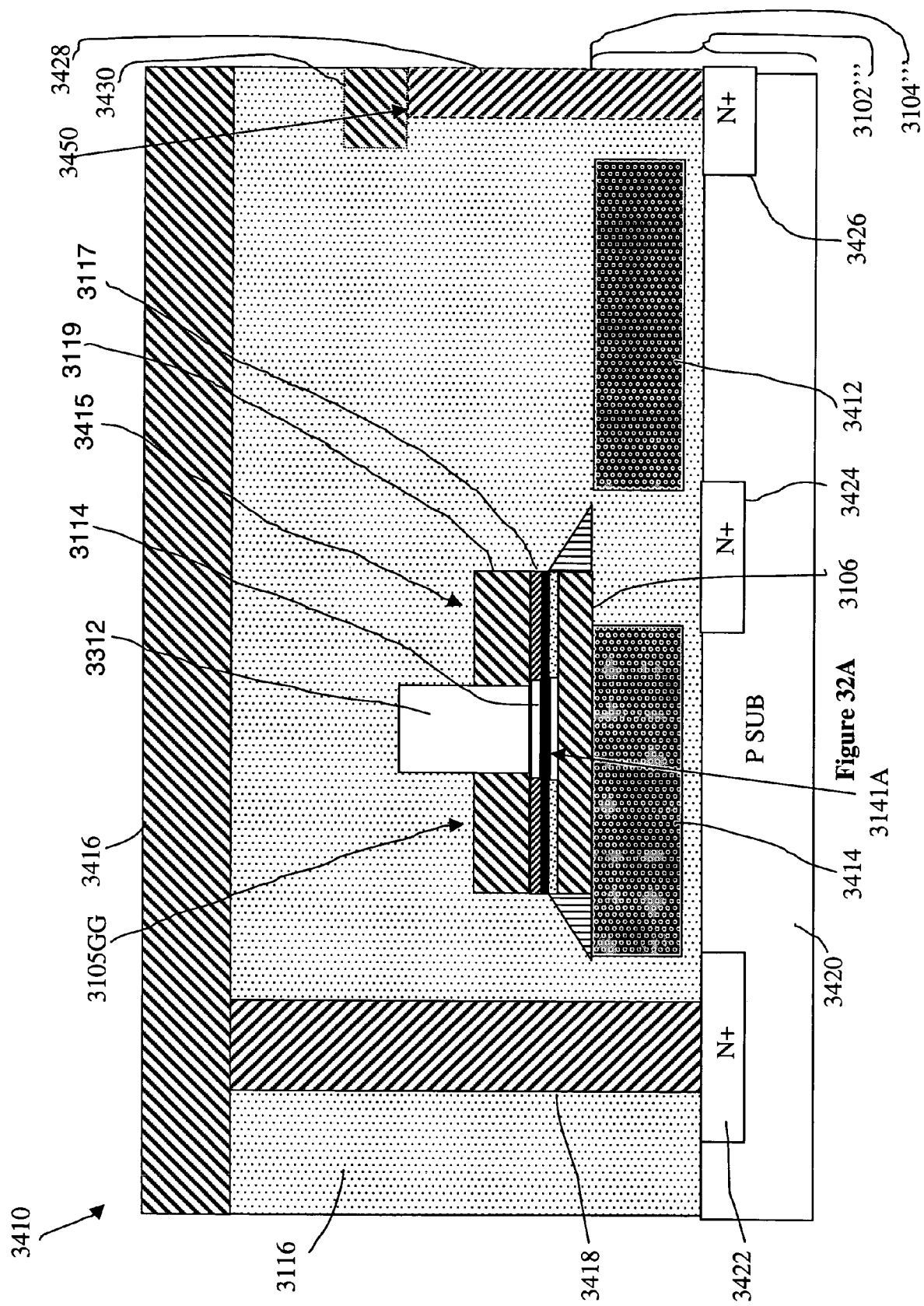
FIG. 32A illustrates a cross section of a semiconductor structure with embedded embodiment 2 nanotube structures in a NT Transistor (NT-on-Gate) configuration.

A carbon nanotube transistor structure is fabricated using process flow chart 3000 of FIG. 17, flow chart 3004' of FIG. 18', flow chart 3008' of FIG. 21', and flow chart 3036 of FIG. 22. The embodiment 2 carbon nanotube structure 3105', illustrated in FIGS. 20H–J as structure 3105', is applied on surface 3104 of base 3102. FIG. 32A illustrates nanotube structure 3105GG, which is nanotube 3105' after further processing to define nanotube suspended length and gap regions, applied to the surface 3104''' of base region 3102''', where base region 3102''' is a partially processed NT-on-Gate semiconductor structure. Base region 3102''' is the cross section incorporating all semiconductor structures between the bottom layer of p-substrate 3420 and the top layer of insulator 3116. The 3102''' partially processed structure is formed during step 3002 of flow chart 3000 when fabricating a NT-on-Gate cell structure. FIG. 32A illustrates intermediate structure 3410 in cross sectional view after completion of step 3009 of flow chart 3000 (final passivation layer is not shown). FIG. 32A illustrates a semiconductor cell region 3410 in cross sectional view, consisting of NMOS FET devices with N+ drain regions 3422, N+ channel continuity diffusion 3424, and N+ doped shared source region 3426 in p-type monocrystalline silicon substrate 3420. NMOS FET polysilicon gates 3414 and 3412 control the FET channel region fabricated in the conventional manner. Shared conductive stud 3428 contacts shared source 3426 and stitching conductor 3430. Stitching conductor 3430 and stud 3428 are optional, depending on the performance requirements of the array. Shared contact stud 3418 contacts shared drain diffusion 3422 and bit line 3416. Each nanotube structure 3105GG overlaps polysilicon gate 3414, physically and electrically connecting NT 3105GG electrode 3106 to FET gate 3414. The NT structure 3105GG rests on (is supported by) the surface 3104''' of semiconductor base structure 3102'''. The embodiment 2 nanotube fabric layer (filament or ribbon) 3114 and metal layers 3117 and 3119 form the array word line 3415. The embodiment 2 NT switch region 3105GG is embedded as part of nanotube word line 3415. Film thicknesses are in the range of 100 to 200 nm, typical of 130 nm minimum dimension (half-period) semiconductor technology. The NT word line 3415 total film thickness is on the order of 100–200 nm, of which 1–5 nm is the thickness of the nanotube fabric layer 3114. The nanotube fabric layer 3114 suspended region length in the NT device region is on the order of 25 to 75 nm, and the switching region segment of nanotube fabric layer 3114 of word line 3415 is separated from the electrode 3106 by gap 3141A in the range of 2.5 to 10 nm. The NMOS FET channel length for the storage device is on the order of 100 to 130 nm as defined by polysilicon gate 3414 and diffusions 3422 and 3424. The NMOS FET channel length for the select device is on the order of 100 to 130 nm as defined by polysilicon gate 3412 and diffusions 3424 and 3426. Void region 3312 is the partially filled remnant of the vertical via used to create gap 3141A of NT structure 3105GG.

Figure 32B:
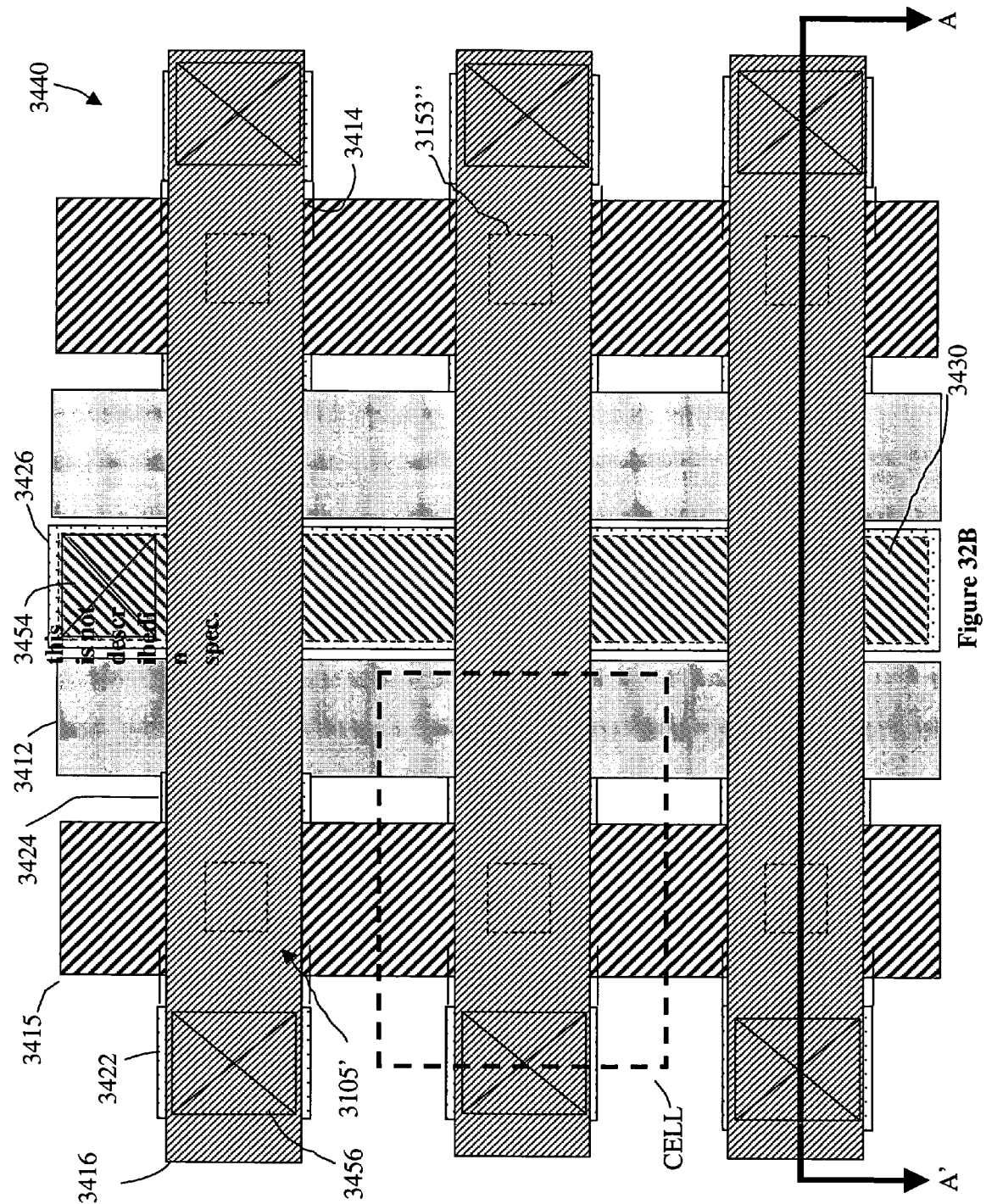
FIG. 32B illustrates a plan view of FIG. 32A.

FIG. 32B shows a plan view of intermediate structure 3440. Note that FIG. 32A illustrates a cross sectional view of intermediate structure 3410, the cross section is taken along bit line 3416 (line A–A') as shown in FIG. 32B.

Intermediate structure 3440 includes nanotube word line 3415, bit line 3416, select line 3412, and optional diffusion wiring stitching layer 3430. In intermediate structure 3105GG, electrode 3106 is in direct electrical contact with gate 3414, and overlaps diffusion 3424 for enhanced density. Bit line 3416 stud 3418 using contact 3456, as illustrated in FIG. 32A. FIG. 32A further illustrates nanotube sub-lithographic switch region 3153''. Optional diffusion stitching layer 3430 contacts stud 3428 [not shown] with contact 3450. Polysilicon gate 3414 controls FET channel between diffusions 3422 and 3424. The cell layout pitch along the bit line requires 4 minimum features (4F), and the cell pitch along the word line requires 2 minimum features (2F), so the NT-on-Gate cell area is $8F^2$. Stud 3428 contacts diffusion 3426 at contact region 3435.

Figure 33:
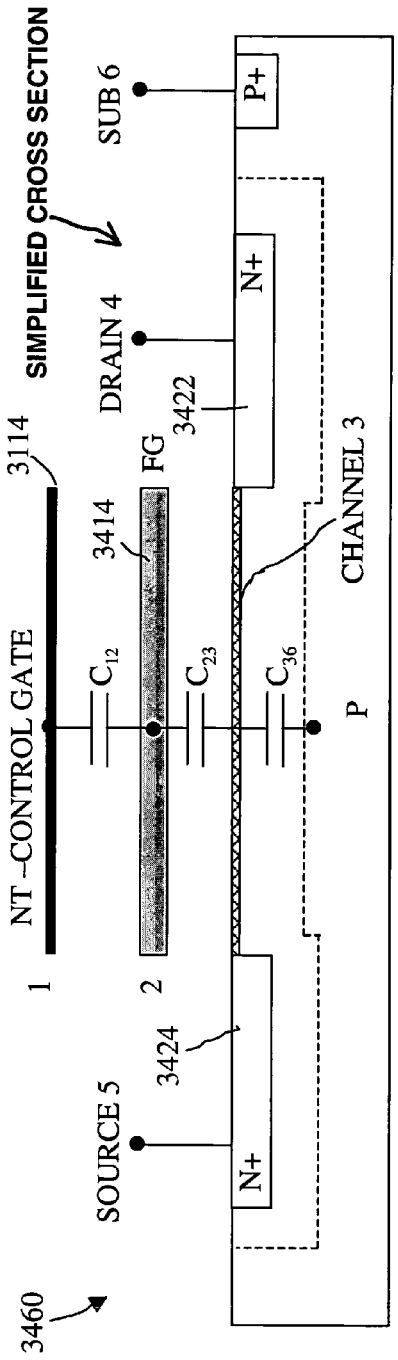
FIG. 33 illustrates a simplified cross section of a NT Transistor (NT-on-Gate) structure with the associated capacitor network.

FIG. 33 illustrates a simplified cross sectional view of the store FET device region 3460 of structure 3410 illustrated in FIG. 32A. The relationship of capacitances $C_{12}$, $C_{23}$, and $C_{36}$ of the schematics of FIGS. 31A and 31B to physical cross section of structure 3410 is illustrated in FIG. 33. In operation, gate node 1, nanotube fabric layer 3114, is switched to a high voltage to capacitively couple FG node 2, polysilicon gate 3414, to a sufficiently high voltage to invert the channel 3 region. Typical threshold voltage for the FET storage device is 0.6 volts.

Figure 34A:
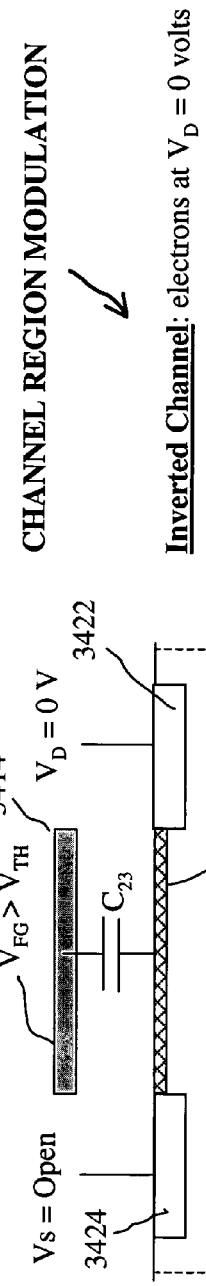
FIG. 34A illustrates a simplified cross section of a NT Transistor (NT-on-Gate) structure with the associated capacitor network as a function of applied voltage for the inverted channel.
Figure 34B:
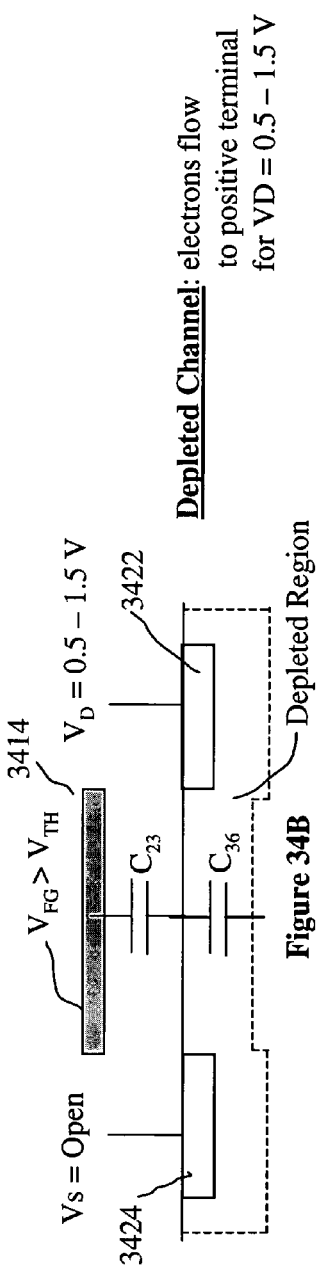
FIG. 34B illustrates a simplified cross section of a NT Transistor (NT-on-Gate) structure with the associated capacitor network as a function of applied voltage for the depleted channel.

FIGS. 34A and 34B illustrate simplified cross sections of a NT Transistor (NT-on-Gate) structure with the associated capacitor network as a function of applied voltage for the inverted channel and for the depleted channel, respectively. FIGS. 34A and 34B further illustrate the FG node 2 voltage modulation mechanism used to program (write) the cell. The select transistor is turned off during the write operation and node 5, source diffusion 3424, floats. If node 4 drain 3422 voltage $V_D=0$, the channel 3 remains as an inverted region, and capacitor $C_{36}$ is not part of the capacitor network. Capacitor $C_{23}$ holds FG node 2, polysilicon gate 3414, at a relatively low voltage. Therefore, a relatively high voltage appears between nodes 1 and 2, across capacitor $C_{12}$ and nanotube fabric layer 3114 switches from OFF (open) to ON (closed). If, however, node 4 drain diffusion 3422 is at $V_D=0.5$ to 1.5 volts, as illustrated in FIG. 34B for example, then electrons are depleted from the channel region, and the inverted channel 3 disappears, and depletion region capacitor $C_{36}$ is included in the network. This increased capacitive decoupling of FG 3414 from the channel, the FG voltage rises, and the difference in voltage between FG 3414 and nanotube fabric layer 3114 is reduced, and nanotube fabric layer (switch) 3114 remains in the OFF state. The principle of operation, relative capacitance values, and voltages are illustrated in U.S. Pat. No. 6,369,671, FIG. 1B and corresponding text.

FIG. 35A illustrates the capacitor network, relative capacitance values, and voltages for write "1", NT switches from OFF to ON. FIG. 35B illustrates the capacitor network, relative capacitance values, and voltages for write "0", with NT switch remaining in the OFF state. For nanotube fabric layer 3114 control gate voltage $V_{CG}=1.8$ volts, if diffusion 3422 $V_D=0$, then FG 3414 voltage $V_{FG}=0.4$ V or 0.4 volts. The voltage between nanotube fabric layer 3114 and FG 3414 (electrically connected to electrode 3106), referred to as NT switching voltage $V_{NT\_SEL}=1.4$ volts. If, however, diffusion 3422 voltage $V_D=0.5$ to 1.5 volts, then the NT switching voltage $V_{NT\_SEL}=0.8$ volts. Nanotube fabric layer 3114 switching threshold voltage is therefore selected as 0.8 volts$<V_{NT\_TH}<1.4$ volts.

Figure 36:
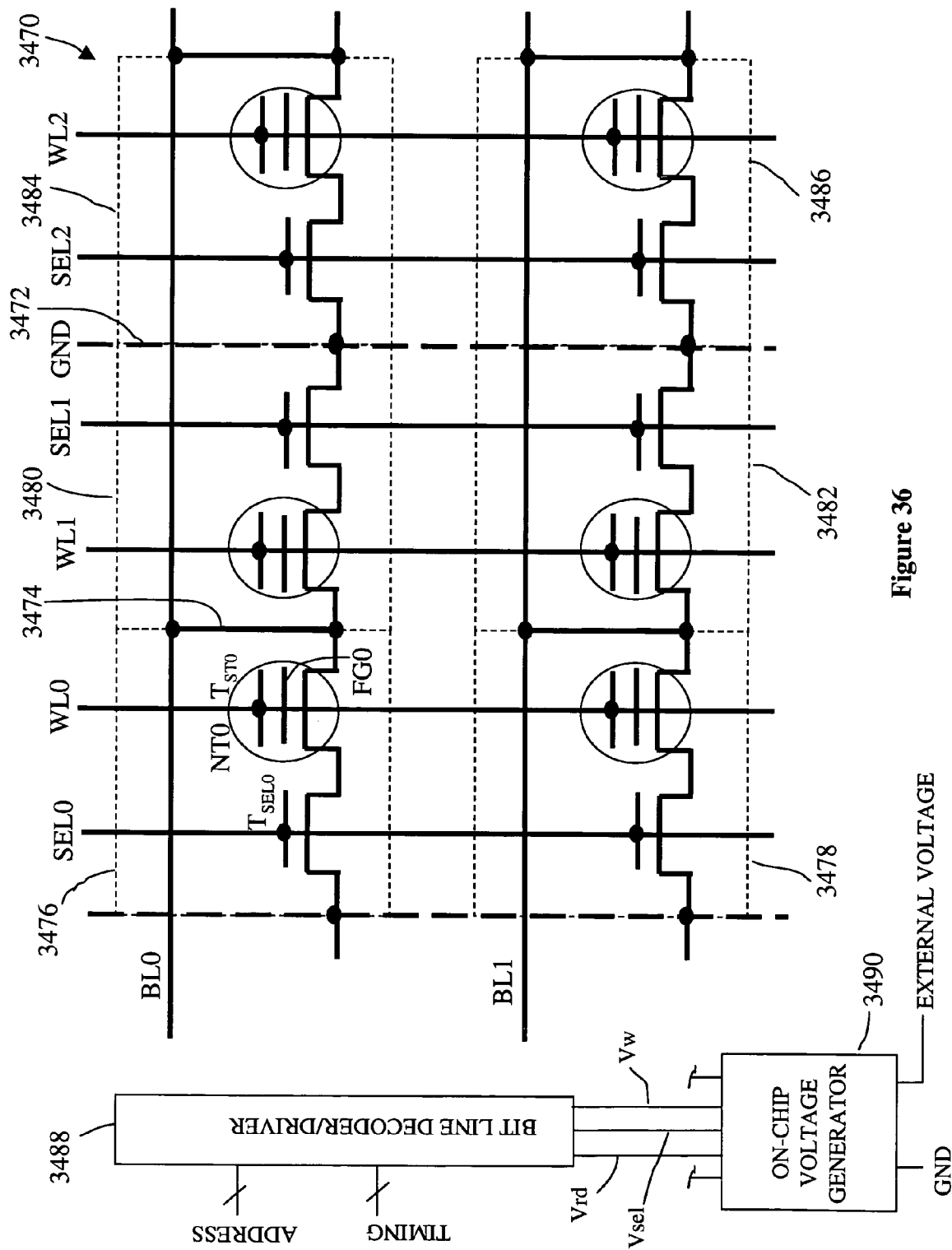
FIG. 36 is a schematic representation of a NT Transistor (NT-on-Gate) OTP memory system.

FIG. 31C illustrates NT-on-Gate schematic 3400, which forms the basis of non-volatile storage (memory) OTP NPROM array system 3470, illustrated in FIG. 36. The NT structure forms non-volatile storage cells when integrated with an NMOS FET transistor in a memory array system as illustrated in FIG. 36, comprising a matrix of non-volatile storage cells 3476, 3478, 3480, 3482, 3484, and 3486 in accordance with a preferred embodiment of the invention. OTP NPROM memory array 3470 is further comprised of: read and write word lines (WL0, WL1, etc.), read and write bit lines (BL0, BL1, etc.), and read and write select lines (SEL0, SEL1, etc.). Bit Line Decoder/Driver 3488 is used to select bit lines to be activated. The bit lines are selected based on the address inputs and timing inputs. The applied bit line voltage levels are generated by On-Chip Voltage Generator 3490. Vrd is the read voltage, Vw is the write voltage, and $V_{SEL}$ is the select voltage. Non-volatile cell 3476, as with all the other cells of the present invention, comprises storage transistor $T_{STO}$, the nanotube structure comprising nanotube NT0 that includes floating gate FG0, and select transistor $T_{SEL0}$. The gate of $T_{STO}$ is coupled to WL0, the drain of $T_{STO}$ is coupled to BL0, the source of $T_{STO}$ is coupled to the drain of select transistor $T_{SEL0}$, and source of select transistor $T_{SEL0}$ is coupled to common ground 3472. NT0 is the switch portion of nanotube word line WL0. Connection 3474 connects BL0 to the shared drain of transistors $T_{STO}$ and $T_{ST2}$.

After fabrication, all nanofabric switches in array 3470 are in the OFF or open position. The OTP memory allows for unlimited read operations, but only one write operation per bit location. For a write operation, transistor $T_{STO}$ is activated by WL0, and the voltage Vw of BL0 is applied to the drain of transistor $T_{STO}$. Select transistor $T_{SEL0}$ is off, isolating the node of transistor $T_{STO}$. If the applied bit line voltage Vw=0, nanotube threshold voltage $V_{NT\ TH}$ is exceeded and the nanotube structure switches to the ON or logic "1" state, that is, nanotube WL0 electrically connects to the gate of transistor $T_{STO}$. The near-Ohmic connection between WL0 and the gate of $T_{STO}$ represents the ON state. If the applied voltage $V_W$=0.5–1.5 volts, the cell remains in the OFF or "0" state. The switching mechanism for NT-on-Gate is as explained in FIGS. 34A, 34B, 35A, and 35B.

For a read operation, BL0 is driven high and allowed to float. Select transistor $T_{SEL0}$ is turned on, WL0 is driven to a high voltage. If the NT0 is in the ON state, then WL0 is connected to the floating gate FG0 (not floating when connected), transistor $T_{STO}$ turns on, BL0 is connected to ground through the FET channels of transistor $T_{STO}$ and transistor $T_{SEL0}$, and the bit line voltage Vrd will decrease as the bit line is discharged. If, however, cell 3476 is in the OFF state, then WL0 is not connected to floating gate FG0, the voltage coupled to the floating gate remains below the threshold voltage of FET device $T_{STO}$, and BL0 is not discharged, and voltage Vrd is unchanged. The sense amplifier/latch circuit (not shown) detects changes in BL0 voltage. If the voltage $V_{rd}$ on BL0 has decreased, the latch is set to a logic "1" state. If the voltage $V_{rd}$ is unchanged, then the latch is set to a logic "0" state. The read operation is nondestructive read out (NDRO) of the cell information. Also, if external power is lost, the information in the array is preserved (nonvolatile storage).

Figure 37:
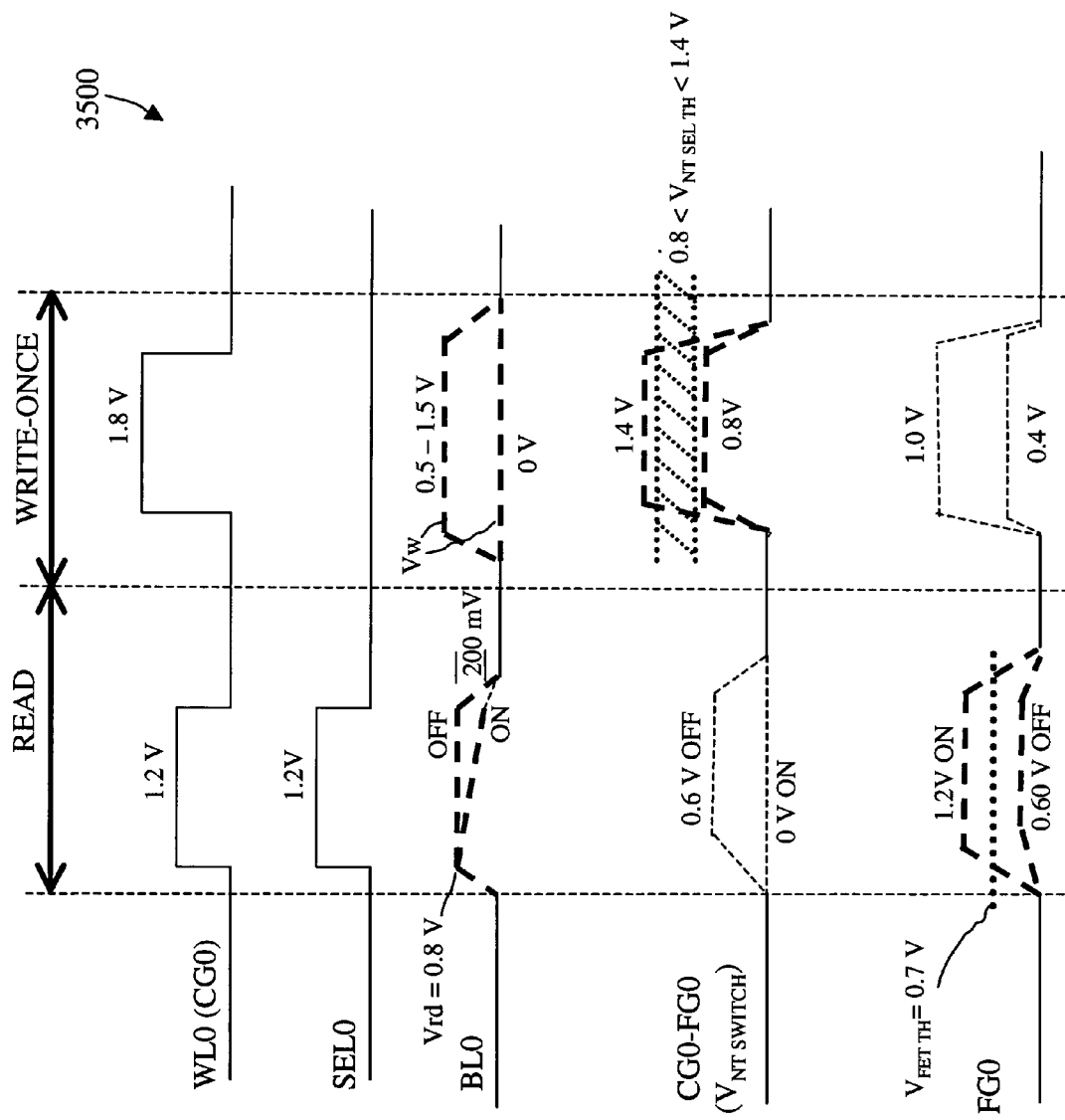
FIG. 37 is an illustration of read and write-once NT Transistor (NT-on-Gate) memory system waveforms for the memory system illustrated in FIG. 36.

NT-on-Gate memory system 3470 has all the nanotubes in the OFF position after fabrication. Referring to the timing diagram 3500 of FIG. 37, the write-once operation to turn nanotube switch NT0 to the ON state, requires bit line BL0 voltage $V_D$=0. The voltage applied between the nanotube word line WL0 and the floating gate is determined by the WL0 voltage and the coupling capacitance coupling ratios. For a WL0 voltage [of?] 1.8 volts, the floating voltage $V_{FG0}$=0.4 volts, and the nanotube switching voltage $V_{NT\ SWITCH}$=1.4 volts as illustrated in FIG. 37. For a NT0 structure with select threshold $V_{NT\ TH}$<1.4 volts, device NT0 switches to the ON state. To leave device NT0 in the OFF state, Vd is held in the 0.5 to 1.5 volt range. The floating gate transitions to 1.0 volts, illustrated in FIG. 37. Therefore, the NT0 select voltage is limited to $V_{NT\ SELECT}$=0.8 volts. For a NT0 structure with select threshold $V_{NT\ TH}$>0.8 volts, nanotube NT0 remains in the OFF condition. The NT0 structure threshold voltage requirement during write mode is $0.8 < V_{NT\ TH} < 1.4$ volts. The source voltage Vs of $T_{STO}$ (not shown) is left open (not used) during the write operation.

During the read operation, select transistor $T_{SEL0}$ is turned on, providing a conductive path to ground. BL0 is selected by the peripheral bit decoder/driver (not shown), set high and released at Vd=0.8 volt. WL0 transitions to 1.2 volts. If NT0 is in the ON state, with an FET threshold voltage $V_{FET\ TH}$=0.7 volts, $T_{STO}$ is turned on, a channel is formed by transistor $T_{STO}$, and BL0 is discharged. If, however, NT0 is in the OFF state, then word line WL0 voltage is capacitively coupled to the floating gate FG0, with FG0 switching to 0.60 volts. For an FET threshold voltage $V_{FET\ TH}$=0.7 volts, the FET channel of device $T_{STO}$ remains off, and the BL0 is not discharged. Alternatively, the read operation may be performed without using a sense amplifier/latch scheme as described for memory array 3250', FIG. 25', and Timing Diagram 3280', FIG. 26'.

FIGS. 38A–E illustrate the operation of the NT transistor 3800. FIG. 38A is a schematic of NT transistor 3800 with the nanotube in the ON position, as also illustrated in FIG. 35A. FIG. 38B is a more detailed schematic representation of NT transistor 3800 with the nanotube in the ON position. FIG. 38C is a schematic of NT transistor 3800 with the nanotube in the OFF position, as also illustrated in FIG. 35B. FIG. 38D is a more detailed schematic representation of NT transistor 3800 with nanotube in the OFF position. FIG. 38E illustrates the operation 3802 of Nanotube Transistor 3800 in both the ON and OFF position. NT transistor 3800 is in the OFF state as fabricated and can be changed once to the ON state. It can be read an unlimited number of times in the ON or OFF state. If NT transistor 3800 has the nanotube in the ON state (NT-ON), then the control gate CG is in physical and electrical contact with polysilicon gate 3804 which is therefore a non-floating gate (NON-FG). The nanotube control gate CG directly controls the FET channel region between the FET drain (D) and source (S) diffusions. The current flow from drain to source $I_{DS}$ as a function of control gate voltage $V_{CG}$ is illustrated by 3806, FIG. 38E. $V_{CG}$=1.2 volts is applied directly across the gate oxide $C_{OX}$, illustrated as $C_{23}$ in FIGS. 35A&B. If $V_{CG}$=1.2 volts is applied, for example, then current flows between source and drain. Typical $I_{DS}$ current in is 10–25 microamperes, multiplied by the width to length ration (W/L) of the FET device, for example. If, however, NT transistor 3800 has the nanotube in the OFF state (NT-OFF), then the electrical characteristics 3808 of NT Transistor 3800 illustrate that no current $I_{DS}$ will flow between source and drain with control gate voltage $V_{CG}$=1.2 volts. This is because $V_{CG}$ is now capacitively coupled to polysilicon gate 3804. This capacitance $C_{12}$ is illustrated in FIGS. 35A&B. The capacitance of gate 3804 to channel region $C_{23}$ is modulated by the state of the channel region. When the $V_{CG}$ voltage results in the FET device near threshold voltage Vth, the capacitance of gate 3804 is reduced to $0.25 \times C_{OX}$ (see Itoh, K. "VLSI Memory Chip Design", Springer, 2001, page 58, FIG. 2.9a), or $0.25 \times C_{23}$, where $C_{23}$ is defined in FIGS. 35A&B. $V_{GS}$ applied to the channel region at the onset of conduction is therefore ½ $V_{GS}$. Therefore, if a nanotube in the OFF state, 0.5 $V_{CG}$, or in this example 0.6 volts, is applied to the channel region, and the FET with a Vth=0.7 volts will not conduct. In a memory application, if a selected NT transistor 3800 is in the ON state, and has a voltage 1.2 volts applied to the control gate CG, it will conduct. If NT transistor 3800 is in the OFF state, it will not conduct with 1.2 volts applied to the control gate CG. If the transistor is unselected, then zero volts is applied and the NT transistor and will not conduct current in either ON of OFF state.

Transistor 3800 illustrated in FIGS. 38A–E is in the OFF state when fabricated. The nanotube transistor control gate may be programmed (written) once to the ON state. It may be read an indefinite number of times in either the ON state or the OFF state. It is desirable to enhance the function of transistor 3800 such that the control gate may be programmed (written) an indefinite number of times, while retaining the ability to read an indefinite number of times. This may be accomplished by introducing a release electrode that restores the nanotube from the ON state to the OFF state.

FIGS. 39A–D illustrate sequential cross sectional views of process steps for fabricating embodiment 3 nanotube structure 3900, with a release gate (node), creating a nanofabric that may be switched (written) from the OFF state to the ON state, and released from the ON state to the OFF state, for an unlimited number of times.

Embodiment 3 nanotube switch structure 3009 may be incorporated in transistor structure 4000, illustrated in FIGS. 40A–40E, creating a transistor that can be programmed (written) from OFF to ON, and released from ON to OFF and unlimited number of times. Instead of embedding structure 3900 in the transistor structure; structure 3900 may be used separately with a select transistor and an array release line to enhance memory system operation from an OTP function, to a read/program/write NRAM function by using structure 3900. An example is the NT-on-Source OTP memory array/system illustrated in FIGS. 23H'', 23I'', 25, and 25' that may be changed to random access non-volatile nanotube random access memory (NRAM) 5000 illustrated schematically in FIG. 41. Memory system 5000 timing diagram 5500 illustrating the additional release-before-write feature is illustrated if FIG. 42.

FIG. 39A illustrates a modification of the structure illustrated in FIG. 20I. In FIG. 39A conductor 3902 is deposited directly on nanotube fabric layer 3114. Conductor 3902 may be aluminum or tungsten, for example, with a thickness in the range of 100–200 nm. If desirable, conductor 3902 may consist of at least two conductive layers, such as 3117 and 3119 as in FIG. 20I, however, for FIG. 39A conductive layer 3117 is not a second sacrificial gap layer. Sub-lithographic image 3904 is defined using fabrication methods similar to those used when etching conductor 3119, FIG. 23F'''. Second sacrificial gap layer 3906 is conformally deposited as illustrated in FIG. 39B. Second sacrificial gap layer 3906 may be TiW, for example, of thickness 1.5 nm, for example. Conductor 3908 may then be deposited and planarized as illustrated in FIG. 39C. Second sacrificial gap layer 3906 may be etched (removed) creating gap region 3910 between conductors 3908 and 3902, and gap 3910' between conductor 3902 and nanotube fabric layer 3114. Gap region 3910' is of sub-minimum dimensions. The portion of first sacrificial gap layer 3108A just below gap region 3910' is then etched forming gap region 3912. Nanotube fabric layer 3114 switch region 3914 is thus released, with a sub-lithographic minimum of 25 to 75 nm, for example, and a gap to switch electrode 3106 of 1.5 to 10 nm, for example, resulting in embodiment 3 nanotube structure 3900. The gap between nanotube switch region 3914 and release electrode 3908 may be 5 to 20 nm, for example.

Figure 40C:
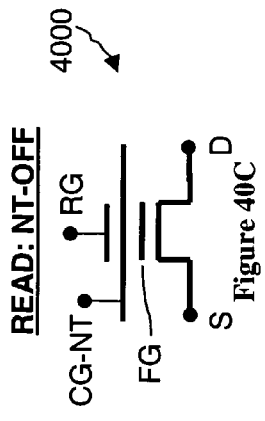
FIG. 40C is a schematic of a Read/Release/Write NT Transistor with an embodiment 3 nanotube fabric in the OFF state.
Figure 40D:
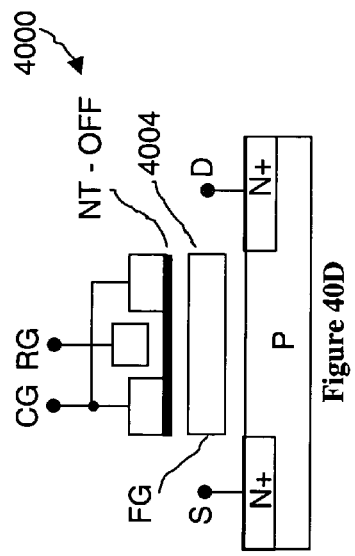
FIG. 40D is a more detailed schematic of a Read/Release/ Write NT Transistor with an embodiment 3 nanotube fabric in the OFF state.
Figure 40A:
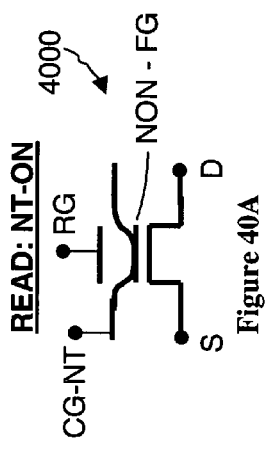
FIG. 40A is a schematic of a Read/Release/Write NT Transistor with an embodiment 3 nanotube fabric in the ON state.
Figure 40B:
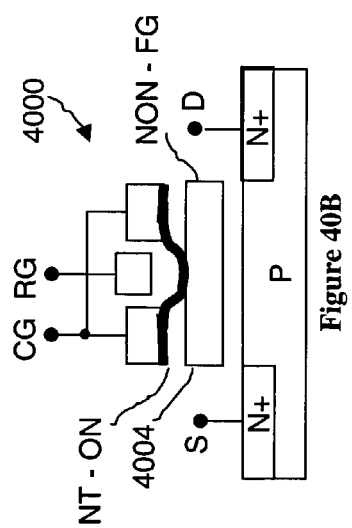
FIG. 40B is a more detailed schematic of a Read/Release/ Write NT Transistor with an embodiment 3 nanotube fabric in the ON state.
Figure 40E:
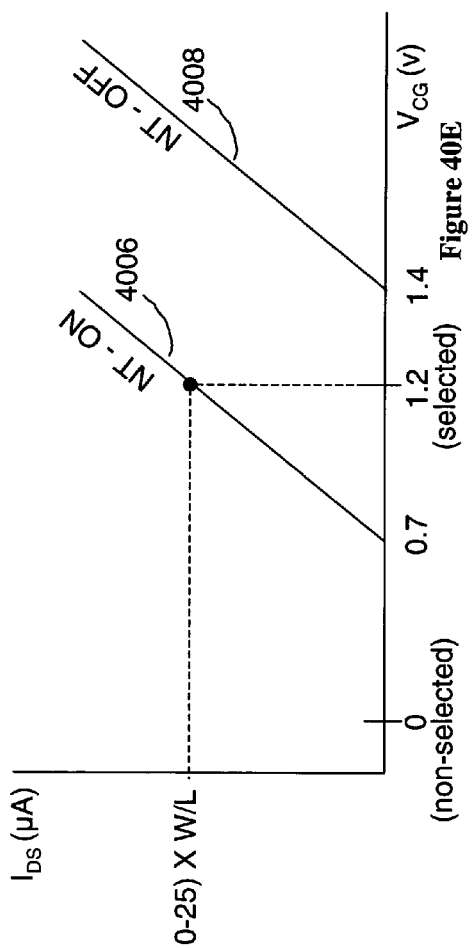
FIG. 40E is a Read/Release/Write NT Transistor illustration of electrical characteristics for an embodiment 3 nanotube fabric in the ON state and OFF state.

FIGS. 40A–E illustrate nanotube transistor (NT Transistor) 4000. Transistor 4000 is similar to transistor 3800, except that release gate RG has been added to provide the nanotube release function ON to OFF to permit re-programming (re-writing) of transistor 4000 for an unlimited number of times. Polysilicon gate 4004 corresponds to polysilicon gate 3804 for transistor 3800. A typical release threshold voltage range is 1.5 to 2.5 volts, for example. The electrical characteristics 4002 of transistor 4000 are illustrated in FIG. 40E. The description of the electrical characteristics 4002 are the same as those for electrical characteristics 3802. NT Transistor 4000 ON state (NT-ON) characteristics 4006 and OFF state (NT-OFF) characteristics 4008 are illustrated in FIG. 40E. The read and write operation for NT Transistor 4000 are the same as for NT Transistor 3800. NT Transistor 4000 has the additional release operation to release transistor 4000 from the OFF to the ON state.

Memory subsystem schematic 5000, illustrated in FIG. 41, is similar to memory system 3250' illustrated in FIG. 25', with OTP embodiment 2 nanotube structure 3105GG replaced by read/release/write NRAM embodiment 3 nanotube structure 3900 and the addition of N memory array release lines RL0–RL N−1, as illustrated in FIG. 39D. The word decoder/word & reference line drivers 3271' to select word lines using row (word) address bits has been modified to also select reference lines to prevent release lines from releasing nanotubes associated with unselected word lines. Bit line decoder/driver 3264' decodes the column (bit or data) line address bits in the conventional manner. I/O select logic 3273 has been modified I/O and RL select logic to include selecting bit lines or release line transistors using the bit line decoder 3264' output, and timing/control signals that identify the mode of operation and thus I/O select logic 3273' is shown in FIG. 41. The outputs of I/O select logic 3273' connect eight of the N bit lines to data bus 3267' using transistors 3265 for read and write operations, or connect eight of the N release lines to corresponding release pulses using transistors 3265' for the release operation. RL timing pulses are synchronized to chip other chip timing pulses by the timing/control input. I/O buffer 3269' controls the data input and output of the NRAM memory subsystem. The memory system outlined in schematic 5000 is expected to use redundant bit and word lines (not shown) for yield enhancement purposes in the conventional manner (see Itoh, K., "VLSI Memory Chip Design", Springer 2001, chapter 3, section 3.9, pages 178 to 183).

Figure 42:
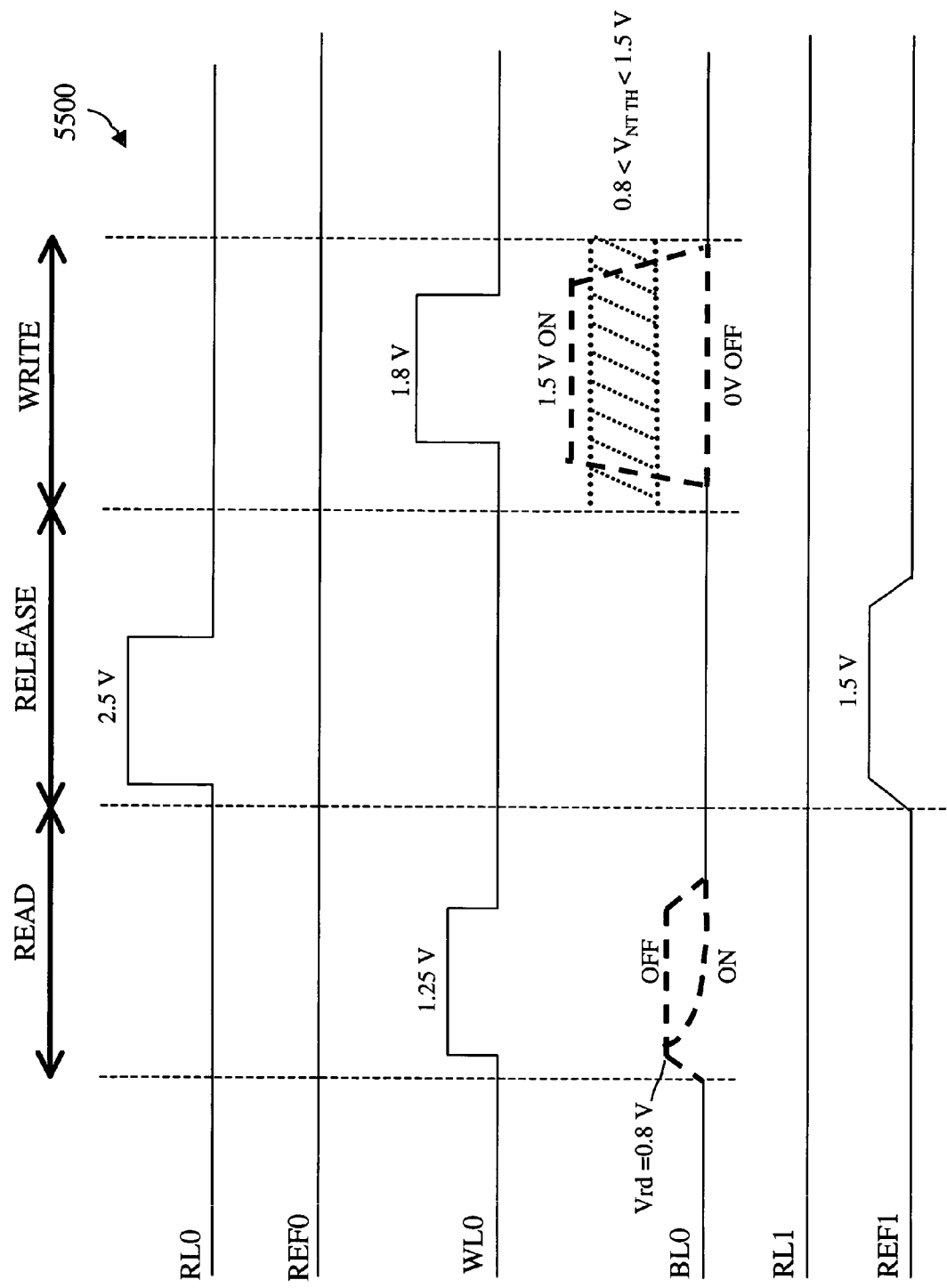
FIG. 42 is an illustration of a Read/Release/Write timing diagram for the NRAM memory system of FIG. 41.
Figure 32B:
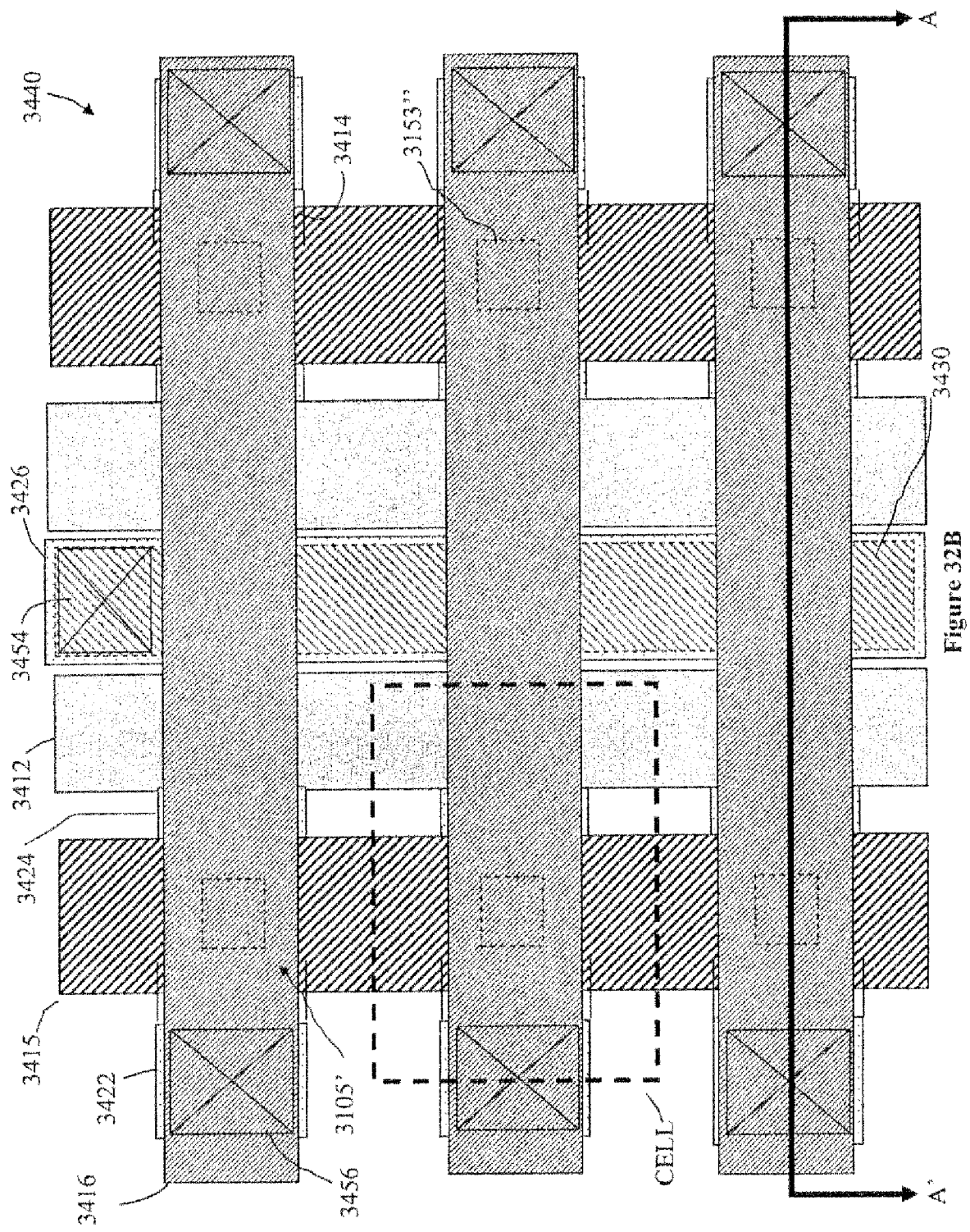

FIG. 42 illustrates timing diagram 5500 for NRAM memory subsystem operation. In operation, memory system 5000 has the same read and write operation as memory system 3250'. A nanotube release operation is inserted before write to enable an ON nanotube to be restored to the OFF condition as illustrated in FIG. 42. An OFF nanotube remains unchanged in the OFF state. The voltage of eight of the N release lines RL0 to RL N−1 is raised to 2.5 V, while REF 0 is kept at zero volts to ensure release of the eight selected nanotubes (ON to OFF transition) The eight selected release lines correspond to the eight bit lines selected for the subsequent bit line write operation. REF1 is raised to 1.5 volts to prevent nanotubes corresponding to unselected word lines from being released by the selected release lines. The inventors contemplate that the specific voltages represented in the preceding example can be altered depending upon the specific application and device requirements. The reference line voltage pulse appear across the nanotube capacitance between NT and switching node, and the source diffusion to ground (array transistors are all unselected during the release operation). The portion of the 1.5 volts appearing between the NT and switch electrode of the unselected nanotubes is 0.5 volts, for example, and cannot inadvertently write an unselected nanotube in the OFF condition (force an unwanted OFF to ON transition during release).

While the NRAM example has been described in terms of the NT-on-Source array structure, substituting embodiment 3 nanotube structure 3900 for embodiment 2 nanotube structure 3105GG in the NT-on-Drain array, with the addition of array release lines, and modified peripheral circuits will also result in NRAM memory system operation similar to that described for memory system 5000, and timing diagram 5500. Likewise, substitution of embodiment 3 nanotube structure 3900 (NT Transistor 4000) for embodiment 2 nanotube structure 3105GG in the NT Transistor (NT-on-Gate) configuration will also result in NRAM memory subsystem operation.

It will be further appreciated that the scope of the present invention is not limited to the above-described embodiments but rather is defined by the appended claims, and that these claims will encompass modifications and improvements to what has been described.

What is claimed is:

1. A one-time-programmable, non-volatile field effect device, comprising:

a source, drain and gate with a field-modulatable channel between the source and drain, each of the source, drain, and gate having a corresponding terminal;

an electromechanically-deflectable, nanotube switching element electrically coupled to one of the source, drain and gate and having an electromechanically-deflectable nanotube element that is positioned to be deflectable in response to electrical stimulation to form an electrically conductive path between the one of the source, drain and gate and its corresponding terminal and thus to form a non-volatile closed electrical state between the one of the source, drain and gate and its corresponding terminal.

* * * * *

UNITED STATES PATENT AND TRADEMARK OFFICE
CERTIFICATE OF CORRECTION

| | |
|---|---|
| PATENT NO. | : 7,161,218 B2 |
| APPLICATION NO. | : 10/864572 |
| DATED | : January 9, 2007 |
| INVENTOR(S) | : Claude L. Bertin et al. |

It is certified that error appears in the above-identified patent and that said Letters Patent is hereby corrected as shown below:

Replace Figure 32B with the attached clean copy.

Signed and Sealed this

Twenty-second Day of September, 2009

David J. Kappos
*Director of the United States Patent and Trademark Office*